(12) United States Patent
West et al.

(10) Patent No.: US 9,893,039 B2
(45) Date of Patent: *Feb. 13, 2018

(54) PACKAGING A SUBSTRATE WITH AN LED INTO AN INTERCONNECT STRUCTURE ONLY THROUGH TOP SIDE LANDING PADS ON THE SUBSTRATE

(71) Applicant: Bridgelux, Inc., Fremont, CA (US)

(72) Inventors: R. Scott West, Pleasanton, CA (US); Tao Tong, Fremont, CA (US); Mike Kwon, Pleasanton, CA (US); Michael Solomensky, Fremont, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/493,133

(22) Filed: Apr. 21, 2017

(65) Prior Publication Data

US 2017/0221865 A1      Aug. 3, 2017

Related U.S. Application Data

(63) Continuation of application No. 15/067,145, filed on Mar. 10, 2016, now Pat. No. 9,653,437, which is a
(Continued)

(51) Int. Cl.
*H01L 21/00*      (2006.01)
*H01L 25/075*      (2006.01)
(Continued)

(52) U.S. Cl.
CPC ........ *H01L 25/0753* (2013.01); *H01L 33/486* (2013.01); *H01L 33/505* (2013.01);
(Continued)

(58) Field of Classification Search
CPC ..................................................... H01L 27/15
(Continued)

(56) References Cited

U.S. PATENT DOCUMENTS

| 6,576,488 B2 | 6/2003 | Collins et al. ................... 438/29 |
| 7,344,296 B2 | 3/2008 | Matsui et al. ................ 362/652 |

(Continued)

FOREIGN PATENT DOCUMENTS

| JP | 2004-5562 | 2/2004 |
| JP | 2005-117041 | 4/2005 |

(Continued)

OTHER PUBLICATIONS

Screenshot and images downloaded from website: http://www.neopac-opto.com/index.php/NUP/neopac-universal-platform.html?yosc=1 on Jan. 8, 2011 disclosing a multi-chip LED module from NeoPac Optoelectronics Inc. (2 pages).

(Continued)

*Primary Examiner* — Anthony Ho
(74) *Attorney, Agent, or Firm* — Imperium Patent Works; Darien K. Wallace

(57) ABSTRACT

Standardized photon building blocks are packaged in molded interconnect structures to form a variety of LED array products. No electrical conductors pass between the top and bottom surfaces of the substrate upon which LED dies are mounted. Microdots of highly reflective material are jetted onto the top surface. Landing pads on the top surface of the substrate are attached to contact pads disposed on the underside of a lip of the interconnect structure. In a solder reflow process, the photon building blocks self-align within the interconnect structure. Conductors in the interconnect structure are electrically coupled to the LED dies in the photon building blocks through the contact pads and landing pads. Compression molding is used to form lenses over the LED dies and leaves a flash layer of silicone covering the landing pads. The flash layer laterally above the landing pads is removed by blasting particles at the flash layer.

19 Claims, 34 Drawing Sheets

Related U.S. Application Data continuation of application No. 14/813,277, filed on Jul. 30, 2015, now Pat. No. 9,312,465, which is a continuation of application No. 14/156,617, filed on Jan. 16, 2014, now Pat. No. 9,130,139, which is a continuation of application No. 13/441,903, filed on Apr. 8, 2012, now Pat. No. 8,652,860, which is a continuation-in-part of application No. 12/987,148, filed on Jan. 9, 2011, now Pat. No. 8,354,684, and a continuation-in-part of application No. 13/284,835, filed on Oct. 28, 2011, now Pat. No. 9,461,023, and a continuation-in-part of application No. 13/304,769, filed on Nov. 28, 2011, now Pat. No. 8,536,605.

(60) Provisional application No. 61/594,371, filed on Feb. 2, 2012.

(51) Int. Cl.
  *H01L 33/62* (2010.01)
  *H01L 33/64* (2010.01)
  *H01L 33/58* (2010.01)
  *H01L 33/48* (2010.01)
  *H01L 33/50* (2010.01)
  *H01L 33/60* (2010.01)

(52) U.S. Cl.
  CPC ............ *H01L 33/58* (2013.01); *H01L 33/60* (2013.01); *H01L 33/62* (2013.01); *H01L 33/64* (2013.01); *H01L 2933/0041* (2013.01); *H01L 2933/0058* (2013.01); *H01L 2933/0066* (2013.01); *H01L 2933/0075* (2013.01)

(58) Field of Classification Search
  USPC ........................................................ 438/28
  See application file for complete search history.

(56) References Cited

U.S. PATENT DOCUMENTS

| | | | |
|---|---|---|---|
| 7,344,902 B2 | 3/2008 | Basin et al. ............... 438/27 |
| 7,352,011 B2 | 4/2008 | Smits et al. ............... 257/99 |
| 7,405,093 B2 | 7/2008 | Andrews .................. 438/26 |
| 7,452,737 B2 | 11/2008 | Basin et al. ............... 438/27 |
| 7,511,298 B2 | 3/2009 | Kawaraya et al. ......... 257/43 |
| 7,514,643 B1 | 4/2009 | Tittle .......................... 200/314 |
| 7,655,957 B2 | 2/2010 | Loh et al. ................... 257/99 |
| 7,834,375 B2 | 11/2010 | Andrews .................. 257/100 |
| 7,858,408 B2 | 12/2010 | Mueller et al. ............ 438/27 |
| 8,109,652 B2 | 2/2012 | Chen ....................... 362/249.02 |
| 9,130,139 B2 | 9/2015 | West ......................... 438/22 |
| 9,653,437 B2 * | 5/2017 | West ................... H01L 25/0753 |
| 2005/0019203 A1 | 1/2005 | Saitoh et al. ............. 420/506 |
| 2005/0077616 A1 | 4/2005 | Ng et al. ................... 257/707 |
| 2005/0207165 A1 | 9/2005 | Shimizu et al. ........... 362/362 |
| 2006/0091410 A1 | 5/2006 | Chen-Lun .................. 257/95 |
| 2006/0138441 A1 | 6/2006 | Kromotis et al. ......... 257/99 |
| 2006/0138621 A1 | 6/2006 | Bogner et al. ............. 257/678 |
| 2006/0284190 A1 | 12/2006 | Zimmerman et al. ..... 257/79 |
| 2007/0020789 A1 | 1/2007 | Lee et al. .................. 438/22 |
| 2007/0057364 A1 | 3/2007 | Wang et al. ............... 257/701 |
| 2007/0087130 A1 | 4/2007 | Arai ........................... 427/457 |
| 2007/0272930 A1 | 11/2007 | Tseng et al. ............... 257/79 |
| 2008/0048200 A1 | 2/2008 | Mueller et al. ............ 257/98 |
| 2008/0048204 A1 | 2/2008 | Ishikura et al. ........... 257/99 |
| 2008/0157114 A1 | 7/2008 | Basin et al. ............... 257/98 |
| 2009/0001406 A1 | 1/2009 | Okimura .................. 257/99 |
| 2009/0050907 A1 | 2/2009 | Yuan et al. ................ 257/88 |
| 2009/0050908 A1 | 2/2009 | Yuan et al. ................ 257/88 |
| 2009/0170225 A1 | 7/2009 | Oka et al. .................. 438/22 |
| 2009/0212316 A1 | 8/2009 | Braune et al. ............. 257/99 |
| 2009/0227050 A1 | 9/2009 | Shin et al. ................ 438/27 |
| 2010/0078661 A1 | 4/2010 | Shi et al. ................... 257/98 |
| 2010/0238511 A1 | 9/2010 | Neese ....................... 358/3.23 |
| 2010/0244080 A1 | 9/2010 | Kim ........................... 257/98 |
| 2010/0252851 A1 | 10/2010 | Emerson et al. ........... 257/98 |
| 2011/0012143 A1 | 1/2011 | Yuan et al. ................ 257/91 |
| 2011/0027458 A1 | 2/2011 | Boock et al. .............. 427/9 |
| 2011/0043106 A1 | 2/2011 | Higashikawa et al. .... 313/582 |
| 2011/0057205 A1 | 3/2011 | Mueller et al. ............ 257/84 |
| 2011/0149577 A1 | 6/2011 | Shida et al. ............... 362/294 |
| 2011/0198655 A1 | 8/2011 | De Graaf et al. ........... 257/98 |
| 2012/0187430 A1 | 7/2012 | West et al. ................ 257/88 |
| 2012/0193647 A1 | 8/2012 | Andrews .................. 257/88 |
| 2013/0027931 A1 | 1/2013 | Isogai et al. .............. 362/235 |

FOREIGN PATENT DOCUMENTS

| | | |
|---|---|---|
| JP | 2009-502024 | 6/2005 |
| JP | 2006-190764 | 7/2006 |
| JP | 2008-034622 | 2/2008 |
| JP | 2010-147000 | 7/2010 |
| JP | 2011-108748 | 6/2011 |
| JP | 2011-187451 | 9/2011 |
| KR | 10-2011-0000001 | 6/2009 |
| TW | 200908388 A | 5/2007 |
| WO | WO2004/033756 | 4/2004 |
| WO | WO2007/002644 | 6/2005 |
| WO | WO2010/102910 | 9/2010 |

OTHER PUBLICATIONS

Data sheet for Cree XLamp MP-L EasyWhite LEDs, data sheet CLD-DS26 Rev 3 2010 by Cree, Inc., 4600 Silicon Drive, Durham, NC 27703 (13 pages).
U.S. Appl. No. 12/941,799 entitled "LED-Based Light Source Utilizing Asymmetric Conductors" filed Nov. 8, 2010. (27 pages).
Asymtek Axiom X-1000 Series Dispensing System Operations Manual., p. 3-36 Figure 3-22 Dual Action Dispensing Head (2009) (1 page).

* cited by examiner

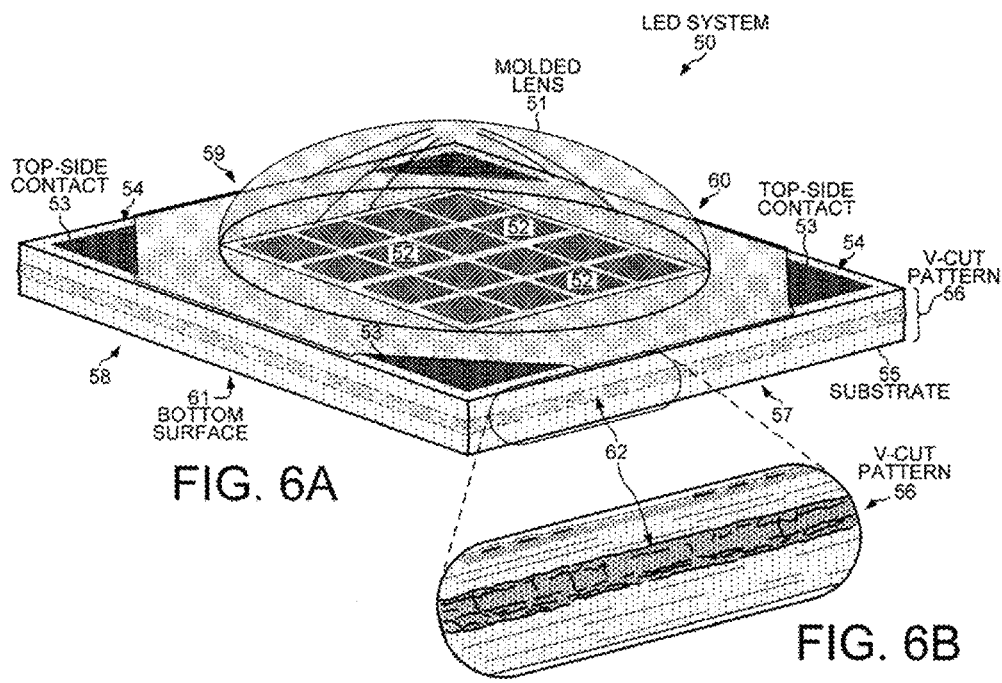
FIG. 6A
FIG. 6B
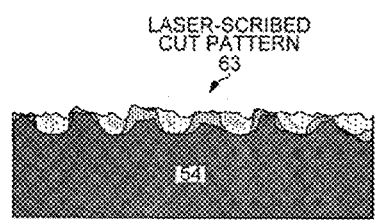
FIG. 7A
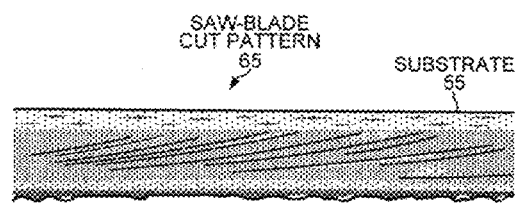
FIG. 8A
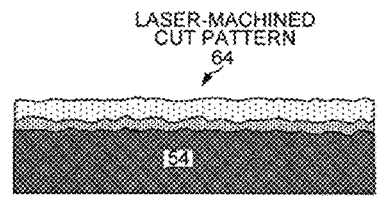
FIG. 7B

TOP-DOWN VIEW OF WHITE
LED ASSEMBLY

SIMPLIFIED CROSS-SECTIONAL SIDE VIEW
OF THE WHITE LED ASSEMBLY

PANEL OF METAL CORE
PRINTED CIRCUIT BOARDS

TOP-DOWN VIEW OF DIE
PLACEMENT AREA BEFORE HR
DEPOSITION

SCREEN PRINTING MASK

TOP-DOWN VIEW OF DIE
PLACEMENT AREA AFTER HR
DEPOSITION

TOP-DOWN VIEW OF DIE
PLACEMENT AREA AFTER
DIE ATTACH

TOP-DOWN VIEW OF DIE PLACEMENT
AREA AFTER WIRE BONDING

TOP-DOWN VIEW OF DIE
PLACEMENT AREA AFTER
FORMATION OF RETAINING RING

TOP-DOWN VIEW AFTER
PLACEMENT OF PHOSPHOR

TOP-DOWN VIEW OF A WHITE
LED ASSEMBLY

SIMPLIFIED CROSS-SECTIONAL SIDE VIEW
OF THE WHITE LED ASSEMBLY

PANEL OF METAL CORE
PRINTED CIRCUIT BOARDS

TOP-DOWN VIEW OF DIE
PLACEMENT AREA BEFORE DIE
PLACEMENT

TOP-DOWN VIEW OF DIE
PLACEMENT AREA AFTER DIE
PLACEMENT

TOP-DOWN VIEW OF DIE
PLACEMENT AREA AFTER
WIRE BONDING

TOP-DOWN VIEW OF DIE
PLACEMENT AREA AFTER
FORMATION OF THE RETAINING RING

JETTING MICRODOTS OF HR MATERIAL

TOP-DOWN VIEW OF DIE
PLACEMENT AREA AFTER
JETTING OF HR MATERIAL

TOP-DOWN VIEW OF DIE
PLACEMENT AREA AFTER
PLACEMENT OF PHOSPHOR

WHITE LED ASSEMBLY HAVING LED
DICE DISPOSED IN A WELL

PACKAGING A SUBSTRATE WITH AN LED INTO AN INTERCONNECT STRUCTURE ONLY THROUGH TOP SIDE LANDING PADS ON THE SUBSTRATE

CROSS REFERENCE TO RELATED APPLICATION

This application is a continuation of, and claims priority under 35 U.S.C. § 120 from, nonprovisional U.S. patent application Ser. No. 15/067,145 entitled "Packaging a Substrate with an LED into an Interconnect Structure Only Through Top Side Landing Pads on the Substrate," filed on Mar. 10, 2016, now U.S. Pat. No. 9,653,437. Application Ser. No. 15/067,145, in turn, is a continuation of, and claims priority under 35 U.S.C. § 120 from, nonprovisional U.S. patent application Ser. No. 14/813,277 entitled "Packaging Photon Building Blocks Having Only Top Side Connections In A Molded Interconnect Structure," filed on Jul. 30, 2015, now U.S. Pat. No. 9,312,465. Application Ser. No. 14/813,277, in turn, is a continuation of, and claims priority under 35 U.S.C. § 120 from, nonprovisional U.S. patent application Ser. No. 14/156,617 entitled "Packaging Photon Building Blocks Having Only Top Side Connections In A Molded Interconnect Structure," filed on Jan. 16, 2014, now U.S. Pat. No. 9,130,139. Application Ser. No. 14/156,617, in turn, is a continuation of, and claims priority under 35 U.S.C. § 120 from, nonprovisional U.S. patent application Ser. No. 13/441,903 entitled "Packaging Photon Building Blocks Having Only Top Side Connections In A Molded Interconnect Structure," filed on Apr. 8, 2012, now U.S. Pat. No. 8,652,860, which in turn is a continuation-in-part of, and claims priority under 35 U.S.C. § 120 from, the following three nonprovisional U.S. patent applications: patent application Ser. No. 12/987,148 entitled "Packaging Photon Building Blocks Having Only Top Side Connections in an Interconnect Structure," filed on Jan. 9, 2011, now U.S. Pat. No. 8,354,684; patent application Ser. No. 13/284,835 entitled "Jetting a Highly Reflective Layer onto an LED Assembly," filed on Oct. 28, 2011, now U.S. Pat. No. 9,461,023; and patent application Ser. No. 13/304,769 entitled "Micro-Bead Blasting Process for Removing a Silicone Flash Layer," filed on Nov. 28, 2011, now U.S. Pat. No. 8,536,605. In addition, application Ser. No. 13/441,903 claims priority under 35 U.S.C. § 119 from U.S. provisional patent application Ser. No. 61/594,371 entitled "Packaging Photon Building Blocks Having Only Top Side Connections in a Molded Interconnect Structure," filed on Feb. 2, 2012. The subject matter of each of the aforementioned patent documents is incorporated herein by reference.

TECHNICAL FIELD

The present invention relates generally to packaging light-emitting diodes and, more specifically, to a photon building block that can be packaged alone as an emitter or together with other photon building blocks as an array of emitters.

BACKGROUND INFORMATION

A light emitting diode (LED) is a solid state device that converts electrical energy to light. Light is emitted from active layers of semiconductor material sandwiched between oppositely doped layers when a voltage is applied across the doped layers. In order to use an LED chip, the chip is typically enclosed in a package that focuses the light and that protects the chip from being damaged. The LED package typically includes contact pads on the bottom for electrically connecting the LED package to an external circuit. Conventionally, an LED chip is designed to be packaged either as a discrete light emitter or with a group of LED chips in an array. The LED chip of the discrete light emitter is typically mounted on a carrier substrate, which in turn is mounted on a printed circuit board. The LED chips of the array, however, are typically mounted directed on the printed circuit board without using the carrier substrate.

Array products are not conventionally made using the discrete light emitters as building blocks. The carrier substrate of the discrete light emitter is typically considered needlessly to occupy space on the printed circuit board under an array. Moreover, conducting through-hole vias through the carrier substrate of the discrete light emitter would have to be reconfigured in order to connect properly to contact pads on the printed circuit board for each new array design. Thus, no carrier with a particular set of through-holes vias could be used as a standard building block. The problem of the through-hole vias in the discrete emitters can be solved by electrically connecting the LED chips to traces and contact pads on the top side of the carrier substrate. But eliminating the through-hole vias by connecting the LED chips to pads on the top side of the carrier substrate creates the new problem of how to connect the pads to a power source because the carrier substrate is no longer electrically coupled to the printed circuit board below.

FIG. 1 (prior art) shows an existing array product 10 with an array of twenty-four LED chips electrically connected to pads 11 on the top side of a carrier substrate 12. Array product 10 is the XLamp® MP-L EasyWhite product manufactured by Cree, Inc. of Durham, N.C. In FIG. 1, carrier substrate 12 is mounted on a metal disk 13 as opposed to on a printed circuit board. Carrier substrate 12 is attached to metal disk 13 using thermal glue 14. Array product 10 is inelegantly connected to power by hand soldering individual wires of the positive 15 and negative 16 power cord leads to the pads 11. Array product 10 has no features that facilitate connecting the pads 11 on the top side of carrier substrate 12 to a power source in the board or plate below. And array product 10 is not configured to be incorporated into a group of array products.

When LEDs are packaged in arrays as opposed to as discrete light emitters, the LED chips of the arrays are mounted directly on a printed circuit board without the carrier substrate conventionally used with discrete light emitters. The LED chips packaged as arrays are electrically connected to contact pads and to traces in a top trace layer of the printed circuit board. The LED chips are wire bonded to the traces on the top side of the printed circuit board. The printed circuit board is then segmented to form discrete array light sources. Larger exposed areas of the traces on the top side form contact pads to which supply power is connected to each discrete array light source.

The LEDs are typically covered with a layer of phosphor before the array light sources on the printed circuit board are segmented or singulated. The phosphor converts a portion of the blue light generated by the LEDs to light in the yellow region of the optical spectrum. The combination of the blue and yellow light is perceived as "white" light by a human observer. Before the array light sources are segmented, the LEDs are typically covered by a layer of silicone that is formed into a lens above each light source. The layer of silicone also protects the LED chips and top-side wire bonds.

A slurry containing the phosphor has been conventionally dispensed manually into a ring or dam around the LED chips of each array light source. Then injection molding or casting molding has been used to form a lens above each array light source. The manufacturing process for LED light sources has been improved by combining the steps of dispensing the phosphor and forming the lens. By adding the phosphor to the silicone, the separate step of dispensing phosphor can be eliminated, and lenses are formed with phosphor dispersed throughout each lens. The lenses are formed using injection molding in which lens cavities that contain the LED dies are filled with the lens material, and the excess lens material is squeezed out of a leakage path.

When casting molding is used, a phosphor silicone slurry is first dispensed into the bottom half of each cavity, and then the top half of the cavity closes to define the lens structure and squeezes out the excessive lens material. The injection molding and casting molding processes have multiple disadvantages. First, the phosphor and the silicone are expensive, and the lens material that is squeezed out of the cavities is wasted. Second, the quality of the lenses formed with injection molding and casting molding is low because bubbles and nonuniformities remain in the finished product.

Fabricating an LED lens using these techniques is expensive because there are significant material losses and because non-standard semiconductor packaging technologies and equipment are used to package the lens. Therefore, systems and methods that reduce manufacturing costs by reducing waste and by making it easier to package LED dies/arrays using standard semiconductor packaging technologies and equipment are sought. In addition, systems and methods that enable LED package sizes to be shrunk to smaller sizes and to be handled using semiconductor packaging technologies and equipment are also sought.

SUMMARY

Systems and methods for manufacturing and processing LED devices using standard semiconductor packaging technologies and equipment are disclosed. The systems and methods enable LED package sizes to be shrunk to sizes that are smaller than can be made using conventional LED packaging technologies. In addition, a more efficient and less costly interface interconnect between an LED die/array and the packaging is disclosed.

A method of fabricating an LED system involves forming a lens over LED dies on a substrate with top-side contacts and then exposing the top-side contacts. The top-side contacts are disposed only on the top surface of the substrate. The substrate is provided with an array of LED dies disposed on the top surface of the substrate such that electrical connections to the array of LED dies are made only through the top-side contacts. The lens is formed over at least one of the LED dies using compression molding to shape a material that is disposed over substantially all of the top surface of the substrate. The top-side contacts that are covered by the material are then exposed by selectively removing the material from areas above the top-side contacts.

Another method of fabricating an LED system involves forming a lens over LED dies on a substrate, removing material from top-side contacts, and then cutting the substrate from a closed board. Electrical connections to the LED dies are made only through the top-side contacts. A molded lens is formed over LED dies that are disposed on the top surface of the substrate. The molded lens is formed using molding to shape a material that is disposed over substantially all of the top surface of the substrate. The material is then removed from areas above the top-side contacts, which are disposed only on the top surface of the substrate. The substrate is then cut from the closed board. The cutting leaves a pattern around all four sides of the singulated substrate. Thus, the entire perimeter of the substrate has a cut pattern, such as a v-cut pattern, a saw-blade cut pattern, a laser cut pattern, a punch-cut pattern, or a water-jet-cut pattern.

In embodiments where compression molding is used to form lenses of silicone over LED arrays on a metal core printed circuit board (MCPCB), a flash layer of silicone is left behind covering the contact pads that are later required to connect the arrays to power. A method for removing the silicone flash layer involves blasting abrasive particles in a stream of air at the silicone flash layer. The particles can be made of sodium bicarbonate, sodium sulfate, ammonium bicarbonate, silicon dioxide, aluminum oxide, or plastic or glass beads. The abrasive particles have a median diameter that is between forty and sixty microns. A nozzle is positioned within thirty millimeters of the top surface of the flash layer. The flow of air is generated by compressing the air to a pressure of more than one hundred pounds per square inch and allowing the compressed air to escape from a nozzle that has a diameter of less than two millimeters. The stream of air that exits from the nozzle is directed towards the top surface at an angle between five and thirty degrees away from normal to the top surface. The abrasive particles are added to the stream of air such that the particles are carried by the stream of air. The particles then collide into the top surface of the flash layer of silicone until the flash layer laterally above the contact pads is removed.

In some embodiments, an LED array light source includes LED dies mounted on a MCPCB and a lens above the LED dies formed from a layer of silicone. The MCPCB has a trace layer and a solder mask layer. The LED dies are electrically coupled to the trace layer. The solder mask layer is disposed over the trace layer. A contact pad is formed on the trace layer by an opening in the solder mask. The layer of silicone that is disposed over the LED dies forms an edge around the contact pad. The layer of silicone is not present laterally above the contact pad. The layer of silicone contains a trace amount of a blasting medium at the edge of the layer of silicone. The blasting medium is sodium bicarbonate, sodium sulfate, or ammonium bicarbonate. The layer of silicone can also contain phosphor. The trace amount of the blasting medium is embedded into the edge of the silicone around the contact pad when a flash layer of silicone is removed from above the contact pad by blasting abrasive particles of the blasting medium in a stream of air at the silicone flash layer.

In another embodiment, an LED array light source includes a printed circuit board (PCB), an LED die, a contact pad, and a layer of silicone. The PCB has a top side, a bottom side, and four top edges. The LED die and the contact pad are disposed on the top side of the PCB. The layer of silicone is disposed over the LED die and extends to each top edge of the PCB. However, the layer of silicone is not disposed laterally above a portion of the contact pad because the silicone has been removed by blasting abrasive particles in a stream of air at the layer of silicone.

In yet another embodiment, a high-pressure stream of water is used to remove the flash layer of silicone over the contact pads. The water is pressurized to a pressure of over fifty pounds per square inch and then forced through a nozzle with a diameter of less than one millimeter. The pressurized stream of water is aimed directly at the silicone flash layer over the contact pads until the flash layer is removed. Alternatively to using pure water, abrasive particles made of silica, aluminum oxide, or garnet can be added to the stream of water to allow the deflashing process to be performed at a lower water pressure compared to using pure water.

In some embodiments, standardized photon building blocks are used to make both discrete light emitters with one building block as well as array products with multiple building blocks. Each photon building block has one or more LED chips mounted on a carrier substrate. No electrical conductors pass between the top and bottom surfaces of the substrate. The photon building blocks are held in place by an interconnect structure that is attached to a heat sink. Examples of the interconnect structure include a molded interconnect device (MID), a lead frame device or a printed circuit board.

Landing pads on the top surface of the substrate of each photon building block are attached to contact pads disposed on the underside of a lip of the interconnect structure using solder or an adhesive. The lip extends over the substrate within the lateral boundary of the substrate. In a solder or SAC reflow process, the photon building blocks self-align within the interconnect structure. Molten SAC or solder alloy of the landing pads wets the metal plated contact pads, and the surface tension of the molten alloy pulls the landing pads under the contact pads. Conductors on the interconnect structure are electrically coupled to the LED dice in the photon building blocks through the contact pads and landing pads. The bottom surface of the interconnect structure is coplanar with the bottom surfaces of the substrates of the photon building blocks.

In some embodiments for array products, the substrates of multiple photon building blocks are supported by the interconnect structure. The substrates of all of the photon building blocks have substantially identical dimensions. A thermal interface material is placed on the upper surface of a heat sink, and the bottom surface of the interconnect structure contacts the thermal interface material. The interconnect structure is fastened to the heat sink by bolts that pass through holes in the interconnect structure.

A method of making both a discrete light emitter and an array product, which uses the same standardized photon building blocks supported by an interconnect structure, includes the step of mounting an LED die on a carrier substrate that has no electrical conductors passing from its top surface to its bottom surface. A landing pad on the top surface of the substrate is placed under and adjacent to a contact pad disposed on the underside of a lip of the interconnect structure. In order to place the landing pad under the contact pad, the lip of the interconnect structure is placed over the top surface of the substrate and within the lateral boundary of the substrate.

A conductor disposed on or in an interconnect structure is electrically connecting to an LED die on a photon building block by bonding a landing pad to a contact pad. A landing pad can be bonded to a contact pad by heating the metal alloy of the landing pad such that the landing pad aligns with the metal contact pad. Alternatively, the landing pad can be bonded to the contact pad using anisotropic conductive adhesive film (ACF) technology. After the landing pad is aligned with and bonded to the contact pad, the bottom surface of the substrate is substantially coplanar with the bottom surface of the interconnect structure.

When this method is used to make an array product with multiple photon building blocks, a second lip of the interconnect structure is placed over the top surface of the substrate of a second photon building block, and a second landing pad on the second substrate is placed under and adjacent to a second contact pad under a lip of the interconnect structure. The second substrate of the second photon building block has dimensions that are substantially identical to those of the substrate of the first photon building block. A second conductor of the interconnect structure is electrically connected to a second LED die on the second photon building block by bonding the second landing pad to the second contact pad. After the second landing pad is bonded to the second contact pad, the bottom surface of the substrate of the second photon building block is substantially coplanar to the bottom surface of the interconnect structure.

A thermal interface material is then placed over the upper surface of a heat sink. The bottom surfaces of the interconnect structure and of the substrates of the photon building blocks are placed over the thermal interface material.

In some embodiments, a novel light emitting device includes an LED die disposed above a substrate that includes no electrical conductors between the top and bottom surfaces of the substrate. The device also includes a means for electrically coupling the LED die to a conductor located outside the lateral boundary of the substrate. The means contacts a landing pad disposed on the top surface of the substrate. The landing pad aligns the substrate to a contact pad on the means when the landing pad is heated. The means has a bottom surface that is coplanar with the bottom surface of the substrate.

After any die attach and wire bonding steps in the manufacturing of an array-based LED assembly, a layer of Highly Reflective (HR) material is deposited around the LED dice to coat the upper surface of the substrate. In one example, the HR material is deposited with precision by jetting microdots of the HR material in liquid form onto selected portions of the upper surface of the substrate, thereby forming a layer of HR material that is thick enough (at least 10 microns thick) to have a reflectivity of at least 85 percent.

Limits on mechanical tolerances can lead to physical differences between the LED assemblies being manufactured. LED dice may differ slightly in size, and LED dice may be placed in slightly different locations from one LED assembly to the next. In accordance with some embodiments, machine imaging is usable to detect such physical differences from LED assembly to LED assembly and to control the jetting process to adjust for such physical differences so that in each LED assembly being manufactured substantially all of the upper substrate surface that is not covered with an LED die is coated with HR material.

In one example, each microdot of HR material has a diameter of less than 100 microns and is typically 50-80 microns in diameter. The HR material has an adequately low viscosity (less than 1100 cP) such that it flows laterally to some degree once it reaches the substrate surface. Due to the lateral flow of the HR material, the HR material can be made (1) to flow under bridging wire bonds and to coat the substrate underneath the wire bonds, (2) to reach and to wet side edges of the LED dice, or (3) to reach and to wet the inside side edge of a phosphor retaining ring. In one example, the area of substrate between LED dice is not coated with HR material in order to reduce manufacturing time. Because the HR material is only deposited after die attach and after wire bonding, fiducial markers on the upper surface of the substrate (that would otherwise be covered and obscured by HR material were conventional screen printing used to deposit the HR material) are observable and usable during die attach and wire bonding. The depositing of the HR layer by jetting microdots of HR material results in a reduction in the amount of exposed substrate area that is not covered with HR material. Reducing the amount of exposed substrate area that is not covered with HR material serves to improve the light efficiency of the resulting LED assembly.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 6A is a perspective view of an LED system with a molded lens, an array of LED dies and exposed top-side contacts that has been separated from a closed board and has a v-cut pattern around its entire perimeter.

FIG. 6B is a cross sectional bubble view of a portion of the v-cut perimeter of the LED system of FIG. 6A.

FIGS. 7A-B shows laser-cut patterns on sides of substrates formed when a laser is used to separate an LED system from a closed board.

FIG. 8A shows a saw-blade cut pattern on the side of a substrate formed by dicing a closed board using a saw blade.

DETAILED DESCRIPTION

Reference will now be made in detail to some embodiments of the invention, examples of which are illustrated in the accompanying drawings.

Systems and methods for manufacturing and processing LED devices using standard semiconductor packaging technologies and equipment are disclosed. The systems and methods enable LED package sizes to be shrunk to sizes that are smaller than can be made using conventional LED packaging technologies. In addition, a more efficient and less costly interface interconnect between an LED die/array and the packaging is disclosed.

In one embodiment, an LED is fabricated by providing a substrate with an array of LED dies and top-side contacts. One or more lenses are formed over the array of LED dies using compression molding such that one lens is formed over at least one of the LED dies. The top-side contacts are exposed by selectively removing material from areas covering the top-side contacts. Fabricating LED lens in this manner enables low cost mass production of LED dies and arrays that have an interface interconnect that makes it easy to package the LED dies and arrays.

In another embodiment, an LED system is fabricated by providing a substrate with an array of LED dies and top-side contacts. A lens is formed over the array of LED dies using compression molding, and the top-side contacts are exposed by selectively de-flashing material from areas covering the top-side contacts. Fabricating LED lenses in this manner also enables low cost mass production of LED dies and arrays that have an interface interconnect that makes it easy to package the LED dies and arrays.

In another embodiment, an LED system is fabricated by cutting a substrate that has an array of LED dies formed on it from a closed board. A molded lens is formed over the array of LED dies using compression molding, and the plurality of top-side contacts are exposed by selectively removing material from areas above the top-side contacts. When the substrate is cut, a cut pattern is formed around the entire perimeter of the substrate because the substrate is cut from a closed board. The substrate can be cut from the closed board using v-cutting, saw-blade cutting, laser cutting, punch cutting, water-jet cutting or a combination of these techniques. The cut pattern that surrounds the entire perimeter of the substrate has a v-cut pattern, a saw-blade cut pattern, a laser cut pattern, a punch cut pattern, a water-jet-cut pattern or a combination of these cut patterns. Fabricating an LED system in this manner also reduces the cost of mass production of LED dies on substrates that have an interface interconnect that makes it easy to package the substrate and LED dies.

Figure 1:
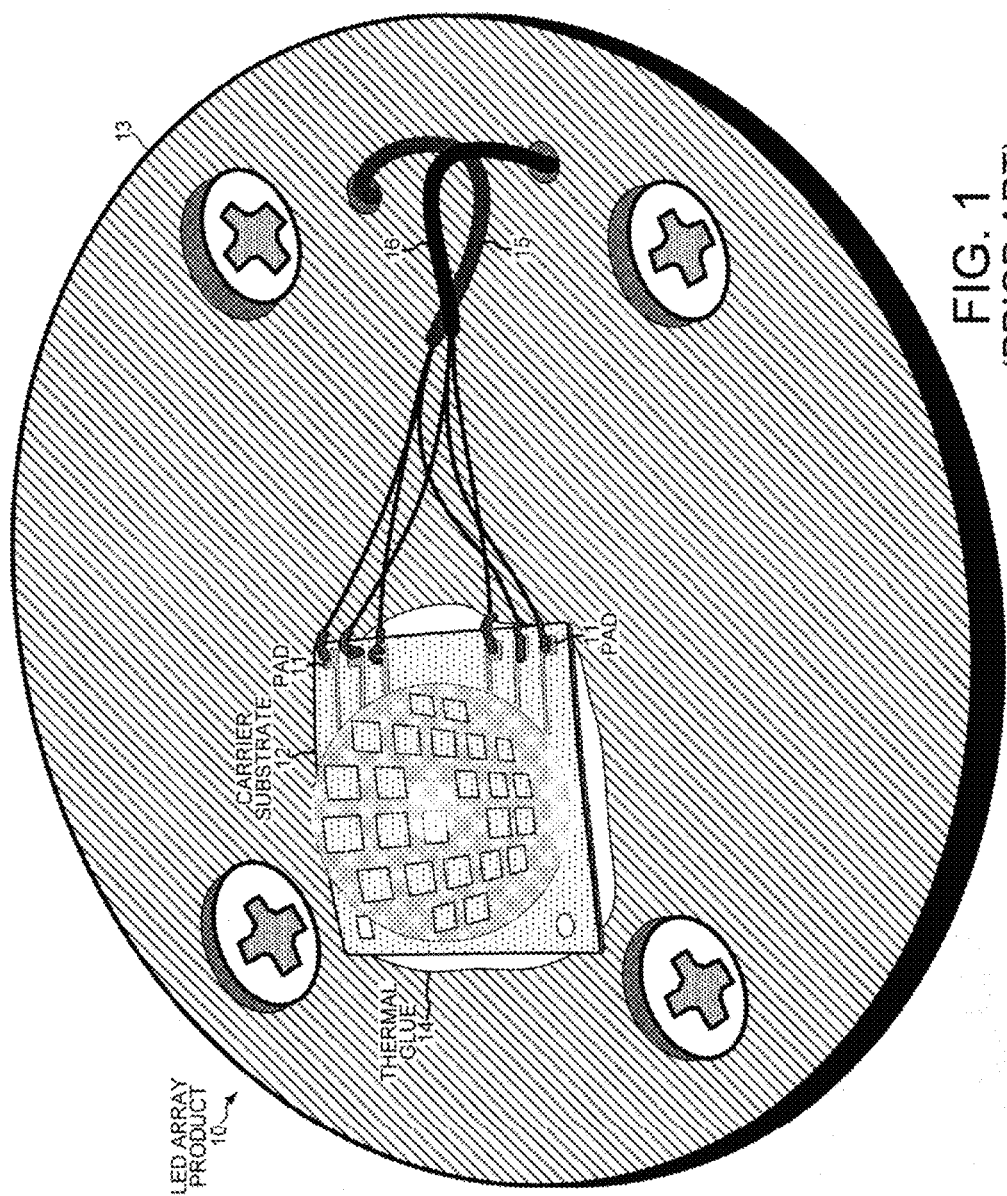
FIG. 1 (prior art) is a perspective view of an existing array product with multiple LED chips electrically connected to pads on the top side of a carrier substrate.
Figure 2:
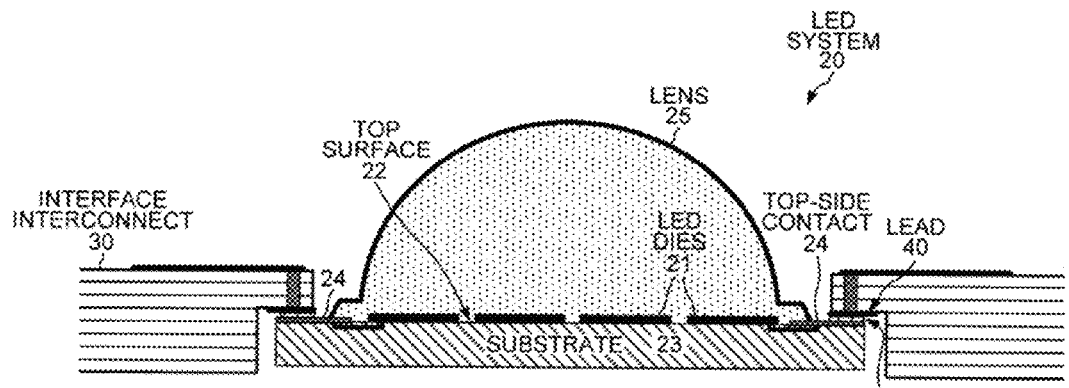
FIG. 2 is a cross sectional view of an LED system with an array of LED dies and top-side contacts disposed on the top surface of a substrate according to one embodiment of the invention.

FIG. 2 is a cross sectional view of an LED system 20 with an array of LED dies 21 disposed on the top surface 22 of a substrate 23. Top-side contacts 24 are also disposed on top surface 22 of substrate 23. A compression molded lens 25 is disposed over the LED dies 21.

Figure 3:
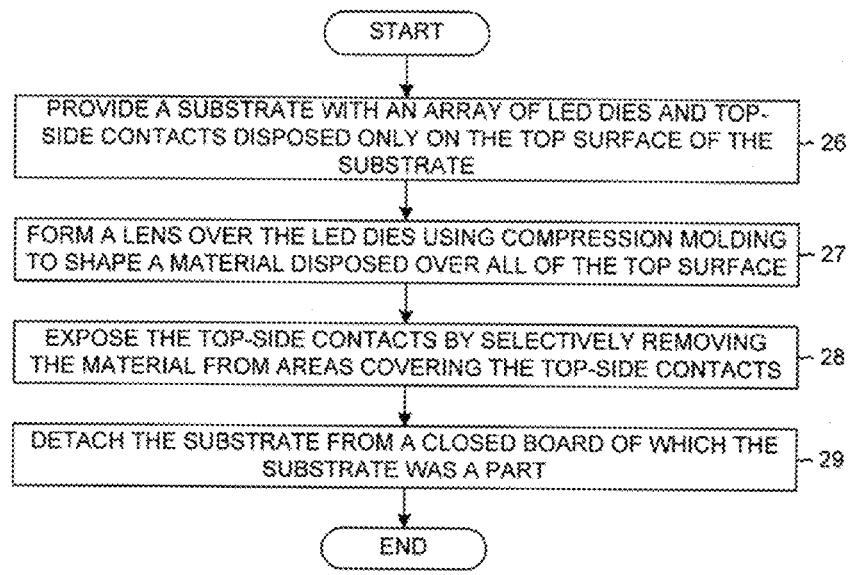
FIG. 3 is a flowchart illustrating a method of fabricating an LED system with a compression-molded lens and exposed top-side contacts.

FIG. 3 is a flowchart illustrating steps 26-29 of a method of fabricating LED system 20 with compression-molded lens 25 and top-side contacts 24. The first step 26 involves providing substrate 23 with the array of LED dies 21 disposed on top surface 22 of substrate 23. Electrical connections to the array of LED dies 21 are made through a plurality of the top-side contacts 24, which are disposed only on top surface 22 of substrate 23. In step 27, lens 25 is formed over at least one of the LED dies 21 by using compression molding to shape a material that has been disposed over substantially all of top surface 22 of substrate 23. In one example, the material is silicone. In the embodiment of FIG. 2, a single lens is formed over the array of LED dies 21. In other embodiments, however, individual microlenses are formed over less than the entire array, such as over individual LED dies. In step 28, the plurality of top-side contacts 24 are exposed by selectively removing the material that forms the lens from areas covering the top-side contacts 24. As shown in FIG. 2, the material need not be removed from the entire area above the contacts 24. In step 29, substrate 23 is detached from the closed board of which it was a part. FIG. 2 shows substrate 23 after being detached from the closed board.

Further details regarding LEDs with compression molded lens and top-side contacts and methods of making them are provided below with reference to FIGS. 10-19. LED arrays with compression molded lens and top-side contacts can also be configured with an interface interconnect that makes it easier and more cost effective to package the LED dies as is further discussed with reference to FIGS. 20-38. FIG. 2 shows an example of the interface interconnect 30.

Figure 4:
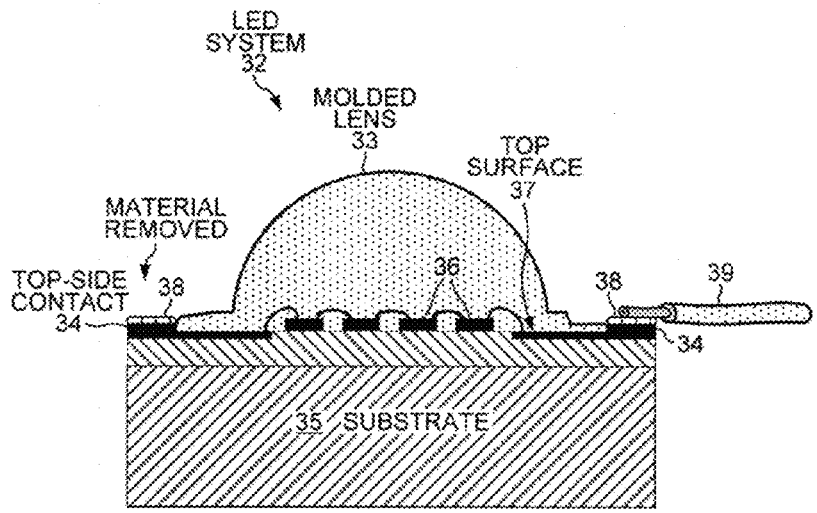
FIG. 4 is a cross sectional view of an LED system with a molded lens and top side contacts exposed using deflashing.

FIG. 4 is a cross sectional view of an LED system 32 with a molded lens 33 and top side contacts 34 exposed using deflashing. A substrate 35 with an array of LED dies 36 is disposed on a top surface 37 of the substrate. Electrical connections to the array of LED dies 36 are made through the top-side contacts 34, which are disposed only on top surface 37 of substrate 35. Molded lens 33 is formed over at least one of the LED dies 36. The material used to make lens 33 is disposed over substantially all of top surface 37 of substrate 35 except for over the top-side contacts 34. The material is selectively removed from the areas above the top-side contacts 34. A plurality of solder connections 38 are formed on the plurality of top-side contacts 34. A plurality of leads 39 are coupled to the plurality of solder connections 38. In FIG. 4, one of the leads 39 is depicted as a wire. In FIG. 2, a lead 40 that is coupled to a solder connection 38 is depicted as a contact pad that is attached to a top-side contact 24 by the solder connection 38.

Figure 5:
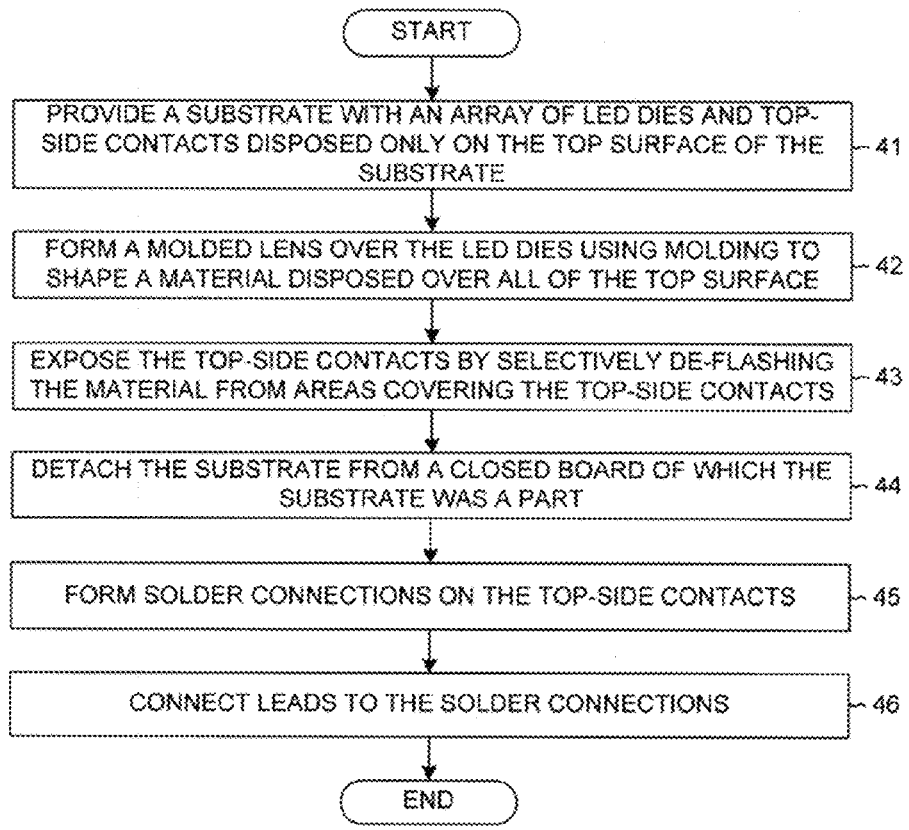
FIG. 5 is a flowchart illustrating a method of fabricating an LED system with a molded lens and top side contacts exposed using deflashing.

FIG. 5 is a flowchart illustrating steps 41-46 of a method of fabricating LED system 32 with molded lens 33 and top side contacts 34 exposed using deflashing. In a step 41, substrate 35 is provided with an array of LED dies 36 disposed on top surface 37 of the substrate. Substrate 35 is part of a closed board. Electrical connections to the LED dies 36 are made through the top-side contacts 34 that are disposed only on top surface 37. In step 42, molded lens 33 is formed over at least one of the LED dies 36 using a type of molding to shape a material that is disposed over substantially all of top surface 37. In step 43, the top-side contacts 34 are exposed by selectively de-flashing the material from areas covering the top-side contacts 34. In step 44, substrate 35 is detached form the closed board. In step 45, the solder connections 38 are formed on the top-side contacts 34. In step 46, the leads 39 are connected to the solder connections 38 such that the LED dies 36 are connected only through the leads 39.

LED arrays with molded lens and top side contacts exposed using deflashing can also be configured with an interface interconnect that makes it easier and more cost effective to package the LED dies and arrays as is further discussed with reference to FIGS. 20-38.

FIG. 6A is a cross sectional view of an LED system 50 that has been separated from a closed board. LED system 50 has a molded lens 51, an array of LED dies 52 and exposed top-side contacts 53. The LED dies 52 are electrically connected only through the top-side contacts 53, which are disposed only on the top surface 54 of a substrate 55. LED system 50 has been separated from a closed board using a v-cutting process such that a v-cut pattern 56 is present around the entire perimeter of substrate 55. Thus, the v-cut pattern 56 is present on each of the four sides 57-60 of substrate 55. Singulation of LED system 50 from the closed board is performed by v-scribing both the top surface 54 and the bottom surface 61 and then snapping off the remaining thin portion 62 of the closed board that remains between the two v-cuts. The thin portion 62 through the middle each side 57-60 is rougher than the cut portions above and below because the thin middle portion has been snapped off.

FIG. 6B is a bubble view of a portion of side 57 of LED system 50 showing the v-cut pattern 56 in more detail. The thin snapped portion 62 runs through the middle of the V-cut pattern 56.

In another embodiment, a laser is used to separate substrate 55 from the closed board. FIG. 7A is a top-down view of top surface 54 showing a laser-scribed cut pattern 63 on side 57 that remains after individual laser holes are burned along the edge that is to be cut. The laser leaves the laser-scribed cut pattern 63 around the entire perimeter of substrate 55. FIG. 7B shows a laser-machined cut pattern 64 that remains on side 57 after a laser beam is run along the edge of the closed board that is to be cut. Laser-machined but pattern 64 is smoother than laser-scribed cut pattern 63. Both laser-scribed cut pattern 63 and laser-machined cut pattern 64 are shown at the same magnification.

In yet another embodiment, a saw blade is used to separate substrate 55 from the closed board. The saw blade leaves a saw-blade cut pattern 65 around the entire perimeter of substrate 55, as shown in FIG. 8A. The curved lines on the saw-blade cut pattern 65 are left by a rotating saw blade.

Figure 8B:
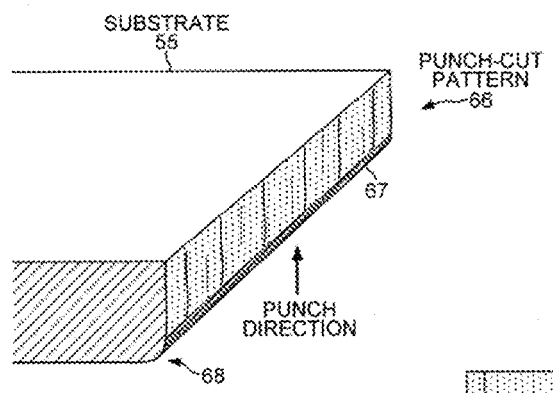
FIG. 8B is a cross-sectional perspective view of a punch-cut pattern formed on a substrate by punching a closed board using a punch apparatus.
Figure 8C:
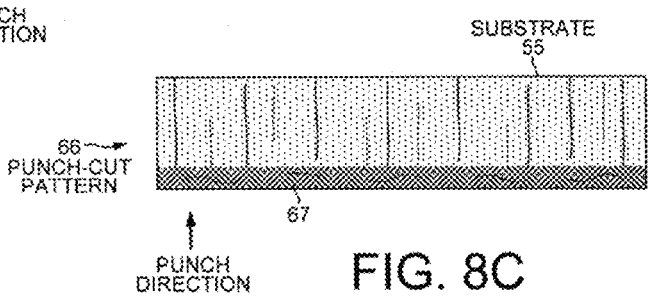
FIG. 8C shows a punch cut pattern on the side of a substrate formed by punching a closed board using a punch apparatus.

In yet another embodiment, a punch apparatus is used to separate substrate 55 from the closed board. Punching leaves a punch cut pattern 66 around the entire perimeter of substrate 55, as shown in FIGS. 8B-C. The punch cut pattern 66 includes substantially vertical lines generated in the direction that the punch apparatus moves to cut the substrate 55. The punch cut pattern 66 can include a secondary pattern 67 that resembles a compression left over by the punching process. The punch cut pattern can also leave a rounded corner 68 on the side that the punch apparatus impacts substrate 55. In the orientation of FIG. 8B, the punch apparatus impacts substrate 55 first from the bottom.

Figure 8D:
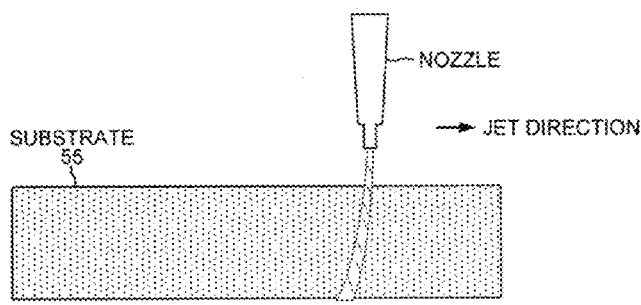
FIG. 8D shows a substrate being cut with a water jet.
Figure 8E:
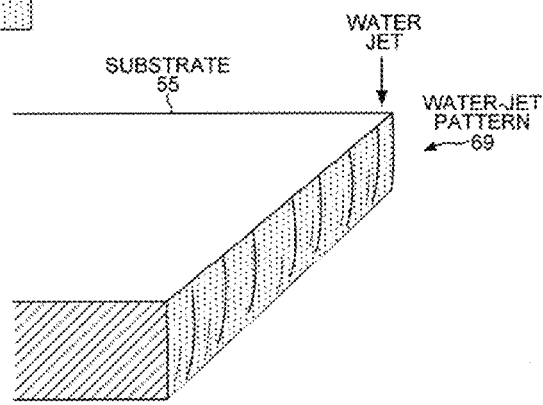
FIG. 8E shows a water jetting cut pattern on the side of a substrate formed by cutting the substrate using a water jet apparatus.

In yet another embodiment, a water jetting apparatus is used to separate substrate 55 from the closed board. As illustrated in FIG. 8D, when water jetting is used to cut substrate 55, garnet particles dispersed in a fluid are ejected from a nozzle and follow a curved pattern through substrate 55. The curved pattern is curved in the direction opposite to the direction of the water jet motion. Cutting substrate 55 with a water jet leaves a water-jet cut pattern 69 around the entire perimeter of substrate 55, as shown in FIG. 8E. The water-jet cut pattern 69 is curved from top to bottom with the top being the surface of substrate 55 that the water jet particles impact first (i.e., the side of the substrate on which the water jet is located).

Figure 9:
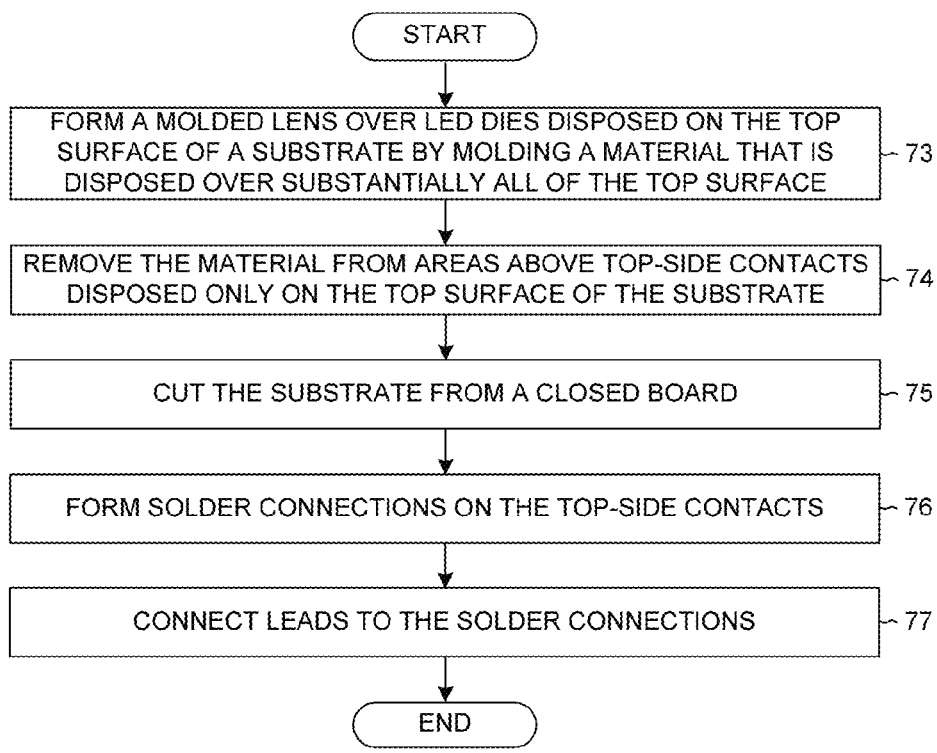
FIG. 9 is a flowchart illustrating a method of fabricating an LED system with a molded lens and exposed top-side contacts by separating the LED system from a closed board.

FIG. 9 is a flowchart illustrating steps 73-77 of a method of fabricating LED system 50 with molded lens 51 and exposed top-side contacts 53 by separating LED system 50 from a closed board. In step 73, molded lens 51 is formed over LED dies 52 that are disposed on top surface 54 of substrate 55. Molded lens 51 is formed using molding to shape a material that is disposed over substantially all of top surface 54 of substrate 55. In step 74, the material is removed from areas above top-side contacts 53. In step 75, substrate 55 is cut from a closed board. The cutting of substrate 55 is performed using a technique such as v-cutting, dicing with a saw blade, laser cutting, punch cutting or water-jet cutting. In step 76, solder connections are formed on top-side contacts 53. In step 77, leads are connected to the solder connections. Electrical connections to the LED dies 52 are made only through the leads and top-side contacts 53.

Further details of LED systems with molded lenses and top side contacts and methods of making them from closed boards are provided below with reference to FIGS. 10-19 and 39-62. The LED systems can also be configured with an interface interconnect that makes it easier and more cost effective to package the arrays of LED dies is discussed below with reference to FIGS. 20-38.

Figure 10:
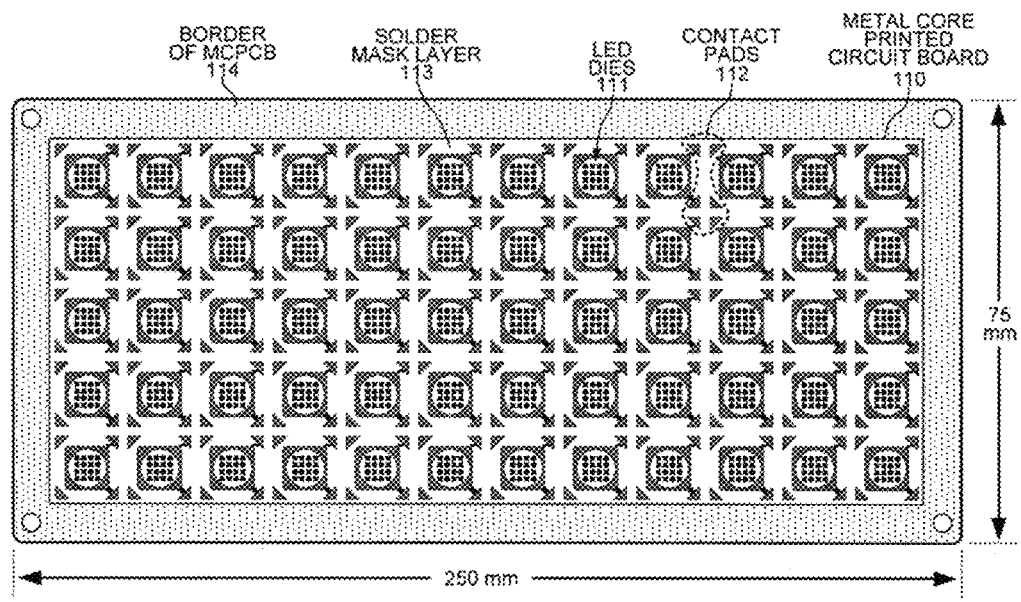
FIG. 10 is a top view of a metal core printed circuit board (MCPCB) on which multiple arrays of LED dies are mounted.

FIG. 10 is a top view of a metal-core printed circuit board (MCPCB) 110 on which multiple arrays of LED dies 111 are mounted. Because MCPCB 110 has a metal core, it would be difficult to supply power to the LED dies 111 through through-hole vias that pass from the LEDs through the printed circuit board to the bottom surface of the board. Consequently, the LED dies 111 are electrically connected to contact pads on the top side of MCPCB 110. The MCPCB 110 is then segmented to form discrete array light sources. The discrete light sources can be used as standardized photon building blocks by packaging them in a multitude of ways using a molded interconnect structure that electrically contacts the photon building blocks from the top side. How discrete light sources are packaged in a molded interconnect structure that electrically connects only from the top side to the discrete light sources is described in detail below.

In the embodiment of FIG. 10, MCPCB 110 includes a 5×12 matrix of 4×4 LED arrays. MCPCB 110 has a length of about 250 mm and a width of about 75 mm. Each LED array is later segmented into a square of the MCPCB that is 11.5 mm on a side. Thus, MCPCB 110 has a very high density of light sources per area of the printed circuit board. There are less than three millimeters of space on the board between the edge of the lens that covers the LED dies 111 and the edge of each of the segmented square light source. At each corner of the square is a contact pad 112 that is used to supply power to the array light source. The contact pads 112 are formed by exposing large triangular areas of a trace layer. The trace layer is covered by a solder mask layer 113 of hardened epoxy. Holes in solder mask layer 113 form the contact pads 112 and the locations on the trace layer below to which the LED dies 111 are wire bonded.

A lens is formed over each LED array using compression molding. Compression molding can be used because there are no holes or opening from the top side to the bottom side of MCPCB 110 through which high pressure molding material could escape. Thus, MCPCB 110 is a closed board. Conventional printed circuit boards used to mount LED arrays have punch-outs or etchings cuts to isolate the electrical leads of each LED array. MCPCB 110, on the other hand, is a closed board with no punch outs, holes or etching cuts through the board. The very high density of components and the closed board of MCPCB 110 are conducive to compression molding. A single molding chamber is formed over the top of MCPCB 110 by sealing the chamber around the border 114 of MCPCB 110. A small space is maintained between solder mask layer 113 and the mold cover to allow the molding material to flow freely between the individual cavities above the LED arrays. In the actual molding process, MCPCB 110 is inverted and lowered into the mold cover, which contains the lens cavities. The molding material is pumped into the single molding chamber under pressure and fills all of the crevices of the cavities without leaving bubbles or nonuniformities in the hardened molding material. The molding material that fills the small space between the mold cover and solder mask layer 113 forms a thin flash layer that covers the contact pads 112 that must later be electrically coupled to the interconnect packaging structure.

In one embodiment, the molding material is a slurry of phosphor particles in silicone. The phosphor is evenly dispersed throughout the silicone and converts a portion of the blue light generated by the LEDs into light in the yellow and red regions of the optical spectrum. The blue light from the LEDs and the yellow and red light from the phosphor combine to yield white light, which is optically spread out by the surface of the lens. After the lenses are formed using compression molding, the individual LED array light sources are segmented by cutting MCPCB 110 into squares. It is more efficient, however, first to remove the flash layer that covers the contact pads 112 before segmenting MCPCB 110 into individual LED array light sources.

Figure 11:
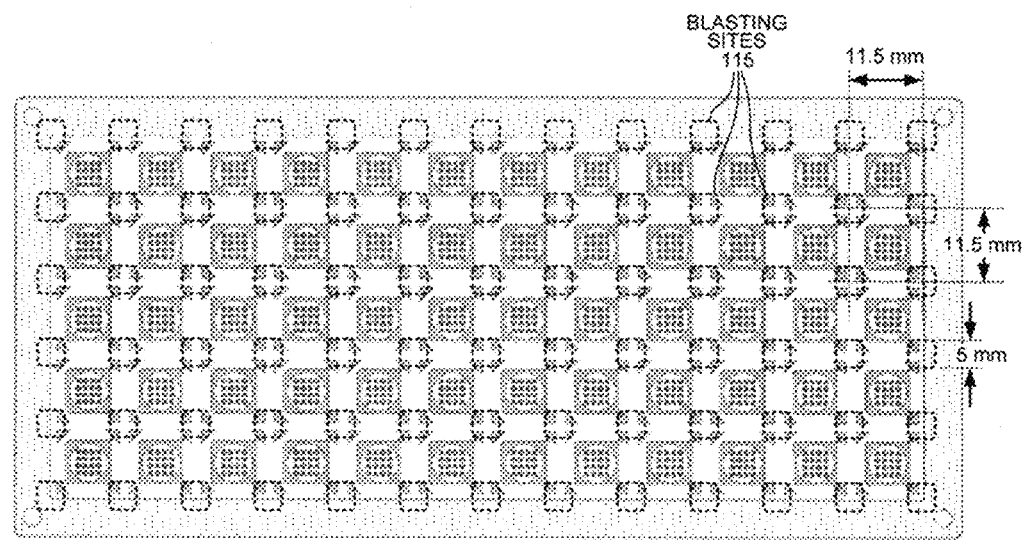
FIG. 11 is a top view of the MCPCB of FIG. 10 on which areas have been marked to show where a flash layer should be removed to expose contact pads.

FIG. 11 is a top view of MCPCB 110 of FIG. 2 on which areas have been marked to show where the flash layer should be removed to expose the contact pads 112. For a unit size of 11.5 mm by 11.5 mm for the LED array light sources of FIG. 2, the contact pads 112 can be cleaned of the silicone flash layer by removing silicone from 5 mm by 5 mm squares. A novel micro-bead blasting process is used to remove the silicone flash layer from the square blasting sites 115.

Figure 12:
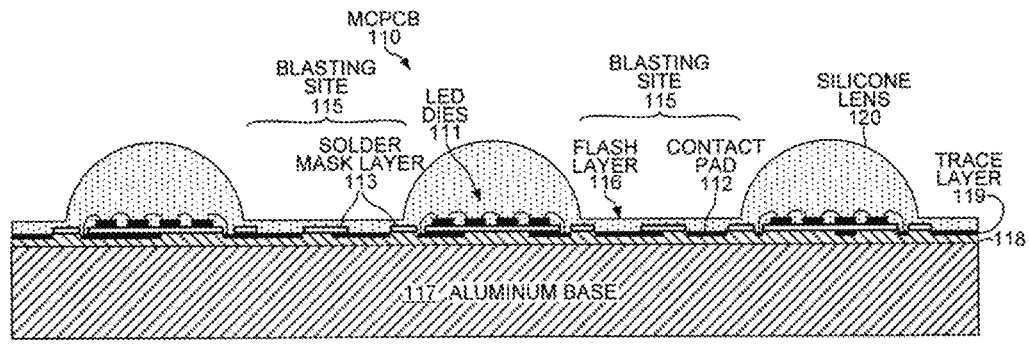
FIG. 12 is a cross sectional view of the MCPCB of FIG. 10 showing the flash layer that is to be removed using the novel blasting process.

FIG. 12 is a cross sectional view of MCPCB 110 of FIG. 2 showing the flash layer 116 that is to be removed using the novel blasting process. MCPCB 110 has a thick solid aluminum base 117. For example, aluminum base 117 is 1.6 mm thick. A dielectric layer 118 separates aluminum base 117 from the trace layer 119 that forms the contact pads 112. Dielectric layer 118 has a thickness of about twenty microns (micrometers or µm). Trace layer 119 does not entirely cover dielectric layer 118, but rather is formed by patterned traces separated by dielectric material. Solder mask layer 113 covers trace layer 119 and has openings only over the contact pads 112 and the locations at which the LED dies 111 are wire bonded to traces.

The molded silicone forms lenses 120 over the arrays of LED dies 111. In the embodiment of FIG. 12, the diameter of lens 120 is about twice as long as each side of the 4×4 array of LED dies so as to allow most of the emitted light to reach the surface of lens 120 within the critical angle required for the light to escape from the lens. The height of the lens 120 is about 1.5 mm from solder mask layer 113. Other embodiments have lenses of different sizes and shapes over the LED dies 111. For example, the silicone above each LED array can have a small overall curvature that is covered by many smaller micro-structures, such as hemispheres or pyramids. Alternatively, the lens shape can have a dimple above the middle of each LED array.

Figure 13:
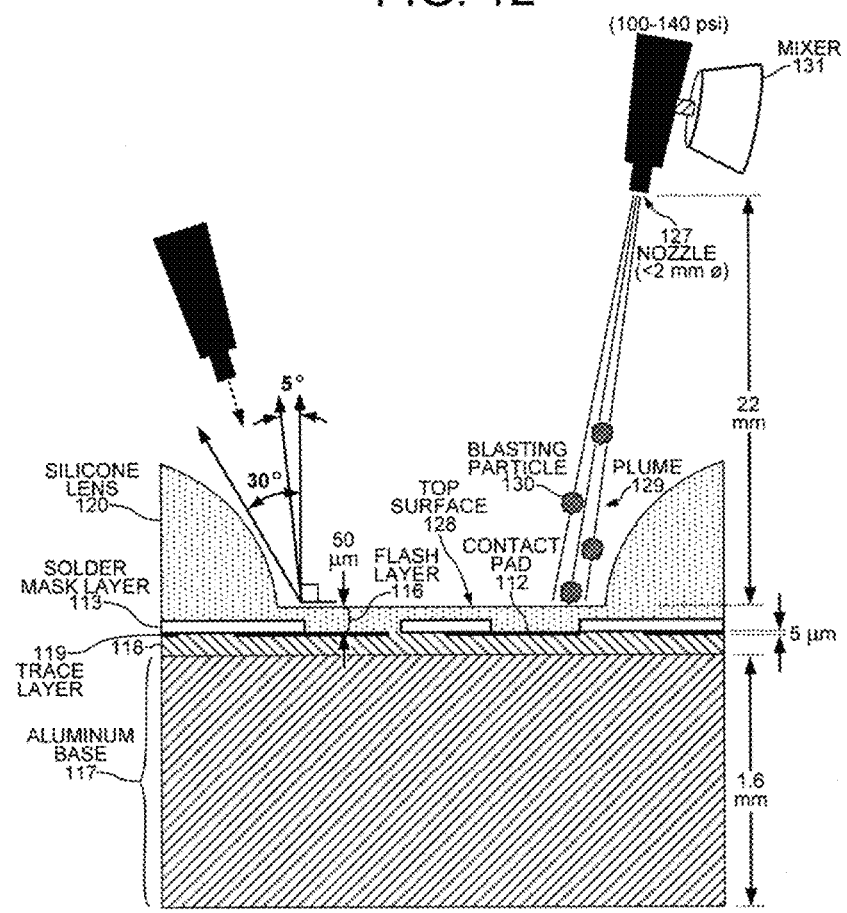
FIG. 13 is a more detailed view of the flash layer of FIG. 12.

FIG. 13 is a more detailed view of flash layer 116 of FIG. 12. FIG. 13 shows that flash layer 116 is relatively thick compared to trace layer 119. Whereas in some compression molding processes flash layer 116 has a thickness between fifty to one hundred microns, trace layer 119 can have a thickness of less than five microns. Trace layer 119 typically has three sublayers: a thicker lower layer of copper, a thinner middle layer of nickel, and a thinner upper layer of either gold or silver. Copper is less expensive than nickel, gold or silver, so the traces are comprised mostly of copper. The upper layer of gold or silver is required because it is difficult to solder the wire bonds directly to copper. The middle layer of nickel is used to attach the gold or silver to the thicker copper layer because gold and silver do not readily adhere directly to copper. The copper is typically 2-80 microns thick, the nickel is typically 1-3 microns thick, and the gold or silver is typically 1-5 microns thick. Thus, the contact pads 112 will be damaged if the gold or silver that is no thicker than five microns is removed from the upper surface of the trace layer 119. The novel micro-bead blasting process provides a way of removing silicone flash layer that is about fifty microns thick without removing the upper layer of trace layer 119, which is only about one tenth as thick.

Figure 14:
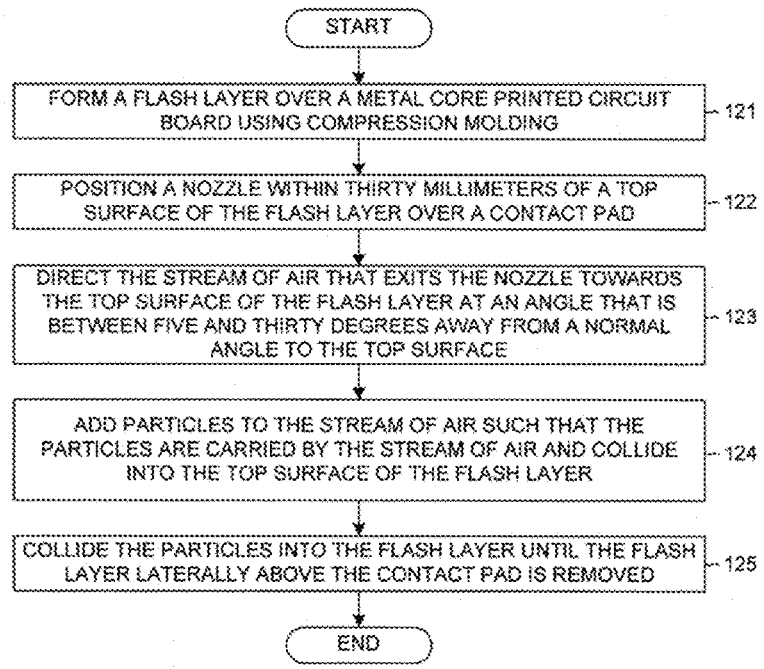
FIG. 14 is a flowchart of steps of a method for removing a flash layer of silicone that covers contact pads without damaging the contact pads.

FIG. 14 is a flowchart illustrating steps 121-125 of a micro-bead blasting process that removes a flash layer of silicone that covers contact pads without damaging the contact pads. The steps of the method of FIG. 14 are described in relation to FIG. 13.

In a first step 121, the flash layer 116 is formed over the printed circuit board 110 using compression molding. Although the flash layer 116 of FIG. 13 results from compression molding silicone, other transparent molding materials may also be used, such as epoxy. The flash layer of silicone 116 in FIG. 13 is disposed above two contact pads 112.

In step 122, a nozzle 127 is positioned within thirty millimeters of a top surface 128 of flash layer 116. In order to clean a blasting site 115 that is 5 mm by 5 mm square, the method of FIG. 14 uses a nozzle 127 that has a diameter of about two millimeters and that is placed about twenty-two millimeters above top surface 128. A smaller nozzle diameter would be used to remove a flash layer from a smaller blasting site, in which case the nozzle would be positioned closer to the top surface of the flash layer. For example, in order to clean the flash layer from a blasting site 115 having a diameter of two millimeters located between LED arrays having unit sizes of five millimeters on a side, nozzle 127 would have a diameter of about 0.5 millimeters and would be positioned about two millimeters above the top surface 128 of flash layer 116. The blasting site is located over the contact pads 112 that are to be cleaned of flash layer 116. Positioning nozzle 127 farther away from top surface 128 allows the stream of air exiting the nozzle to spread out into a wider plume 129 before contacting top surface 128. Thus, nozzle 127 must be positioned closer to top surface 128 in order to maintain the stream of air within a smaller blasting site 115.

In step 123, the flow of air that exits nozzle 127 is directed at top surface 128 of flash layer 116 within blasting site 115. The stream of air that exits from nozzle 127 is directed towards top surface 128 at an angle that is between five and thirty degrees away from a normal angle to the top surface. The stream of air is generated by compressing the air to a pressure of more than one hundred pounds per square inch (psi) and then allowing the compressed air to escape from nozzle 127. In order to clean a blasting site 115 that is 5 mm by 5 mm square, the flow of air is generated by compressing the air to a pressure between one hundred and one hundred forty pounds per square inch and then allowing the compressed air to escape from a nozzle that has a diameter of less than two millimeters.

In step 124, blasting particles 130 of a blasting medium are added to the stream of air such that the particles are carried by the stream of air and collide into top surface 128 of flash layer 116 above contact pad 112. The blasting particles 130 are also called micro beads, although they need not be spherically shaped. The blasting medium should have a Mohs hardness of less than three; sodium bicarbonate ($NaHCO_3$), sodium sulfate and ammonium bicarbonate (ammonium hydrogen carbonate, ($NH_4HCO_3$)) can be used. In one embodiment, the blasting particles 130 are monoclinic prisms of sodium bicarbonate that have been purified and sorted through a sieve to have a uniform particle size of about fifty microns in the longest dimension. The blasting particles 130 are stored as a powder and are added into the flow of air by a mixer 131 shortly before exiting nozzle 127.

When cleaning a blasting site 115 that is 5 mm by 5 mm square, the nozzle can be placed about twenty-two millimeters above top surface 128, which allows the blasting particles 130 to achieve their highest velocity. When the particles 130 are first added to the flow of air by mixer 131, the inertia of the particles prevents them from immediately accelerating to the speed of the air flow. However, within about twenty-two millimeters, the particles 130 have accelerated to the speed of the stream of air and have achieved their highest velocity. At distances greater than about thirty millimeters from nozzle 127, resistance from ambient air overcomes the thrust from the stream of air and slows down the particles 130. At distances less than about twenty millimeters from nozzle 127, the particles 130 have not yet accelerated to the speed of the flow of air. Thus, where particles of about fifty microns in length are used, flash layer 116 can be removed in the shortest period of time by blasting the particles from a distance of about twenty-two millimeters because the particles possess the most amount of kinetic energy at that distance from the nozzle.

In step 125, the particles 130 are collided into flash layer 116 until the flash layer laterally above contact pad 112 is removed. The particles 130 have facets and edges that rip the silicone of the flash layer 116 apart. Then the air blows the ripped pieces of silicone away. Small amounts of sodium bicarbonate remain embedded in the silicone that has not been removed. When cleaning the relatively large blasting sites 115 of FIG. 11, nozzle 127 may be placed at about twenty-two millimeters from top surface 128 of flash layer 116, which permits the particles 130 to acquire their maximum kinetic energy. Consequently, the flash layer in the blasting sites 115 that are squares 5 mm on a side can be removed in a relatively short 2-3 seconds. On the other hand, when cleaning the relatively small blasting site 115 having a diameter of two millimeters located between LED arrays having unit sizes of five millimeters on a side, nozzle 127 must be placed a relatively close two millimeters from top surface 128, which does not permit the particles 130 to achieve their maximum speed. Consequently, the flash layer in a blasting site with a diameter of two millimeters can be removed only after a relatively long eight seconds of blasting.

The stream of air exiting nozzle 127 is not directed in step 123 towards flash layer 116 at an angle normal to top surface 128, i.e., the stream of air is not directed orthogonally to top surface 128. Instead, the stream of air is directed towards flash layer 116 at an angle that is between five and thirty degrees away from normal to the top surface in order to permit the particles 130 to be blown away from the blasting site. If the nozzle were to be directed orthogonally to the top surface of the flash layer, the blasting particles would bounce straight back up and collide with the particles in the stream of air. This would reduce the force by which the blasting particles collide with the flash layer. In addition, the particles would not bounce sideways after striking the top surface and therefore would not be carried out of the blasting site and would build up. On the other hand, if the nozzle were directed at a shallow angle to the top surface of the flash layer, such as an angle greater than thirty degrees from normal, then the vector of the particle speed normal to the top surface would be insufficient to remove the flash layer. The particles would tend to be deflected by the top surface and would not break into the surface.

Even at a steeper angle of incidence, such as ten degrees, the blasting particles 130 are more likely to bounce off of top surface 128 instead of breaking into the surface when flash layer 116 is thicker. At the beginning of the blasting process when flash layer 116 is still about fifty microns thick, the particles 130 are more likely to bounce off top surface 128 because the thicker silicone flash layer can elastically compress to absorb the impact of the particles. As flash layer 116 is eaten away and becomes thinner, the rate of silicone removal becomes faster as the kinetic energy of the particles increasingly tears the silicone as opposed to being absorbed by the silicone.

Current compression molding techniques specify that the thickness of a flash layer of silicone can be fifty ±25% microns. It is desirable to keep the flash layer as thin as possible to save on silicone but yet allow the silicone to flow freely between the individual lens cavities to achieve high quality lens structures. Where the flash layer is thinner than thirty microns, the elasticity of the silicone layer is reduced to the point that blasting particles do not readily bounce off of the silicone but rather tear the silicone. As even thinner flash layers become possible, the flow of compressed air alone will be sufficient to remove the flash layer from between the lens structures.

Figure 15:
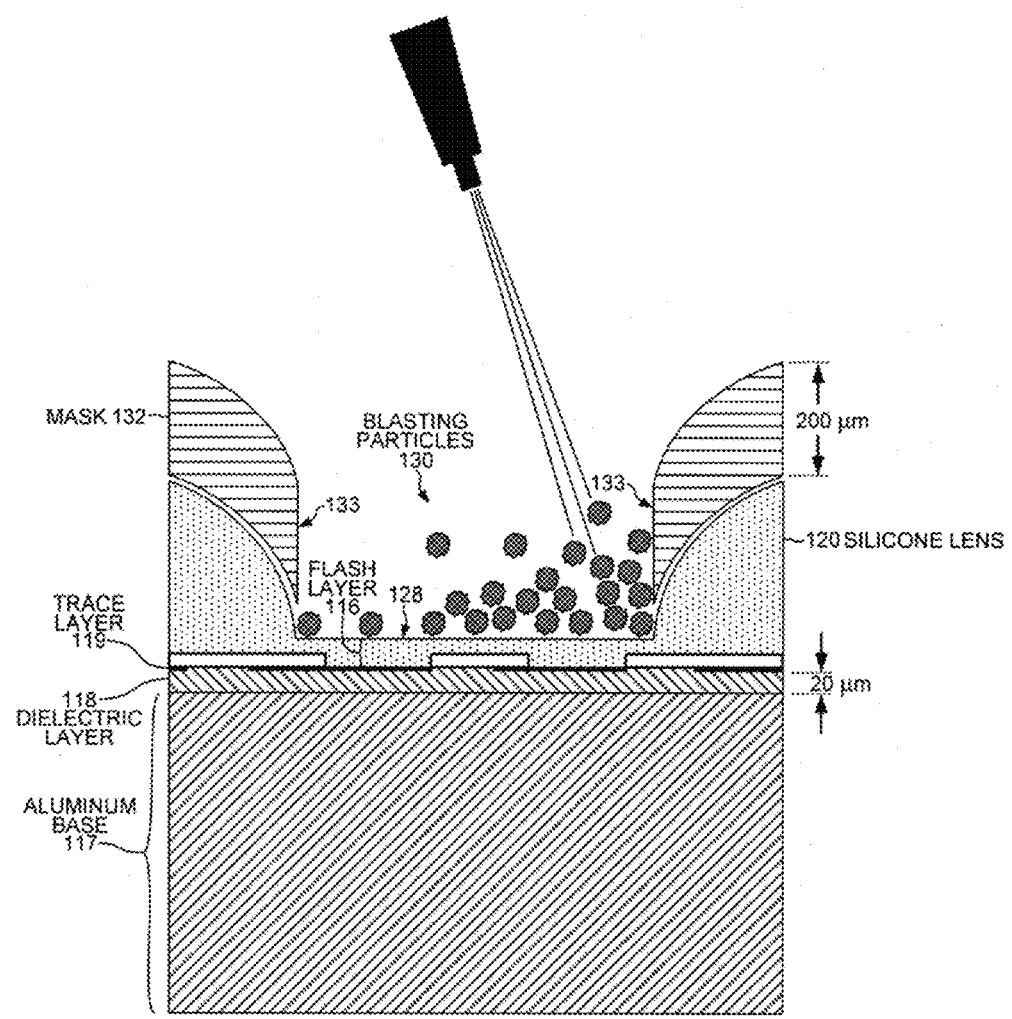
FIG. 15 is a cross sectional view illustrating blasting particles colliding with a flash layer at a blasting site enclosed by a blasting mask.

FIG. 15 illustrates blasting particles at a blasting site that is enclosed by a blasting mask 132. Blasting mask 132 is made of stainless steel and is about 200-500 microns thick. Mask 132 is used when the lenses are particularly close to the blasting sites 115 and must be protected from the blasting particles 130. For example, blasting mask 132 is used for blasting sites located between LED arrays having unit sizes of five millimeters on a side. The blasting process is sped up by using a mask because the flow of air need not be turned off when moving from site to site. Each lens 120 is protected from the blasting particles 130 by mask 132 as the stream of air moves over the lens to a new blasting site. In contrast, where no blasting mask is used with larger unit sizes, such as an array unit size of 11.5 mm on a side, the flow of air is turned off as the position of the nozzle is moved from one blasting site to another in order to avoid damaging the lens structures.

Using a blasting mask, however, creates other complications that slow down the blasting process. The thickness of the blasting mask creates a well that both (i) obstructs the corners of the blasting site from being reached by the stream of air and (ii) hinders the blasting particles from being blown away from the blasting site. First, the blasting mask obstructs the nearest corner of the blasting site from direct blasting by the angled stream of air. Thus, the far side of the blasting site 115 is cleaned first, and then MCPCB 110 is rotated to permit the cleaning of the other side of the blasting site. The rotation and double pass of the stream of air slow the blasting process. Second, the sides 133 of the blasting mask 132 form a deep well that tends to trap the blasting particles 130. If blasting particles 130 from the stream of air collide with other particles that previously accumulated over the surface of the blasting site 115, then the silicone flash layer 116 will not be torn and ultimately removed. Thus, the angle of the stream of air is increased towards thirty degrees from normal to top surface 128 in order to bounce the particles 130 away from the incoming particles and out of the well. In addition, the pressure of the air used to generate the stream of air is increased towards one hundred forty pounds per square inch in order to provide the particles with enough kinetic energy to bounce out of the well.

Figure 16:
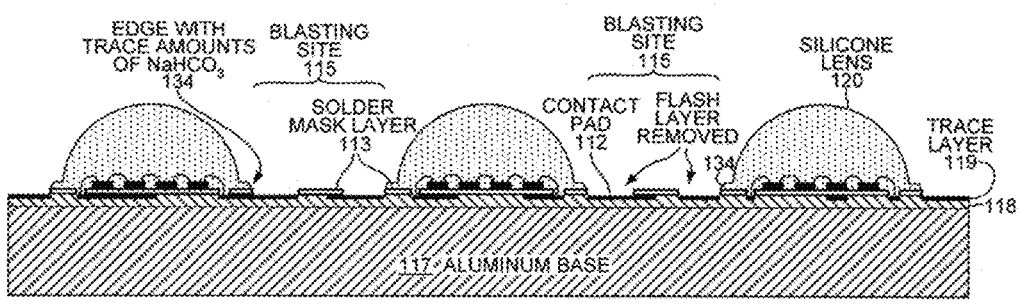
FIG. 16 is a cross sectional view of the blasting sites of FIG. 12 after the flash layer has been removed using the method of FIG. 14.

FIG. 16 is a cross sectional view of the blasting sites 115 of FIG. 12 after the flash layers 116 have been removed using the method of FIG. 14. FIG. 16 shows that after the blasting process, the layer of silicone forms an edge 134 around the contact pads 112 that have been cleaned. Some of the blasting particles 130 break apart in the blasting process and form dust having particles sizes much smaller than 50 microns. Some of the dust lodges in the silicone around the blasting sites 115. Thus, the silicone at edge 134 contains a trace amount of the blasting medium, such as sodium bicarbonate, that remains from the blasting particles 130. The trace amount of sodium bicarbonate can be detected in the segmented LED array light sources using a gas spectrometer.

Figure 17:
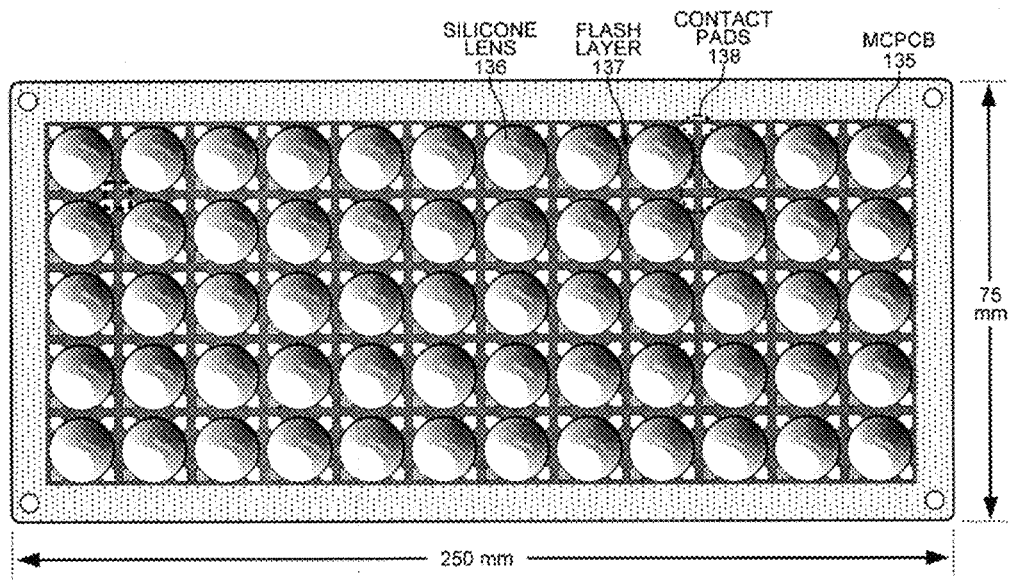
FIG. 17 is a top view of another MCPCB from which a flash layer of silicone is to be removed using the method of FIG. 14.

FIG. 17 is a top view of another MCPCB 135 from which a flash layer of silicone is removed using the method of FIG. 14. In FIG. 17, the lenses 136 and flash layer 137 have already been formed by compression molding. Like MCPCB 110 of FIG. 2, MCPCB 135 also includes a 5×12 matrix of LED arrays. And each LED array is later segmented into a square of the MCPCB that is 11.5 mm on a side. Unlike MCPCB 110 of FIG. 2, however, the contact pads 138 on MCPCB 135 are not formed by exposing areas of a trace layer that is covered by a solder mask layer. Instead, the contact pads 138 are four strips of metal that extend out from under each lens 136. The flash layer 137 covers the metal strips.

Figure 18:
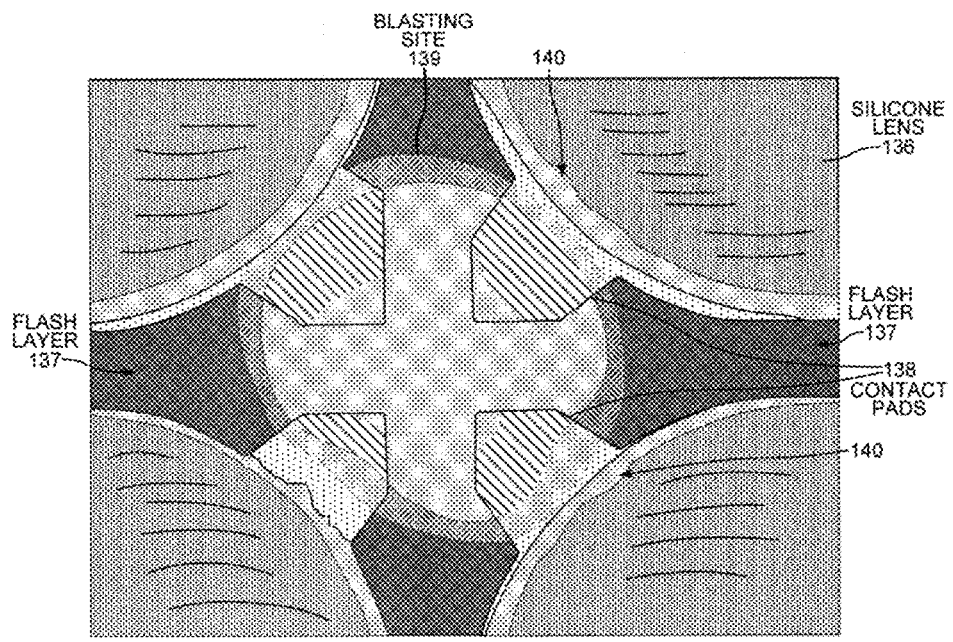
FIG. 18 is a top-down perspective view of a blasting site between four lenses on the MCPCB of FIG. 17.

FIG. 18 is a top-down perspective view of a blasting site 139 between four lenses 136 on MCPCB 135. The microbead blasting process was performed using a 0.077 inch diameter nozzle positioned about 22 millimeters above flash layer 137. A pressure of 120 psi was used to generate the stream of air that contained particles of sodium bicarbonate having a median diameter of about 50 microns. The stream of air containing the blasting particles was blasted at blasting site 139 for 1.65 seconds. The blasting removed material to various degrees progressing outwards from the center of blasting site 139. At the center of blasting site 139, the entire thickness of flash layer 137 has been removed, and the blasting has even removed some of the upper layer of gold from the contact pads 138. Some of the dielectric layer was also removed from the center of blasting site 139. Moving outwards from the center of blasting site 139, only the silicone was removed from a large portion of the contacts pads 138 without damaging the upper layers of the contact pads 138. This region is marked with diagonal hashes in FIG. 18. In the next region on each contact pad 138 outwards from the center to the blasting site, the silicone flash layer 137 was not entirely removed from the contact pad. FIG. 18 shows areas 140 on the corners of lenses 136 that have been partially roughened by the blasting process.

In another embodiment, water-based jetting is used to remove a flash layer of silicone. Purified water is pressurized to a pressure of between fifty and one thousand pounds per square inch and then forced through a nozzle with an opening diameter between one hundred and one thousand microns. The exiting water beam is aimed directly at the flash layer over the electrical contact pads until the flash layer is removed. The combination of the water pressure and nozzle diameter is chosen to achieve a stream of water with enough momentum to break the silicone flash layer but yet that leaves the metal trace layer undamaged. Alternatively to using pure water, abrasive particles such as silica, aluminum oxide, or garnet particles can be added to the stream of water to allow a more efficient deflashing process at a lower water pressure compared to with pure water.

Figure 19:
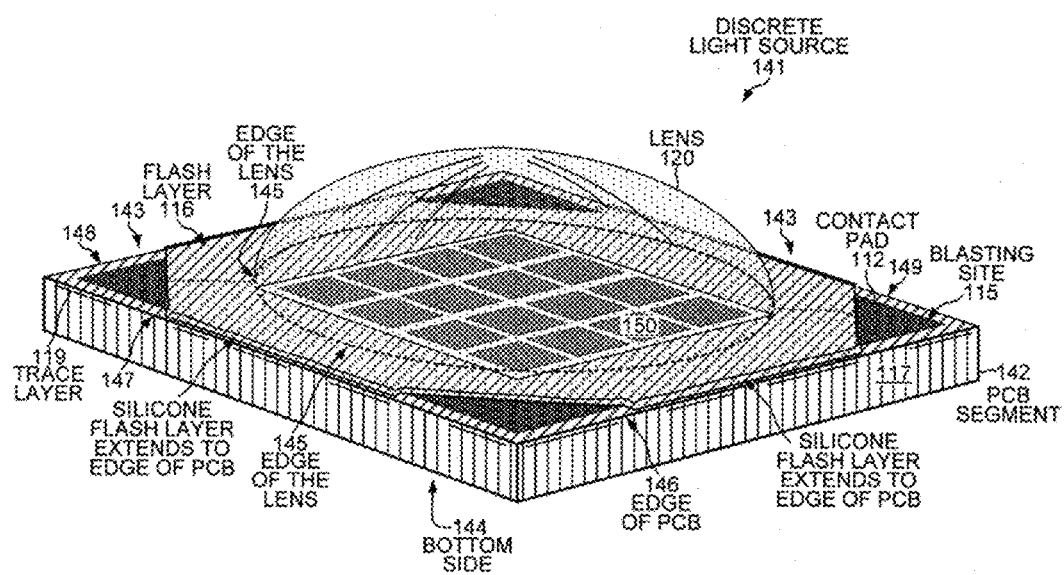
FIG. 19 is a perspective view of a discrete light source with top-side electrical contacts from which a flash silicone layer has been removed.

FIG. 19 is a perspective view of a discrete light source 141 with only top-side electrical contacts from which a flash silicone layer 116 has been removed. Discrete light source 141 was manufactured using the method of FIG. 14. Discrete light source 141 results from the segmentation of the arrays of LED dies 111 mounted on MCPCB 110 of FIG. 2. The printed circuit board (PCB) segment 142 of discrete light source 141 has a top side 143, a bottom side 144, and four edges 146-149. A light emitting diode die 150 is disposed on the top side 143 of PCB segment 142. A contact pad 112 is also disposed on the top side 143 of PCB segment 142. A layer of silicone 116 is disposed over LED die 150 and extends to each of the edges 146-149 of PCB segment 142 except where the silicone flash layer 116 has been removed through blasting. The layer of silicone 116 is not disposed laterally above a portion of contact pad 112 at blasting site 115. In the embodiment of FIG. 19, the silicone flash layer 116 has not been removed from the entire surface of contact pad 112; a small portion of the trace layer that forms contact pad 112 remains covered by silicone.

All of the electrical contacts on discrete light source 141 are on the top side 143. Thus, PCB segment 142 has no electrical contacts on the bottom side 144. The layer of silicone 116 forms lens 120 above LED 150. There are less than three millimeters between the edge 145 of lens 120 and any of the edges 146-149 of PCB segment 142 because discrete light source 141 was segmented from a high density printed circuit board 110. There are also less than three millimeters between the edges 146-149 of PCB segment 142 and any of the LED dies in the array of LED dies. There are no holes that pass from the top side 143 to the bottom side 144 of PCB segment 142. Any punch-outs, through holes, or etching cuts in the top side 143 of discrete light source 141 would have hampered the formation of lens 120 using compression molding because the pressurized molding material would have escaped through the holes. The silicone at the edge of blasting site 115 contains a trace amount of the blasting medium that remains embedded in the silicone.

Figure 20:
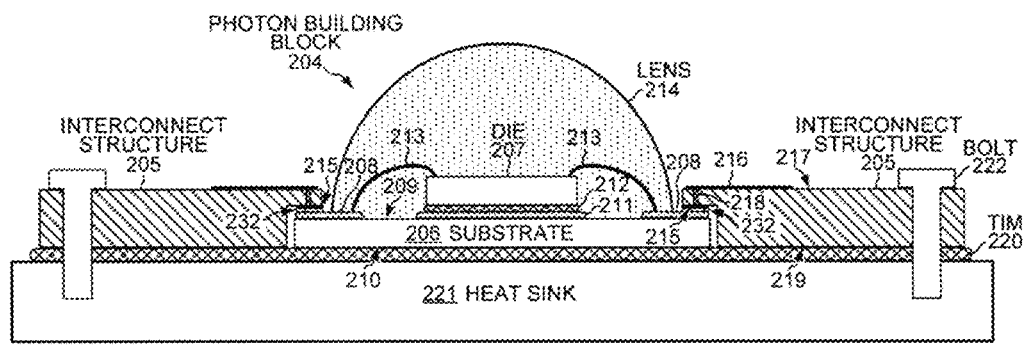
FIG. 20 is a cross-sectional view of a novel photon building block supported by an interconnect structure.

FIG. 20 is a cross-sectional view of a photon building block 204 supported by an interconnect structure 205. Photon building block 204 includes a substrate 206 upon which an LED die 207 is mounted. Substrate 206 is non-conductive ceramic. In another implementation, substrate 206 is crystalline silicon. Landing pads 208 are disposed on the top surface 209 of substrate 206. No electrical conductor passes from the top surface 209 of substrate 206 to the bottom surface 210 of substrate 206. LED die 207 is electrically coupled to power solely through the landing pads 208. Thermal interface materials are disposed between LED die 207 and substrate 206. A first layer 211 of thermal interface material (TIM) is made of the same material and deposited in the same process as landing pads 208. In one implementation, pads 208 and first layer 211 are traces made of a Cu—Ni—Au alloy or a Cu—Ni—Ag alloy. A second layer 212 of thermal interface material is deposited on first layer 211. In one implementation, second layer 212 is a silver-filled epoxy. LED die 207 is bonded through second layer 212 and first layer 211 to top surface 209 of substrate 206.

LED die 207 is electrically connected through wire bonds 213 to landing pads 208. A thin conformal layer of a wavelength conversion material, such as a phosphor, is formed over LED die 207. Then a clear resin encapsulant, such as silicone, is overmolded over LED die 207 and the wire bonds 213 from about the middle of a landing pad 208 on one side of upper surface 209 of substrate 206 to about the middle of a landing pad 208 on the opposite side of upper surface 209. The silicone forms the shape of a lens 214. Photon building block 204 includes substrate 206, the landing pads 208 and everything encapsulated by lens 214.

Interconnect structure 205 supports photon building block 204 through the landing pads 208. The landing pads 208 are both electrically and mechanically connected to contact pads 215 disposed on the underside of a lip of the interconnect structure 205. In one implementation, landing pads 208 are attached to contact pads 215 by a solder paste. An example of a solder paste is a SAC alloy, such as SAC 305 (96.5% Sn, 3.0% Ag, 0.5% Cu). In another implementation, landing pads 208 are attached to contact pads 215 by an adhesive. An example of an adhesive is an anisotropic conductive adhesive associated with anisotropic conductive film (ACF) technology. In the embodiment of FIG. 20, landing pads are electrically and mechanically connected to contact pads 215 by solder 232.

In the embodiment of FIG. 20, contact pads 215 are electrically connected to conductive traces 216 on the top surface 217 of interconnect structure 205 by through-hole vias 218. Thus, each conductive trace 216 is electrically coupled to LED die 207 through via 218, contact pad 215, solder 232, landing pad 208 and wire bond 213. Interconnect structure 205 has a bottom surface 219 that is substantially coplanar with bottom surface 210 of substrate 206.

Photon building block 204 and interconnect structure 205 are attached over a third layer 220 of thermal interface material (TIM) to a heat sink 221. In one implementation, third layer 220 of thermal interface material is thermal glue. In another implementation, third layer 220 is made of thermal grease, and interconnect structure 205 is attached to heat sink 221 by bolts 222. Any small deviations of bottom surfaces 210 and 219 from being exactly coplanar are compensated by the thickness of the thermal interface material, such as the thermal grease. Bolts 222 hold interconnect structure 205 in place over heat sink 221, and photon building block 204 is held in place by the connection between landing pads 208 and contact pads 215. Thus, substrate 206 is thermally coupled through the third layer 220 of TIM to heat sink 221. In one implementation, bottom surface 210 of substrate 206 is not directly connected to heat sink 221, but is rather "floating" in the layer 220 of thermal grease. Photon building block 204 is mechanically connected to heat sink 221 only through the bonds between landing pads 208 and contact pads 215. In contrast, carrier substrate 12 of the prior art array product 10 is attached to the heat sink only by gluing or soldering the bottom surface of substrate 12 to the heat sink.

Compared to a conventional discrete light emitter, a printed circuit board (PCB) and one layer of TIM have been removed from beneath novel photon building block 204. In a conventional discrete light emitter, the carrier substrate sits on a TIM layer over a metal core PCB, which in turn sits on another TIM layer over the heat sink. Using the novel photon building blocks to make an array product is more economical than making an array product using conventional discrete light emitters because the cost of the metal core PCB and an additional TIM layer is saved. Moreover, heat generated by the LED die is more effectively transferred from the carrier substrate through one TIM layer directly to the heat sink than through an additional MCPCB and TIM layer of conventional discrete light emitters.

In another embodiment, photon building block 204 and interconnect structure 205 are not attached directly to heat sink 221 over third TIM layer 220. Instead, a thermal spreader is placed between heat sink 221 and photon building block 204. Photon building block 204 and interconnect structure 205 are then attached over third TIM layer 220 to the thermal spreader. An example of a thermal spreader is a vapor chamber.

Figure 21:
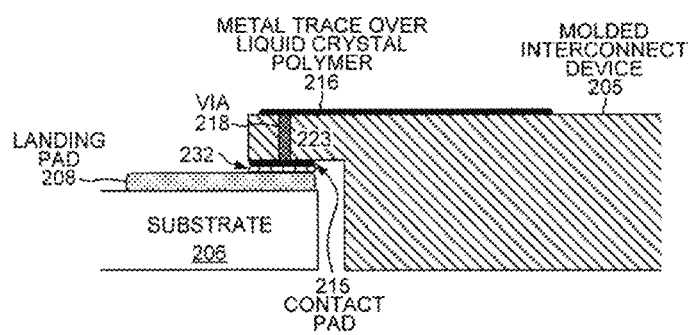
FIG. 21 is a more detailed view of a contact pad connected to a landing pad as shown in FIG. 20.

FIG. 21 shows one of the contact pads 215 of FIG. 20 in more detail and the landing pad 208 to which the contact pad is connected. Contact pad 215 is a metal trace on interconnect structure 205. In one implementation, interconnect structure 205 is a molded interconnect device (MID). MID 205 is a three-dimensional electronic circuit carrier produced by injecting a metalized, high-temperature thermoplastic, such as liquid crystal polymer (LCP), into a mold. A laser writes the path of the trace on the surface of MID 205. Where the laser beam oblates the thermoplastic, the metal additive in the thermoplastic forms a very thin conductor path. The metal particles on the conductor path form the nuclei for subsequent metallization. Metallization baths are used to form successive layers of copper, nickel and/or gold traces on the conductor path. For example, a layer of copper forms on the conductor path when the oblated thermoplastic is placed in a copper bath. Wherever the laser can oblate the surface of MID 205, three-dimensional circuit traces can quickly be formed.

Contact pad 215 is formed on the underside of a lip 223 of MID 205 after the laser oblates the shape of the pad. Metal trace 216 is also formed on the top surface 217 of interconnect structure 205 in the same manner as contact pad 215 is formed. Either the laser is articulated so that the laser beam can be directed at both top surface 217 and the underside of a lip 223, or two lasers can be used. In the implementation of FIG. 21, through-hole via 218 is filled with metal before the traces and pads are formed. The metallization baths plate the trace 216 and contact pad 215 over the ends of metal via 218.

An electrical and mechanical connection is made between contact pad 215 and landing pad 208 by reflowing a solder alloy between the pads. For example, a SAC reflow process can be performed where a Sn—Ag—Cu solder alloy is placed at the edge of landing pad 208. When the SAC solder is melted, the solder wets the metal of contact pad 215. Then the surface tension of the molten SAC alloy pulls landing pad 208 under contact pad 215. A bond is then formed between landing pad 208 and contact pad 215 when the SAC alloy cools and solidifies.

Figure 22A:
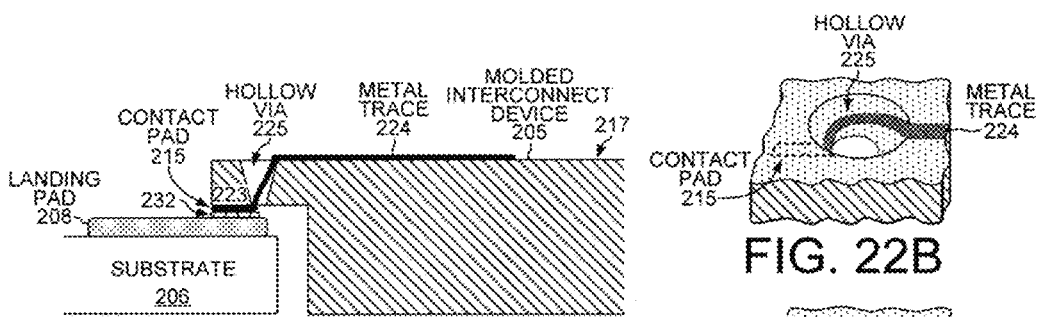
FIG. 22A is a cross-sectional view of a conductor on an interconnect structure coupled through a contact pad to a landing pad on a substrate.
Figure 22B:
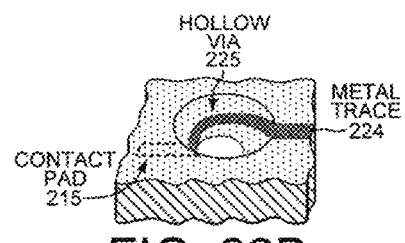
FIG. 22B is a perspective view of the path of the conductor of FIG. 22A passing through a hollow via to the contact pad.
Figure 22C:
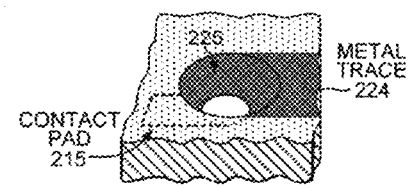
FIG. 22C is a perspective view of the conductor of FIG. 22A passing through and entirely covering the inside surface of a hollow via.

FIG. 22A shows another implementation of how a metal trace 224 on MID 205 is electrically coupled to landing pad 208 on substrate 206. Instead of via 218 filled with metal, as in FIG. 21, MID 205 of FIG. 22A includes a hollow tapered via 225. Hollow via 225 is formed using a conical plug in the molding process that forms the molded interconnect device 205. The laser oblates a conductor path across top surface 217, around the inside surface of via 225, and then on the underside of a lip 223 to form the shape of contact pad 215. The conductor path and pad shape are then plated in a metallization bath. FIG. 22B shows the conductor path of the laser in more detail. The conductor path can be much wider than the width of the laser. The laser can make many passes to create a wide conductor path, such as the one shown in FIG. 22C. In FIG. 22C, the entire partially conical-shaped inside surface of hollow via 225 is oblated and will be plated in a metallization step.

Figure 23:
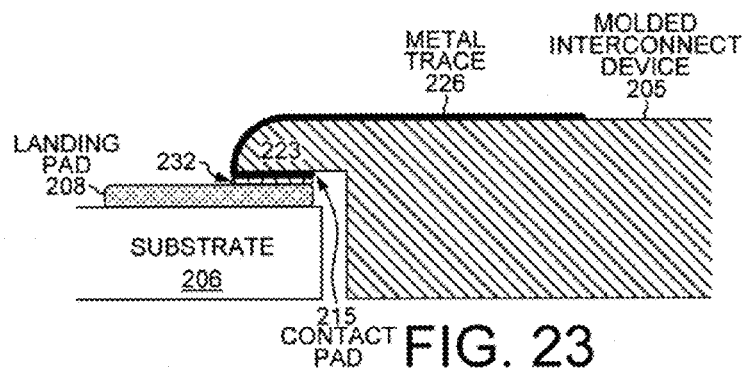
FIG. 23 is a cross-sectional view of the conductor of FIG. 22A passing around the rounded edge of a lip of the interconnect structure.

FIG. 23 shows another implementation of how a metal trace 226 on MID 205 is electrically coupled to landing pad 208 on substrate 206. Lip 223 of MID 205 is given a rounded edge. The laser makes a continuous conductor path across top surface 217, around the rounded edge and then on the underside of a lip 223.

Figure 24:
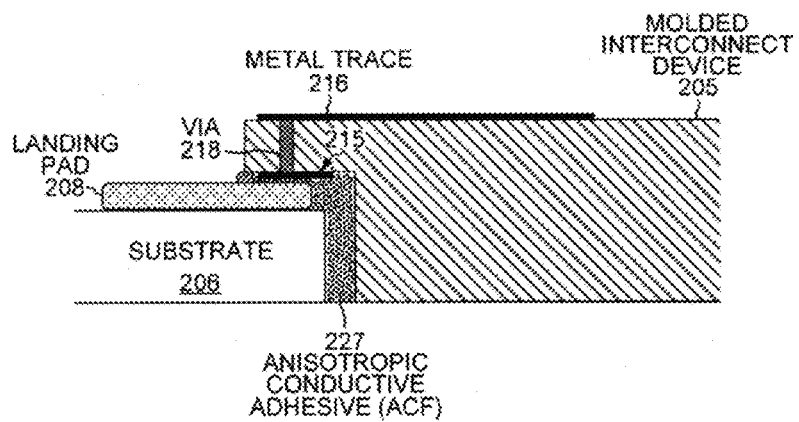
FIG. 24 shows a landing pad on the substrate bonded to a contact pad on the underside of a lip of the interconnect structure by an anisotropic conductive adhesive (ACF).

FIG. 24 shows an alternative way of electrically and mechanically coupling contact pad 215 to landing pad 208 that does not involve solder. An anisotropic conductive adhesive 227 is used to connect contact pad 215 to landing pad 208 in FIG. 24 instead of the bond formed using solder reflow as shown in FIG. 21. Because solder is not used, photon building block 204 does not self-align within interconnect structure 205, but must be accurately positioned before the adhesive cured. Anisotropic conductive adhesive film (ACF) technology involves conductive balls dispersed in an adhesive. For example, Au-coated polymer balls or Ni-filled balls are dispersed in an epoxy adhesive. The surfaces being electrically coupled are then pressed together to the diameter of the balls. The adhesive is then cured, for example by heating. An electrical contact is made in those areas where the balls touch both surfaces. The anisotropic conductive adhesive 227 is not conductive in those areas where the balls are still dispersed in the cured adhesive. In FIG. 24, the anisotropic conductive adhesive 227 mechanically connects pad 215, the underside of lip 223 and the entire side of MID 205 to landing pad 208 and the side of substrate 206. However, an electrical connection is made only between those areas of contact pad 215 and landing pad 208 that were pressed together to within the diameter of the conductive balls.

Figure 25:
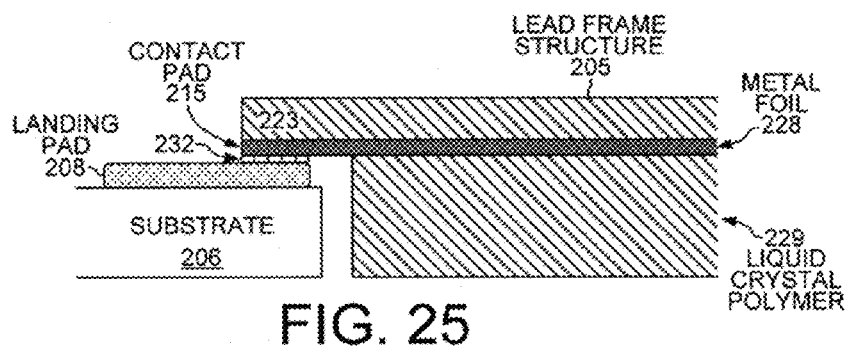
FIG. 25 shows a lead frame interconnect structure with a metal foil layer that functions both as a conductor of the interconnect structure and as a contact pad that bonds to a landing pad on the substrate.

FIG. 25 shows another implementation of how a conductor 228 on interconnect structure 205 is electrically coupled to landing pad 208 on substrate 206 using solder. Interconnect structure 205 of FIG. 25 is a lead frame instead of a molded interconnect device. A metal foil 228 is stamped in the form of the conductors, leads and "gull wings" required for the package of the discrete light emitter or array product.

Lead frame structure 205 is then made by injection molding a liquid crystal polymer (LCP) 229 around a stamped metal foil 228. The metal foil functions both as the conductor 228 as well as the contact pad 215. The end of the metal foil under lip 223 can be stamped in the shape of a contact pad with a shape corresponding to the shape of landing pad 208 in order to facilitate self-alignment during a solder reflow process.

Figure 26:
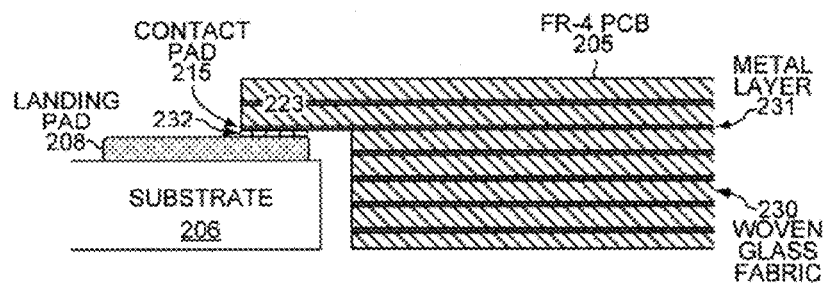
FIG. 26 shows an interconnect structure made from a printed circuit board with a metal layer that functions both as a conductor of the interconnect structure and as a contact pad that bonds to a landing pad on the substrate.

FIG. 26 shows another implementation of a conductor 231 in interconnect structure 205 that is electrically coupled to landing pad 208 on substrate 206 using solder. Interconnect structure 205 of FIG. 24 is a printed circuit board (PCB). For example, interconnect structure 205 is an FR-4 printed circuit board made of woven fiberglass fabric 230 with an epoxy resin binder. FR-4 PCB 205 has several metal layers. One of the metal layers 231 functions both as the conductor and as the contact pad 215. The end of metal layer 231 under lip 223 can be formed in a shape corresponding to the shape of landing pad 208 in order to facilitate self-alignment during a solder reflow process.

Figure 27:
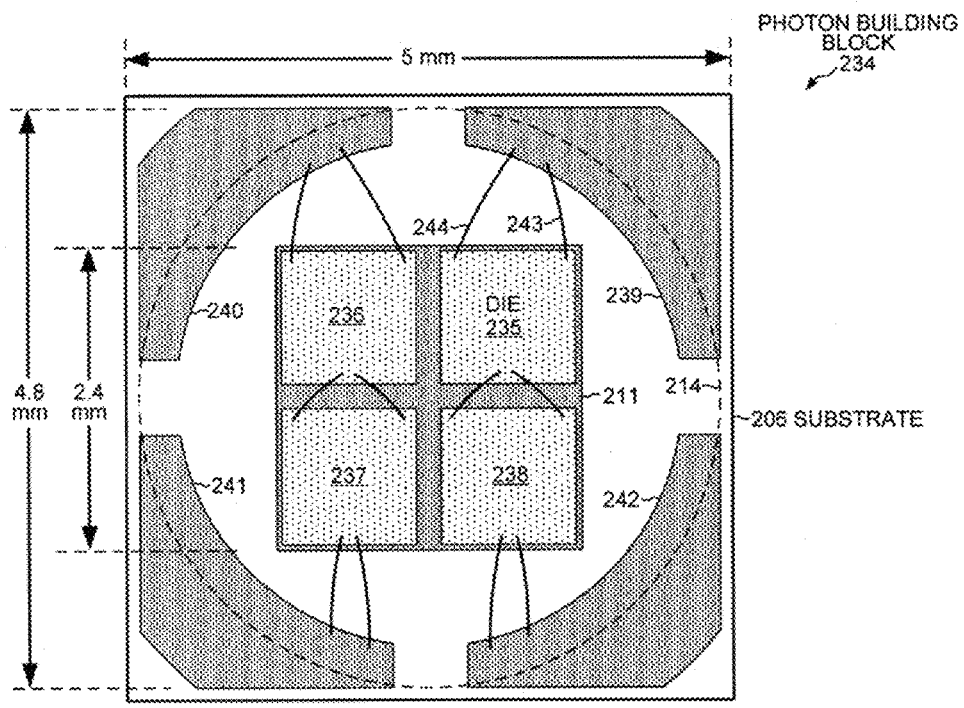
FIG. 27 is a top view of a photon building block that includes four LED dice surrounded by four landing pads.

FIG. 27 is a top view of a photon building block 234 that includes four LED dice 235-238. The same material is used to make the four landing pads 239-242 as well as the first TIM layer 211 beneath the four LEDs. Second layer 212 of thermal interface material is deposited on first layer 211 beneath each LED die and is not visible in the view of FIG. 27. LED die 235 and 238 are electrically connected in series between landing pads 239 and 242. Two wire bonds connect each LED die to a landing pad and to another LED die. For example, wire bonds 243-244 connect LED die 235 to landing pad 239. The dashed circle indicates the extent to which silicone lens 214 encapsulates the components on substrate 206. Lens 214 extends to about the middle of the landing pads 239-242. The diameter of lens 214 is about twice as long as each side of the 2×2 array of LED dice so as to allow most of the emitted light to reach the surface of lens 214 within the critical angle required for the light to escape from the lens.

Photon building block 234 can be used to make both a discrete light emitter with a single photon building block as well as an array product with multiple photon building blocks. Interconnect structure 205 can easily be molded or configured to incorporate photon building block 234 into a plurality of different discrete light emitter products. The bolt holes through which bolts 222 attach interconnect structure 205 to heat sink 221 can easily be repositioned without changing the design of photon building block 234. And the conductors that are electrically coupled to the LED dice can easily be retraced using a laser to write the conductive paths over the surface of the molded interconnect device. Thus, a new emitter need not be tested and qualified each time a new light emitter product is made using photon building block 234.

Figure 28:
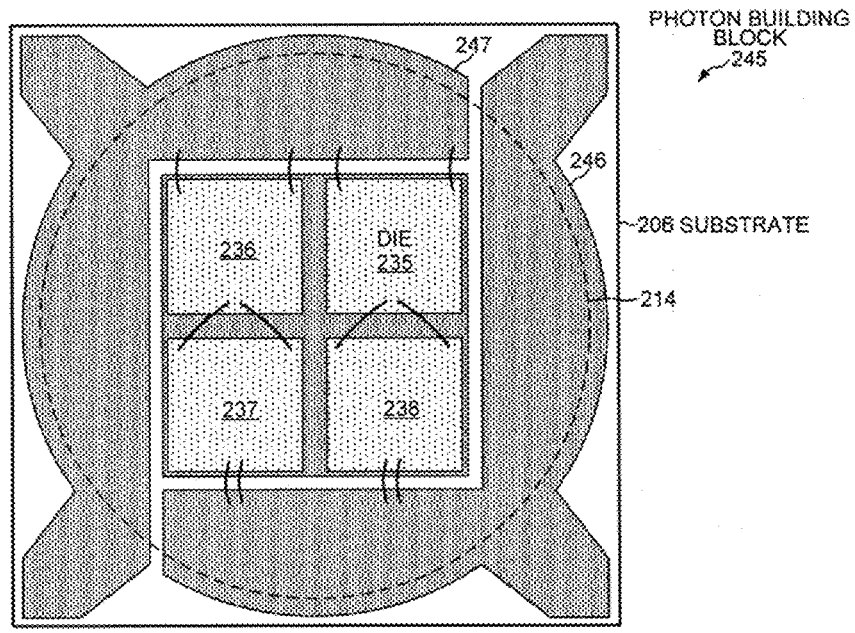
FIG. 28 is a top view of another implementation of a photon building block that includes four LED dice surrounded by two landing pads.

FIG. 28 is a top view of a photon building block 245 with only two landing pads 246-247 that surround the four LED dice 235-238. As with photon building block 234 of FIG. 17, the landing pads 246-247 and the first TIM layer 211 beneath the four LEDs are made from the same material, such as a Cu—Ni—Au alloy or a Cu—Ni—Ag alloy. The landing pads 246-247 have points that extend to the four corners of substrate 206. In a SAC reflow step, the solder alloy that extends farther toward the corners of substrate 206 than with landing pads 239-242 can more precisely align substrate 206 beneath the contact pads of the interconnect structure 205. The smaller surface area of landing pads 246-247 beneath the contact pads, however, results in a weaker mechanical connection between the landing pads and contact pads.

Figure 29A:
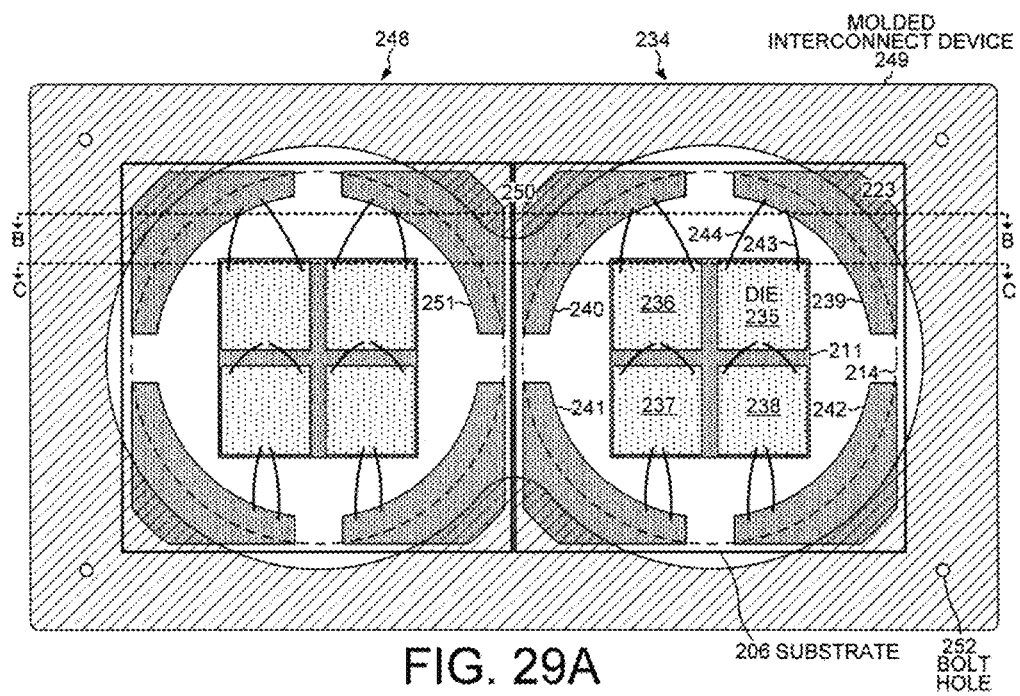
FIG. 29A is a top view of two photon building blocks in an interconnect structure built into an array product.

FIG. 29A is a top view of photon building block 234 of FIG. 17 built into an array product with another photon building block 248. A molded interconnect device 249 holds the photon building blocks 234 and 248 in place in a 1×2 array. The area of MID 249 is denoted by cross hatching. MID 249 has six lips that extend over the corners of photon building blocks 234 and 248 and hold those corners in place. For example, a lip 223 of MID 249 extends over the upper right corner of substrate 206, and a contact pad on the underside of lip 223 is electrically and mechanically connected to a portion of landing pad 239 using solder or an adhesive. MID 249 also has another lip 250 that extends over both the upper left corner of photon building block 234 and the upper right corner of photon building block 248. Separate contacts pads under lip 250 are bonded to landing pad 240 of photon building block 234 and to a landing pad 251 of photon building block 248. MID 249 has four holes 252 for the bolts 222 that attach the array product to heat sink 221.

Figure 29B:
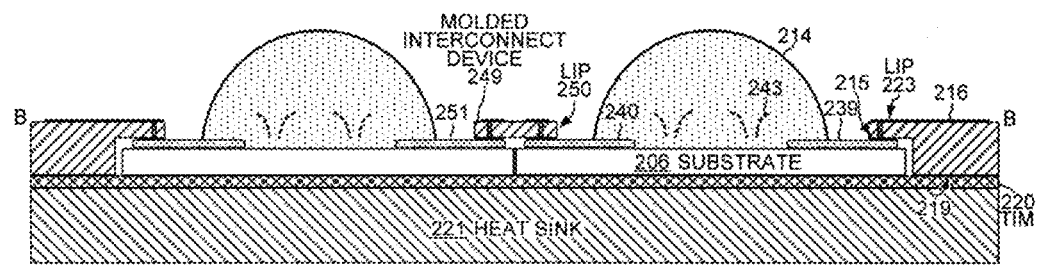
FIG. 29B is a cross-sectional view through line B-B of the array product shown in FIG. 29A.
Figure 29C:
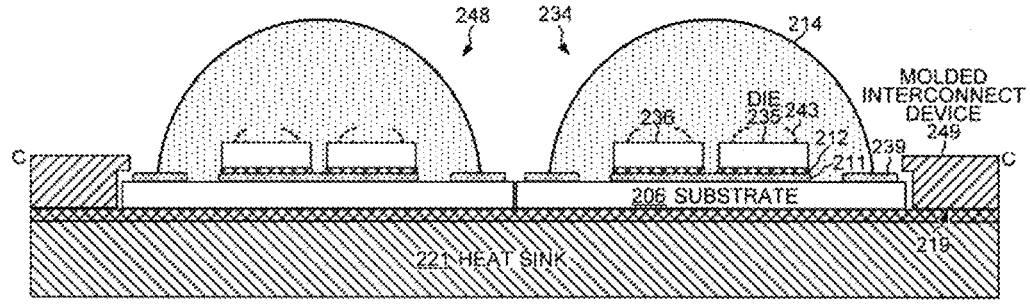
FIG. 29C is a cross-sectional view through line C-C of the array product shown in FIG. 29A.

FIG. 29B is a cross-sectional view through line B-B of the 1×2 array product shown in FIG. 29A. FIG. 29B shows how contact pad 215 on the underside of lip 223 is electrically and mechanically connected to a portion of landing pad 239. FIG. 29B also shows portions of the contact pads under lip 250 that bond to landing pads 240 and 251. FIG. 29C is a cross-sectional view through line C-C of the 1×2 array product shown in FIG. 29A. The contact pads of MID 249 are not visible in the cross section of FIG. 29C.

Figure 30A:
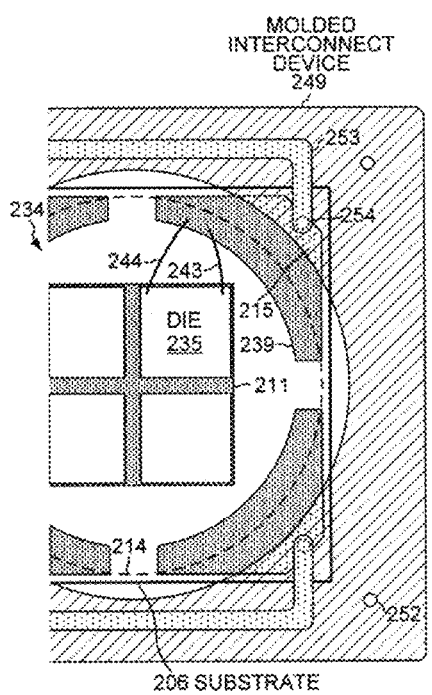
FIG. 30A is a more detailed view of the connection between the landing pad of the substrate and the contact pad of the interconnect structure shown in FIG. 29A.
Figure 30B:
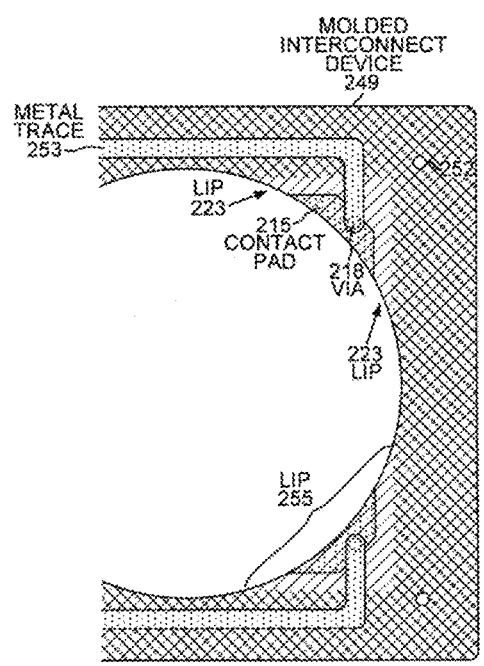
FIG. 30B shows the contact pad FIG. 30A without the landing pad below.

FIGS. 30A-B illustrate the connection between landing pad 239 and contact pad 215 of FIG. 29A in more detail. Contact pad 215 has the same outline shape as a corner of the landing pad 239 below. A solder reflow process can be performed with the contact pads on top aligning to solder on the landing pads below, or the process can be inverted. The structure of FIG. 29B can be inverted such that the landing pads are on top of the contact pad and align to molten solder on the contact pads.

In a SAC reflow process when the SAC solder on landing pad 239 is melted, the solder wets the metal of contact pad 215. Then the surface tension of the molten SAC solder pulls contact pad 215 over the portion of landing pad 239 that has the same shape. The four landing pads at the corners of substrate 206 are thereby each pulled towards the contact pads of the same shape and align photon building block 234 within the frame of MID 249. When the SAC solder cools and solidifies, bonds are formed between the landing pads and the contact pads. The solder bonds between the landing pads and the contact pads hold the photon building blocks in place such that the bottom surfaces of the substrates are substantially coplanar with bottom surface 219 of MID 249 even when the array product is not attached to a heat sink. The array product can be shipped unattached to any submount, such as a heat sink. The bonds between the landing pads and the contact pads are sufficiently strong to maintain the mechanical integrity of the array product despite the vibrations and bumping usually encountered in shipping.

FIG. 30A also shows a conductor 253 on the top surface of MID 249 that is electrically coupled to first LED die 235. Conductor 253 is a metal trace formed by plating a path oblated by a laser. Metal trace 253 is electrically coupled to LED die 235 through a solid metal via 254, contact pad 215, solder 232 or an ACF adhesive, landing pad 239 and wire bonds 243-244. The dashed line designates the extent of silicone lens 214.

FIG. 30B shows contact pad 215 of FIG. 30A without the landing pad 239 of photon building block 234 below. The triangular cross-hatched area around contact pad 215 is lip 223 that extends over the upper right corner of substrate 206 of photon building block 234. FIG. 30B also shows a lip 255 of MID 249 that extends over the lower right corner of substrate 206. The area of MID 249 shown with a latticed pattern is filled with liquid crystal polymer from top surface 217 to bottom surface 219 of the interconnect structure.

Figure 31:
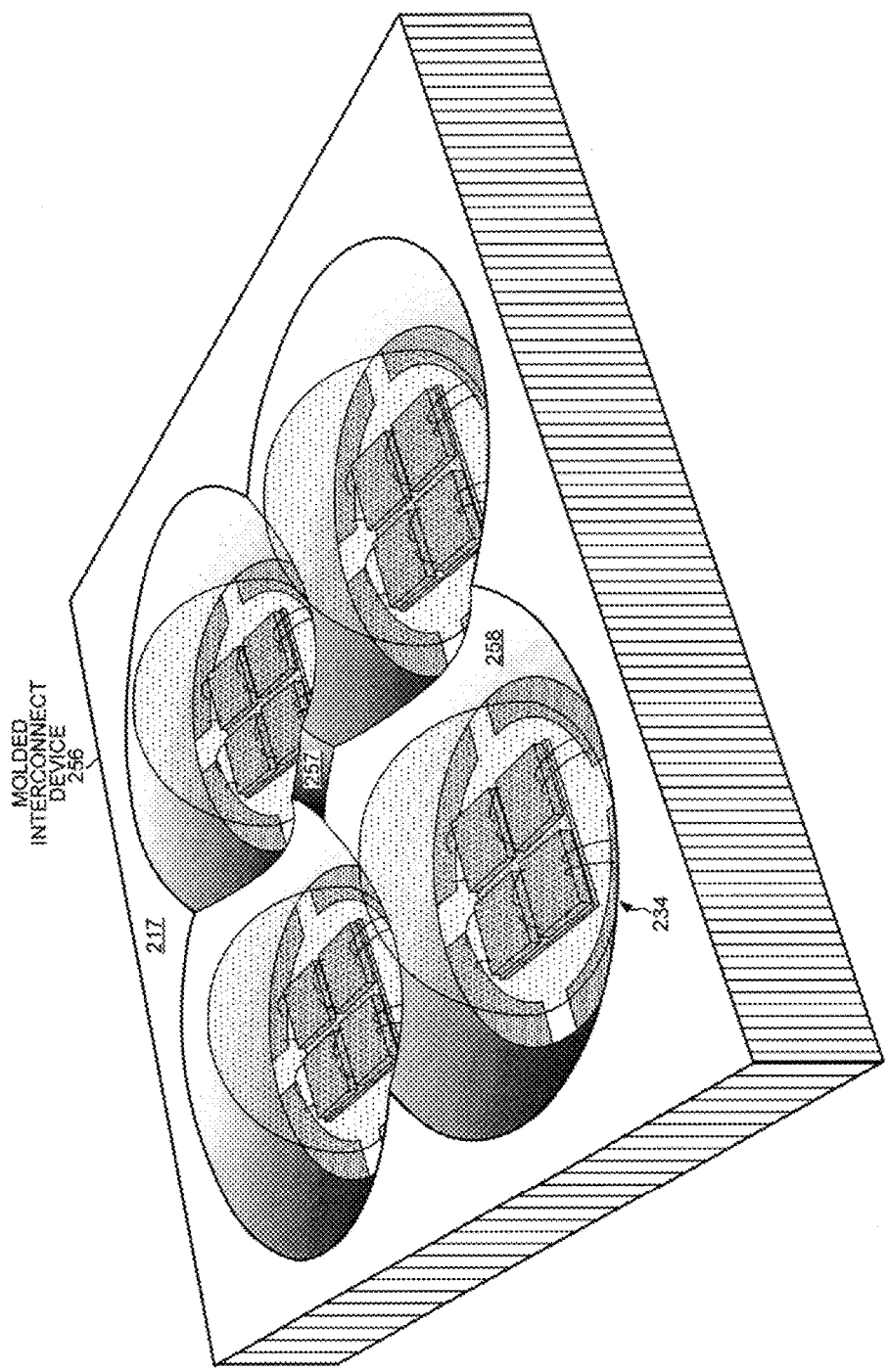
FIG. 31 is a perspective view of four photon building blocks in an interconnect structure built into an array product.

FIG. 31 is a perspective view of photon building block 234 of FIG. 17 built into an array product with three other photon building blocks. A molded interconnect device 256 holds the photon building blocks in place in a 2×2 array. The interconnect structure 256 includes bridges between the photon building blocks that support a center island 257 beneath which the contact pads attach to the inner landing pads of the four photon building blocks. As MID 256 is formed in a molding process, non-planar surfaces are easily made. MID 256 has curved walls 258 around the photon building blocks that are coated with a reflective material, such as a metal film. The curved walls can be shaped to impart a parabolic reflection to the light emitted from the photon building blocks. The conductors that connect to the contact pads (not shown in FIG. 31) are drawn with a laser over the curved walls and then plated in a metallization bath. The conductors are connected to the contact pads with through hole vias or hollow vias as shown in FIGS. 21-22. Although FIG. 31 depicts a 2×2 array of photon building blocks supported by an interconnect structure, arrays with other dimensions can also be made in a similar manner using bridges between the photon building blocks.

Figure 32:
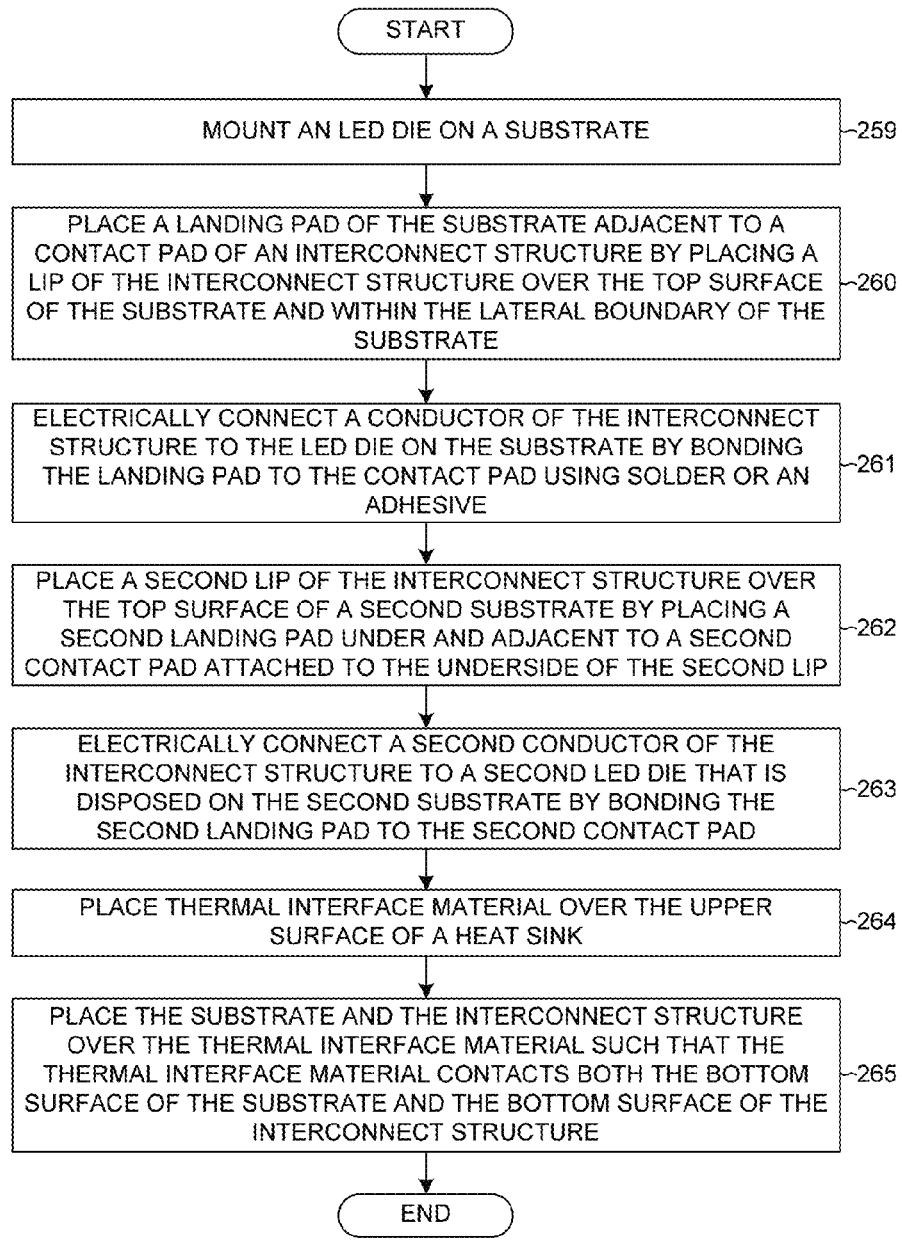
FIG. 32 is a flowchart of steps for making both a discrete light emitter and an array product using the same standardized photon building blocks.

FIG. 32 is a flowchart illustrating steps 259-265 of a method of making both a discrete light emitter and an array product using the same standardized photon building blocks that have one or more LED chips mounted on a carrier substrate. The method can be used to connect photon building blocks in any configuration, such as in parallel or in series, to achieve the desired light output and power consumption of the resulting array product. The method easily connects the photon building blocks electrically, mechanically and thermally to other structures of the ultimate lighting product. The electrical connections to the power source can easily be configured. The orientation of the photon building blocks can easily be aligned with reflectors and lenses of the lighting product. The position of the bolts that mechanically connect the interconnect structure to the lighting product can easily be reconfigured without changing the photon building blocks. And the interconnect structure can easily be configured to thermally connect with a multitude of heat sinks.

In a first step 259, light emitting diode die 235 is mounted on carrier substrate 206 of first photon building block 234. Substrate 206 has no electrical conductors passing from its top surface 209 to its bottom surface 210. LED die 235 is attached to substrate 206 using first TIM layer 211 and second TIM layer 212. Landing pad 239 on top surface 209 of substrate 206 is made from the same material and in the same process as first TIM layer 211.

In step 260, landing pad 239 is placed under and adjacent to contact pad 215, which is disposed on the underside of lip 223 of interconnect structure 249. In so doing, lip 223 is placed over top surface 209 of substrate 206 and within the lateral boundary of substrate 206. At the conclusion of step 260, the photon building blocks are placed within interconnect structure 249.

In step 261, conductor 216 of interconnect structure 249 is electrically connecting to LED die 235 by bonding landing pad 239 to contact pad 215. The pads are bonded by either solder or an ACF adhesive. When using solder, landing pad 239 is bonded to contact pad 215 by heating a metal alloy on landing pad 239 such that the landing pad aligns with the metal contact pad. When using anisotropic conductive adhesive film (ACF) technology to bond the pads, the photon building blocks are accurately positioned within interconnect structure 249, and landing pad 239 is bonded to contact pad 215 when the ACF adhesive is cured by heating. After landing pad 239 is aligned with and bonded to contact pad 215, bottom surface 210 of substrate 206 is substantially coplanar with bottom surface 219 of interconnect structure 249.

In step 262, when the method of FIG. 32 is used to make an array product, second lip 250 of interconnect structure 249 is placed over the top surface of a second substrate, and a second landing pad 251 is placed under and adjacent to a second contact pad attached to the underside of lip 250. The second substrate is part of second photon building block 248 and has dimensions that are substantially identical to those of the first substrate 206. A second LED die disposed on the second substrate has dimensions that are substantially identical to those of LED die 235 on first substrate 206.

In step 263, when the method of FIG. 32 is used to make an array product, a second conductor of interconnect structure 249 is electrically connected to the second LED die that is disposed on the second substrate by bonding second landing pad 251 to the second contact pad attached to the underside of lip 250. For example, landing pad 251 can be bonded to the second contact pad using a SAC reflow process or by using an anisotropic conductive adhesive. After second lip 250 is placed over the top surface of the second substrate and landing pad 251 is bonded to the contact pad on the underside of lip 250, the bottom surface of the second substrate is substantially coplanar to bottom surface 219 of interconnect structure 249.

In step 264, thermal interface material 220 is placed over the upper surface of heat sink 221. The upper surface of heat sink 221 need not be planar except under substrate 206 and the area directly around the substrate. For example, the upper surface of heat sink 221 can be the mostly curved surface of a luminaire. Likewise, bottom surface 210 of substrate 206 and bottom surface 219 of interconnect structure 249 need not be coplanar except in the immediate vicinity of substrate 206.

In step 265, substrate 206 and interconnect structure 249 are placed over thermal interface material 220 such that thermal interface material 220 contacts both bottom surface 210 of substrate 206 and bottom surface 219 of interconnect structure 249. When the method of FIG. 32 is used to make an array product, the second substrate of photon building block 248 is also placed over thermal interface material 220 such that thermal interface material 220 contacts the bottom surface of the second substrate. The method of FIG. 32 can also be used to make an array product with more than two photon building blocks, such as the array product shown in FIG. 31.

Figure 33A:
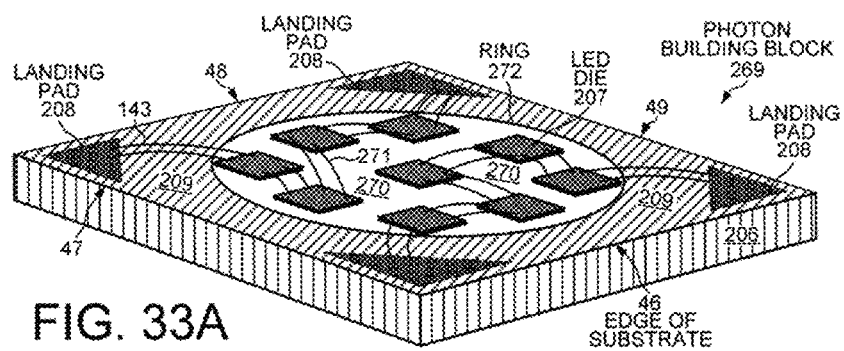
FIG. 33A is a perspective view of another embodiment of a photon building block containing a plurality of LED dies.
Figure 33B:
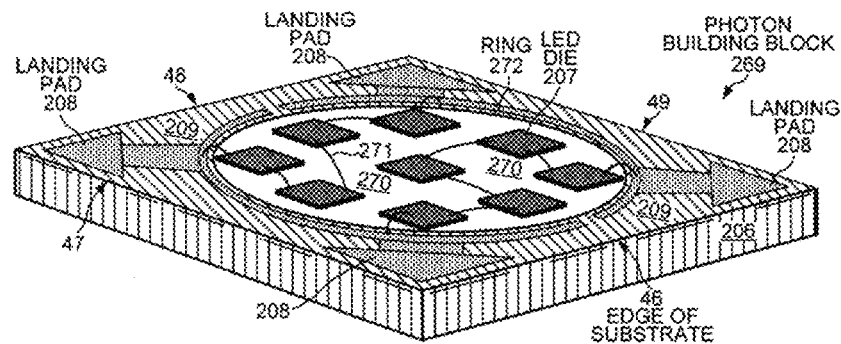
FIG. 33B shows another embodiment of photon building block of FIG. 33A in which the LED dies are not connected by wire bonds all the way to the landing pads.
Figure 33C:
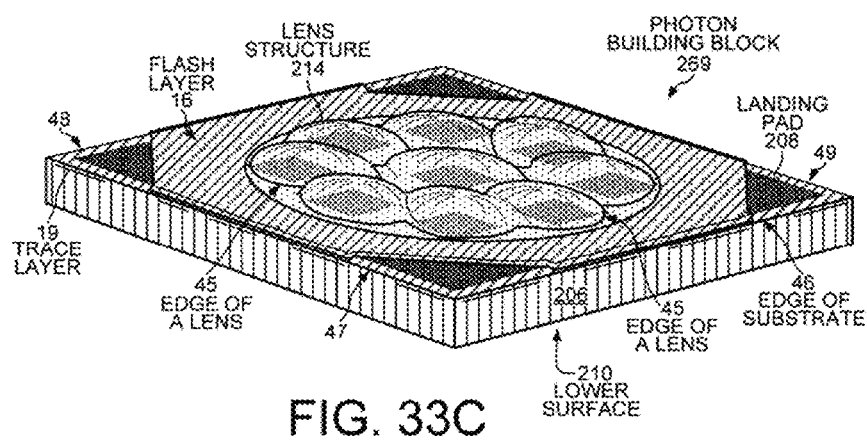
FIG. 33C is a perspective view of the photon building block of FIG. 33B that includes a micro-lens centered over each LED die.

FIGS. 33A-C are perspective views of embodiments of a photon building block 269 similar to photon building block 204 of FIG. 20. FIGS. 33A-B show photon building block 269 without a lens in order better to show the LED dies. FIG. 33C shows the photon building block 269 with a silicone lens structure molded over the LED dies.

Photon building block 269 contains nine LED dies as opposed to the single LED die of photon building block 204. The LED dies, including labeled LED die 207, are mounted on substrate 206 using silver epoxy. Landing pads 208 are disposed on the upper surface 209 of substrate 206. No electrical conductor passes from the upper surface 209 of substrate 206 to the lower surface 210 of substrate 206. The LED dies are electrically coupled to power solely through the landing pads 208. In the embodiment of FIG. 33A, the LED dies are electrically connected through wire bonds 271 to the landing pads 208. The landing pads 208 are traces made of a Cu—Ni—Au alloy or a Cu—Ni—Ag alloy. In another embodiment, the landing pads 208 are traces of silver-filled epoxy. A layer 270 of a highly reflective (HR) material is disposed within a ring 272 between and around the LED dies and the wire bonds 271 as illustrated in FIG. 33A. In the example of FIG. 33A, layer 270 of HR material contacts the retaining ring 272 and also contacts the sides of the LED dies.

FIG. 33B shows another embodiment of photon building block 269 in which the LED dies are not connected through wire bonds 271 all the way to the landing pads 208. Instead, short bonds wires from the LED dies connect to traces on near upper surface 209 that in turn are electrically connected to the landing pads 208. Groups of LED dies are also connected in series to each other by bond wires 271.

FIG. 33C shows a lens structure 214 that has been molded over the nine LED dies. The lens structure 214 is molded over the LED dies before the photon building blocks are segmented from the metal core printed circuit board (MCPCB) that forms substrate 206. While the photon building blocks are still part of a single MCPCB as shown in FIG. 2, a thin conformal layer of a wavelength conversion material, such as a phosphor, is deposited over the LED dies. For example, a conformal layer of silicone containing yellow phosphor 273 is formed over the LED dies. Then compression molding is used to mold a clear resin encapsulant, such as silicone, over the LED dies and the wire bonds 271 such that a lens is formed over each LED die 207. In the embodiment of FIG. 33C, a separate micro-lens is formed over the center of each of the nine LED dies. Most of the upper surface 209 of substrate 206 can be occupied by the LED dies and the associated lens structure because the mechanical and electrical connections to a heat sink or luminaire have been removed from the photon building block and transferred to an interconnect structure that supports the photon building block. In the embodiment of FIG. 33C, there are less than three millimeters on the upper surface 209 of substrate 206 between each edge of substrate 206 and a lens that covers one of the LED dies.

Figure 34A:
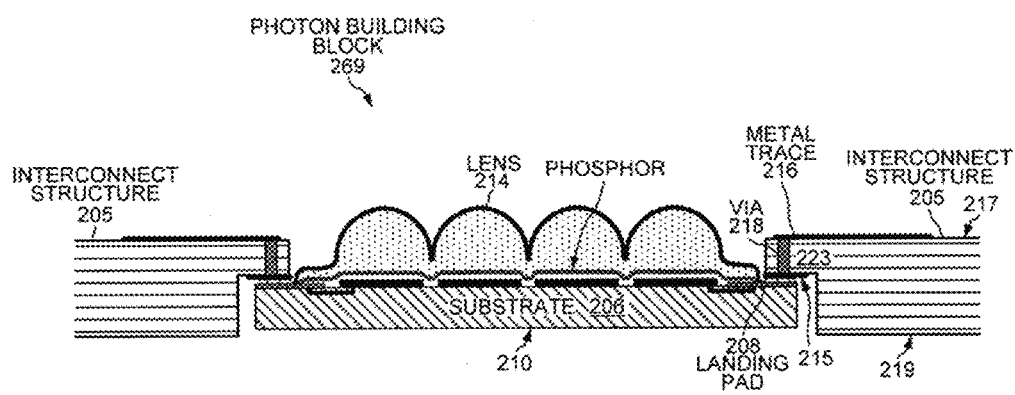
FIG. 34A is a cross-sectional view of the photon building block of FIG. 33B being supported by an interconnect structure solely through landing pads on the upper surface of the substrate.
Figure 34B:
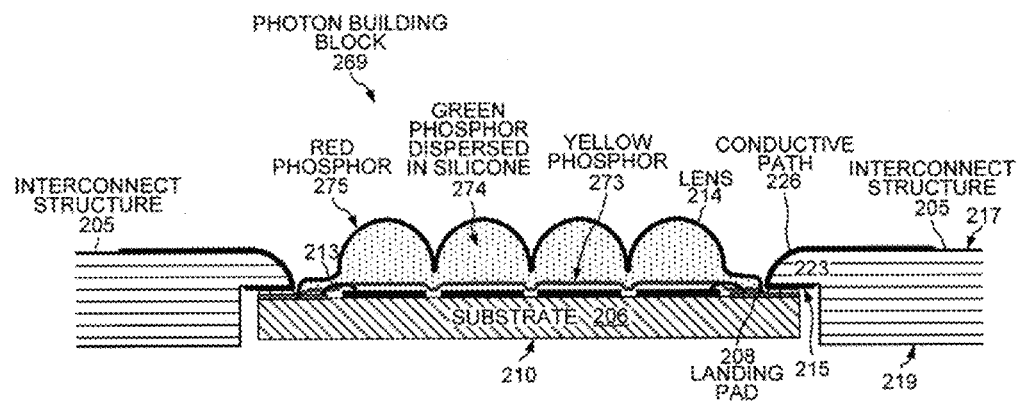
FIG. 34B is a cross-sectional view of the photon building block of FIG. 33A being supported solely through landing pads on the upper surface of the substrate.

FIGS. 34A-B are cross-sectional views of photon building block 269 being supported by an interconnect structure 205 solely through the landing pads 208 on the upper surface 209 of substrate 206. The landing pads 208 are both electrically and mechanically connected to contact pads 215 disposed on the underside of a lip of the interconnect structure 205. In one implementation, the landing pads 208 are attached to contact pads 215 by a solder paste. An example of a solder paste is a SAC alloy, such as SAC 305 (96.5% Sn, 3.0% Ag, 0.5% Cu). In a SAC reflow process that occurs in an upside down orientation to that shown in FIGS. 34A-B, the landing pads 208 on substrate 206 self-align to the contact pads 215 on interconnect structure 205. In a packaged LED array consisting of interconnect structure 205 and photon building block 269, substrate 206 is electrically and mechanically connected to interconnect structure 205 only through the landing pads 208 and the contact pads 215. Packaged LED arrays in this condition are shipped from the LED manufacturer to the luminaire manufacturer. In another implementation, the landing pads 208 are attached to contact pads 215 by an adhesive. An example of an adhesive is an anisotropic conductive adhesive associated with anisotropic conductive film (ACF) technology.

In the embodiment of FIG. 34A, the conductors over the top surface 217 of interconnect structure 205 are metal traces 216. The contact pads 215 that attach to the landing pads 208 are also metal traces. Metallization baths plate the traces 216 and contacts pad 215 over the interconnect structure 205. A through-hole via 218 electrically couples metal trace 216 to contact pad 215.

In the embodiment of FIG. 34B, the contact pads 215 that attach to the landing pads 208 are written onto the surface of interconnect structure 205 with a laser. In addition, the conductive paths on the surface of the interconnect structure 205 are formed using the same laser process. The molded interconnect structure 205 is formed from a thermoplastic that contains a metal additive. A conductive path 226 is formed by the metal additive where the laser beam oblates the thermoplastic on the surface of the interconnect structure 205. The metal particles in the conductive path also form nuclei for optional subsequent metallization of the conductive path. In the embodiment of FIG. 34B, the laser has oblated a continuous conductive path 226 across top surface 217, around the lip 223 to the underside of the lip to form contact pad 215. The conductive path is widened on top surface 217 to form contact pads to which power and ground wires can be attached. In this manner, no vias or internal metal layers are required in the molded interconnect structure 205 of FIG. 34B.

FIG. 34B shows an implementation in which a conformal layer of silicone containing yellow phosphor 273 is formed over the LED dies. Green phosphor 274 is dispersed in the silicone that forms lenses over the LED dies. And a conformal layer of silicone containing red phosphor 275 is deposited over the lenses.

Figure 35A:
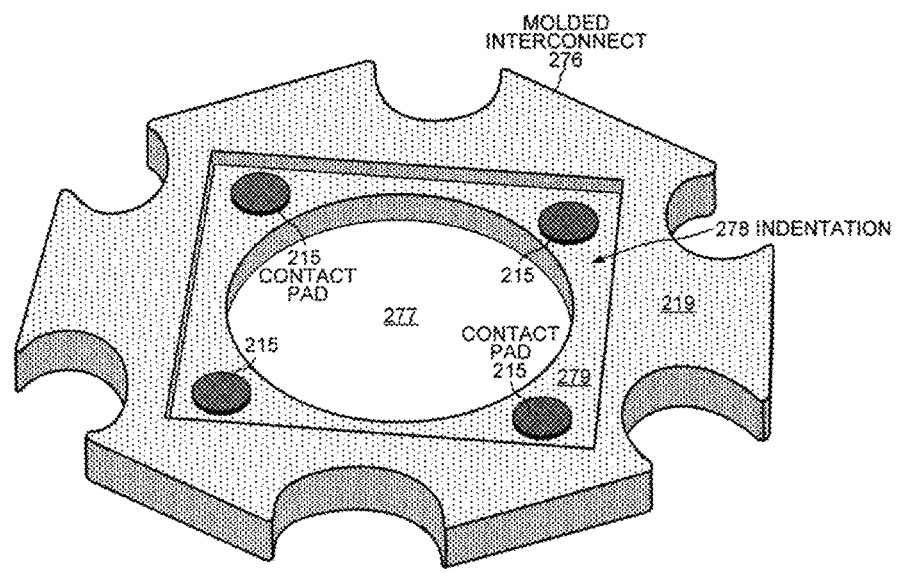
FIG. 35A is perspective view of the bottom surface of an hexagonal star-shaped molded interconnect structure.
Figure 35B:
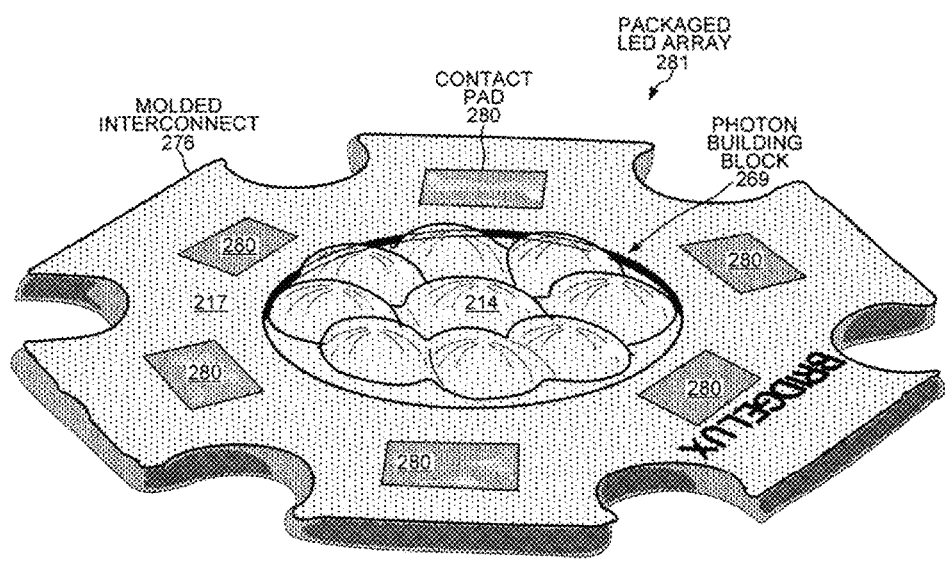
FIG. 35B is a top perspective view of the molded interconnect structure of FIG. 35A supporting the photon building block of FIG. 33C.

FIGS. 35A-B are perspective views of the bottom and top sides, respectively, of an interconnect structure 276 that supports photon building block 269 of FIG. 33C. Molded interconnect structure 276 has a hexagonal star shape and supports photon building block 269 by the top-side landing pads 208. There is an opening 277 in the middle of molded interconnect 276 from which the lenses of photon building block 269 protrude. FIG. 35A shows the bottom surface 219 of molded interconnect structure 276 into which an indentation 278 has been formed. Indentation 278 has the shape of substrate 206 of photon building block 269. In the orientation of molded interconnect 276 shown in FIG. 35A, photon building block 269 is flipped over and inserted into indentation 278 such that the top-side landing pads 208 attach to the contact pads 215 that protrude out from the inner surface 279 of indentation 278. Each contact pad 215 is the bottom of a cylindrical metal via that extends from the inner surface 279 of indentation 278 to the top surface 217 of interconnect structure 276. The top of each cylindrical metal via is coupled to a rectangular contact pad 280 to which power and ground wires can be attached. Two of the six contact pads 280 on top surface 217 of interconnect structure 276 form redundant connections to a contact pad 215.

FIG. 35B shows a packaged LED array 281 made up of photon building block 269 being supported from its top side by hexagonal star-shaped molded interconnect structure 276. FIG. 35B shows the top surface 217 of molded interconnect structure 276 and the lens structure 214 of photon building block 269 protruding through opening 277. In the orientation of molded interconnect 276 shown in FIG. 35B, photon building block 269 is inserted up and into indentation 278 such that top surface 209 of substrate 206 is placed under inner surface 279 of indentation 278. In so doing, a landing pad 208 is placed under and adjacent to a contact pad 215. The outer edges of flash layer 16 of silicone are sandwiched between top surface 209 and inner surface 279. The contact pads 215 protrude out from the inner surface 279 of indentation 278 to bridge the width of the sandwiched flash layer 16 in order to make contact with the landing pads 208. The landing pads 208 are then attached to the contact pads 215 using solder or a conductive adhesive. In an embodiment where flash layer 16 is about fifty microns thick, the sum of the protruding height of contact pads 215 and the solder or adhesive that connects contact pads 215 to landing pads 208 must also be fifty microns. Alternatively, the rim of inner surface 279 around opening 277 can be recessed to accommodate the thickness of flash layer 16. Photon building block 269 is then aligned inside indentation 278 in a solder reflow step. In the inverted orientation of FIG. 35A, molten solder on each landing pad 208 aligns over the contact pad 215 below.

Figure 36A:
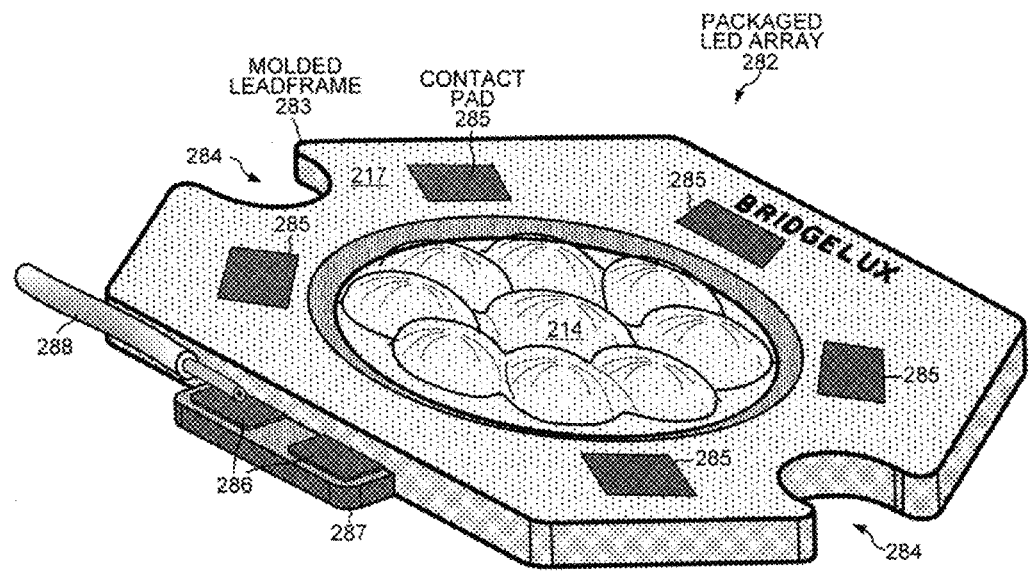
FIG. 36A is a top perspective view of a packaged LED array in which a photon building block is supported by a hexagonal molded leadframe structure.

FIG. 36A shows a packaged LED array 282 in which photon building block 269 is supported by a hexagonal molded leadframe structure 283 that has only two of the six screw indentations 284 of the star-shaped interconnect structure 276. Metal vias connect contact pads 285 on top surface 217 of molded leadframe structure 283 to contact pads 215 in the indentation 278 on the back side of the structure. Molded leadframe structure 283 also includes side pads 286 that are disposed at a lower level than top surface 217. The side pads 286 are disposed on a molded shelf 287 that extends from a longer side of the hexagonal leadframe structure 283. Power and ground wires 288 may be soldered to the side pads 286 such that the thickness of the insulated wires fits between the planes of the upper surface 217 and bottom surface 219 of molded leadframe structure 283. The side pads 286 are electrically coupled to the contact pads 285 by conductive layers within the molded leadframe structure 283.

Figure 36B:
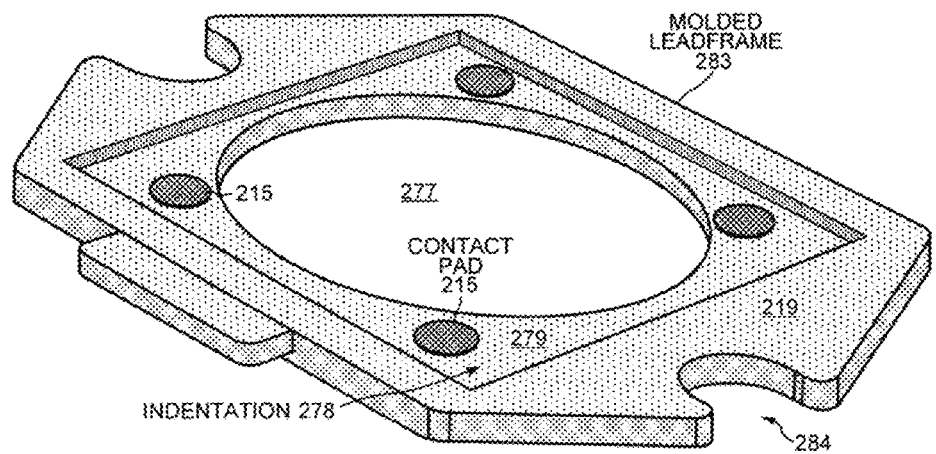
FIG. 36B is a bottom perspective view of the indentation on the bottom side of the molded leadframe structure of FIG. 36A into which a photon building block fits.

FIG. 36B shows the indentation 278 on the bottom side of molded leadframe structure 283 into which photon building block 269 fits. The contact pads 215 are elevated somewhat from the inner surface 279 of indentation 278 and are coupled to the contact pads 285 on top surface 217 of molded leadframe structure 283.

Figure 37A:
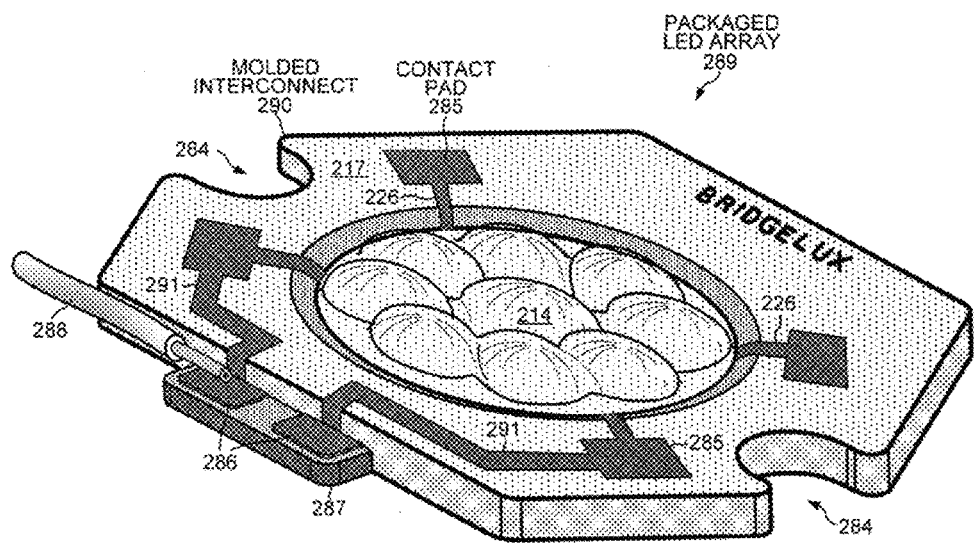
FIG. 37A is a perspective view of a hexagonal molded interconnect structure with surface conductive paths supporting the photon building block of FIG. 33C.

FIG. 37A shows a packaged LED array 289 in which photon building block 269 is supported by a hexagonal molded interconnect structure 290 that has only two of the six screw indentations 284 of the star-shaped interconnect structure 276. Interconnect structure 290 does not have the cylindrical metal vias of molded leadframe structure 283. Instead, the contact pads 215 in the indentation 278 and the contact pads 285 on top surface 217 are formed by writing conductive areas using a laser as illustrated in FIG. 34B. Each contact pad 285 on top surface 217 is electrically coupled to a contact pad 215 on the bottom side of molded interconnect 290 by a conductive path 226 that extends across top surface 217, around the rounded edge of opening 277 and then on inner surface 279 to a contact pad 215. Interconnect structure 290 also includes the side pads 286 on molded shelf 287. The side pads 286 are electrically coupled to the contact pads 285 by conductive paths 291 that are written using a laser across upper surface 217 and a side of the interconnect structure 290. The laser is also used to write the side pads 286 onto molded shelf 287. Interconnect structure 290 has no vias or internal metal layers.

Figure 37B:
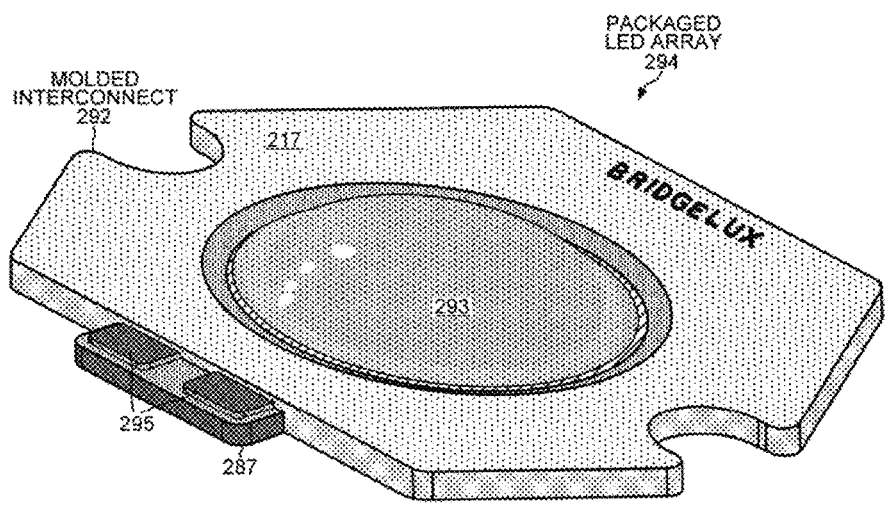
FIG. 37B is a perspective view of an hexagonal molded interconnect structure with inner lead frame conductors.
Figure 37C:
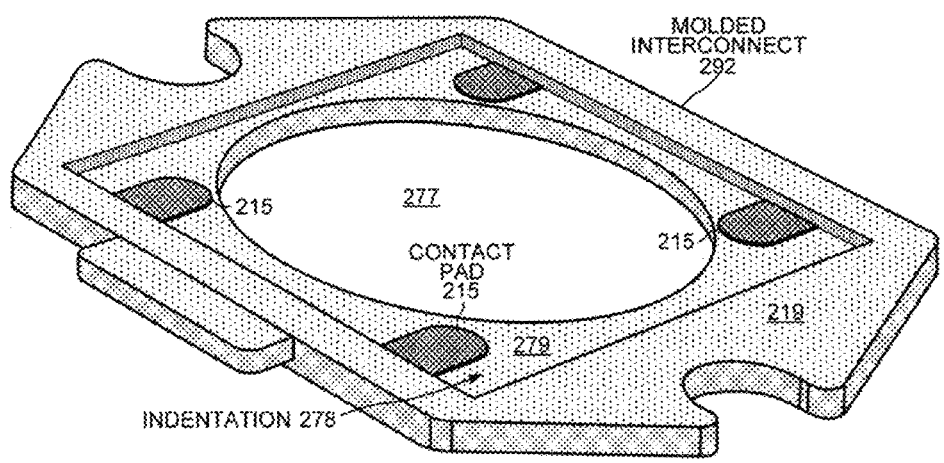
FIG. 37C is a perspective view of the bottom side of the molded interconnect structure of FIG. 37B showing contact pads formed from the leadframe conductors.

FIGS. 37B-C are perspective views of the top and bottom sides, respectively, of an hexagonal molded interconnect structure 292 that has been molded around lead frame conductors. FIG. 37B shows interconnect structure 292 supporting a photon building block 293 with a single lens that covers an array of LED dies. Together, molded interconnect 292 and photon building block 293 comprise a packaged LED array 294. Unlike interconnect structure 290 of FIG. 37A, interconnect structure 292 has internal metal conductors formed from a metal lead frame around which plastic has been molded. The side pads 295 on molded shelf 287 are part of the lead frame.

Figure 38:
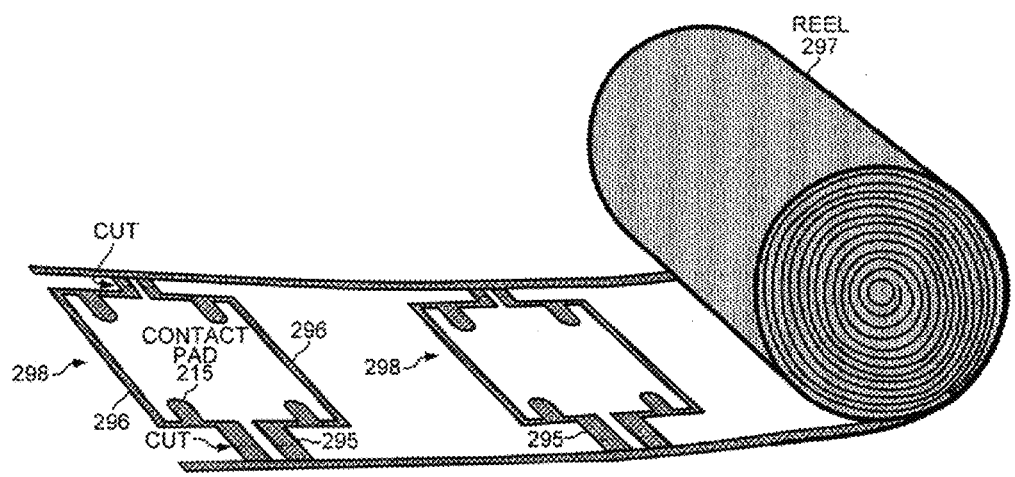
FIG. 38 is a perspective view of a lead frame reel with templates of conductors such as those in the molded interconnect structure of FIG. 37C.

FIG. 37C shows the indentation 278 on the bottom side of interconnect structure 292 into which photon building block 293 fits. The contact pads 215 are elevated somewhat from the inner surface 279 of indentation 278 and are part of a lead frame layer of conductors. Two contact pads 215 and one side pad 295 are part of the same lead frame conductor 296, as shown in FIG. 38. The lead frame is made of a thin sheet of metal from which the lead frame conductors are stamped. For example, a 0.1 mm sheet of a copper-nickel-palladium alloy can be used to make the lead frame. The lead frame is rolled onto a reel 297 and then unrolled as individual interconnect structures are molded around each template 298 of conductors. After individual interconnect structures are formed, the connection from the lead frame reel to the side pads 295 is cut. The photon building blocks are then inserted into the indentations in a reel-to-reel process before a solder reflow step aligns the landing pads of the photon building blocks to the contact pads of the interconnect structures.

Figure 39:
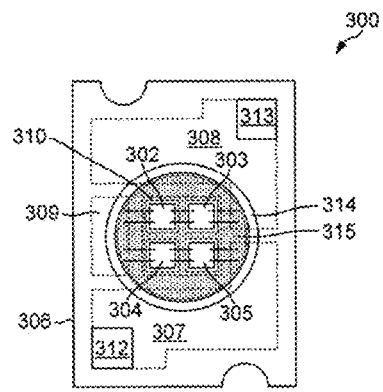
FIG. 39 (prior art) is top-down diagram of one type of conventional LED assembly.

There are many different types of LED assemblies. FIG. 39 (prior art) is a top-down diagram of one such LED assembly 300. LED assembly 300 includes four laterally-contacted LED dices 302-305 that are mounted on a metal core substrate 306. Substrate 306 in this case is a metal core printed circuit board (MCPCB). Areas 307-310 illustrated in dashed lines represent portions of a metal layer that is disposed underneath a solder mask layer 311 (see FIG. 40). Reference numeral 312 identifies a portion of metal portion 307 that is exposed through a first opening in the solder mask layer 311. Similarly, reference numeral 313 identifies a portion of metal portion 308 that is exposed through a second opening in solder mask layer 311. These exposed portions 312 and 313 serve as bond pads. Ring structure 314 is a retaining ring of silicone. An amount of a material often referred to as phosphor 315 is disposed within the ring structure 314 over the LED dice. This phosphor actually comprises silicone and particles of phosphor that are embedded in the silicone.

Figure 40:
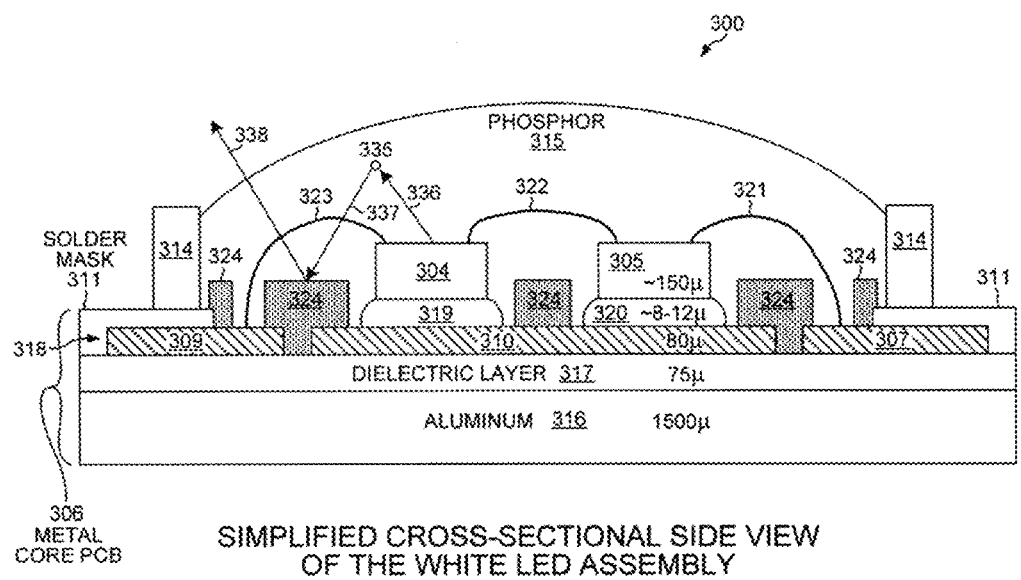
FIG. 40 (prior art) is a simplified cross-sectional side view of the LED assembly of FIG. 39.

FIG. 40 (prior art) is a simplified cross-sectional diagram of LED assembly 300 of FIG. 39. MCPCB 306 includes an aluminum layer 316, a global dielectric layer 317, a layer 318 of metallization of which metal portions 307-310 are parts, and solder mask layer 311. Layer 318 of metal may involve multiple sublayers of metal including an upper layer of a very reflective metal such as silver. Metal portion 310 is a square pad of metal upon which the LED dice 302-305 are mounted. The LED dice 302-305 are fixed to pad 310 by associated amounts of silver epoxy. Amount 319 of silver epoxy is shown fixing LED die 304 to pad 310. Amount 320 of silver epoxy is shown fixing LED die 305 of pad 310. Reference numerals 321-323 identify wire bonds.

A layer 324 of a highly reflective (HR) material is disposed within ring 314 between and around the dice 302-305 and wire bonds 321-323 as illustrated. The diagram is simplified in that the regions of the HR material have smooth and rounded edges. Some of the light emitted by LED dice 302-305 may be absorbed by phosphor particles in phosphor 315. These particles may then fluoresce and re-emit light such that this light is directed downward, rather than upward as is desired. Reference numeral 335 identifies one such particle of phosphor. A light ray 336 is emitted from the top of LED die 304 and travels up and is absorbed by particle 335. A second light ray 337 is then emitted from particle 335 and this second light ray travels back downward as shown. HR material 324 is provided so that this light ray will be reflected so that it can pass upward and out of the assembly as light ray 338. Particle 335 is but one such particle. There are numerous particles dispersed throughout the silicone material of phosphor 315. Light emitted from the LED dice 302-305 can be emitted in various different directions including out of the sides of the LED dice. Similarly, a light ray emitted from a phosphor particle can travel away from the particle any direction. The illustration of particle 335, of the direction of light emission from particle 335, and of the associated light rays 336, 337 and 338 in FIG. 40 are only representative of one such particle and its associated light rays. An example of an HR material is a silicone material that is commercially available from ShinEtsu Chemical Co. Ltd. of Tokyo, Japan.

Figure 41:
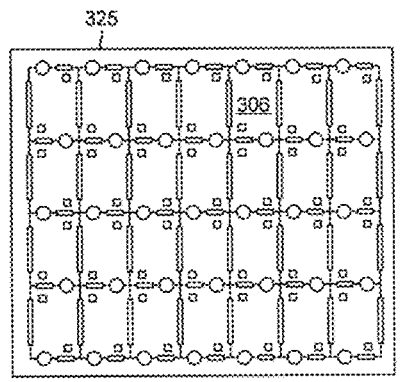
FIG. 41 (prior art) is a top-down diagram of a panel of metal core printed circuit boards (MCPCBs).
Figure 42:
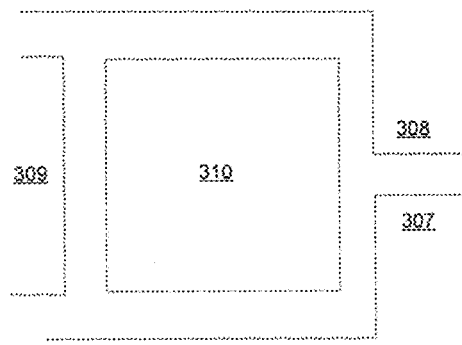
FIG. 42 (prior art) is a top-down diagram of the die placement area of an MCPCB of FIG. 42 before die placement.
Figure 43:
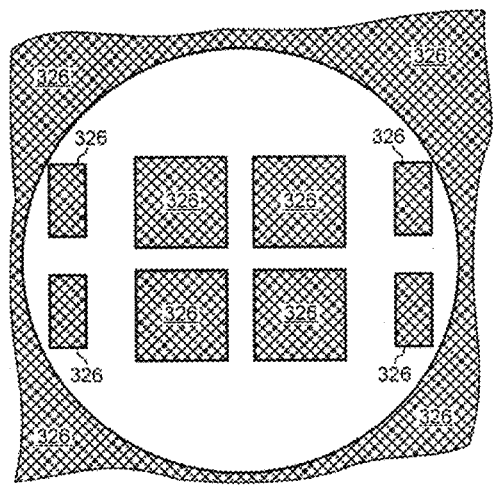
FIG. 43 (prior art) is a diagram of a screen printing mask used to apply a highly reflective (HR) material onto the die placement area of FIG. 42.
Figure 44:
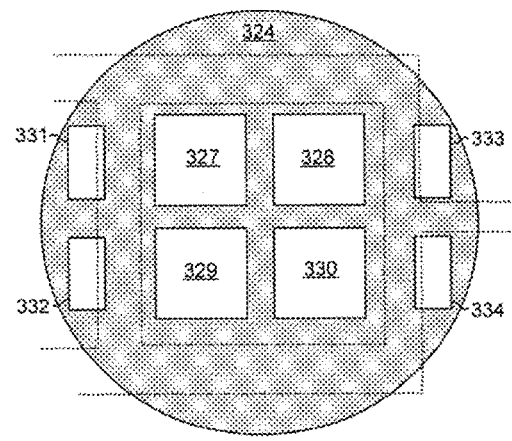
FIG. 44 (prior art) is a top-down diagram of the die placement area of FIG. 42 after deposition of the HR material.
Figure 45:
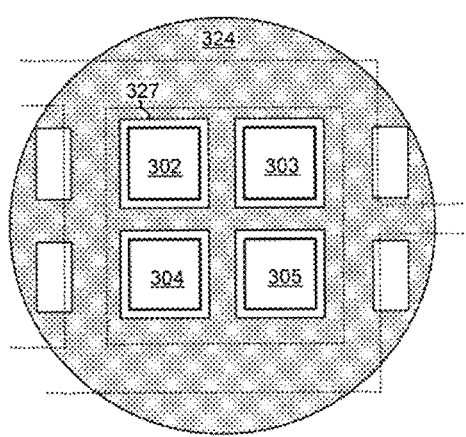
FIG. 45 (prior art) is a top-down diagram of the die placement area of FIG. 44 after die attach has been completed.
Figure 46:
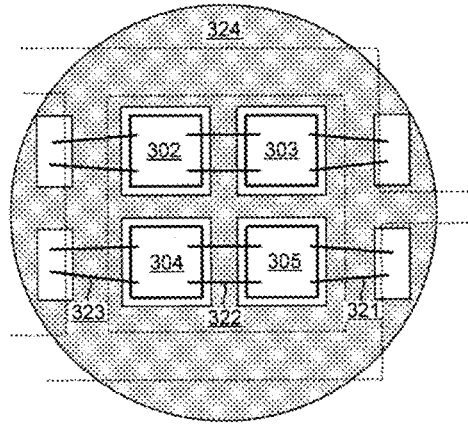
FIG. 46 (prior art) is a top-down diagram of the die placement area of FIG. 45 after wire bonding has been completed.
Figure 47:
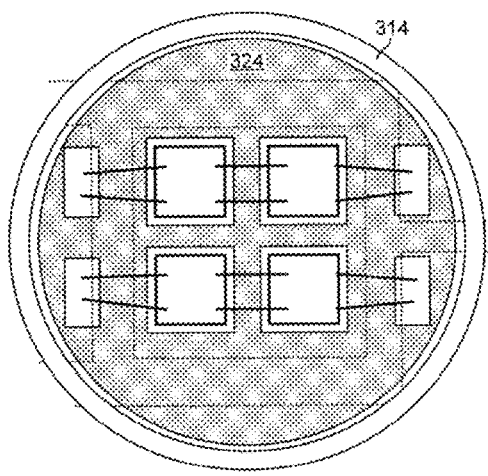
FIG. 47 (prior art) is a top-down diagram of the die placement area of FIG. 46 after formation of a phosphor retaining ring.
Figure 48:
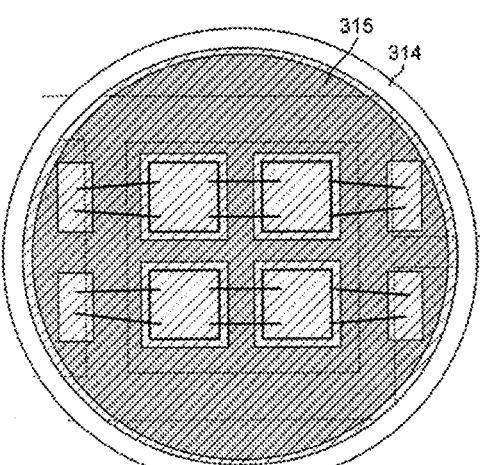
FIG. 48 (prior art) is a top-down diagram of the die placement area of FIG. 47 after placement of phosphor within the retaining ring.

FIGS. 41-48 (prior art) illustrate a prior art method of manufacturing the LED assembly 300 of FIG. 39. FIG. 41 (prior art) is a top-down diagram of a panel 325 of MCPCBs. MCPCB 306 is one of the MCPCBs of the panel. FIG. 42 (prior art) is a top-down diagram of the pad portion 310 of the MCPCB portion 306 of panel 325. This pad portion 310 is exposed through an opening in the solder mask layer 311. FIG. 43 (prior art) is an illustration of a screen printing mask 326 used in the next step of forming the layer 324 of highly reflective (HR) material. FIG. 44 (prior art) is a diagram that shows the result of using the screen printing mask 326 of FIG. 43 to deposit the HR layer 324 onto panel 325. HR material of layer 324 is deposited in the shaded circular region. This circular region is in the center of MCPCB 306. As illustrated, there are eight windows 327-334 in the circular HR layer 324. FIG. 45 (prior art) is a diagram that shows the result of a next die attach step. Each of the four dice 302-305 is attached by an amount of silver epoxy in a corresponding one of the four center windows 327-330 in the HR layer 24. Each of the openings 327-330 in the HR layer is slightly larger than its associated die in order to accommodate variations in physical dimensions and inaccuracies of the placement of the dice and wire bonds. FIG. 46 (prior art) is a diagram that shows the result of a next step of attaching wire bonds. Only three of the wire bonds 321-323 are identified in the diagram with reference numerals. Some of the wire bonds extend between dice. Others of the wire bonds extend from a die to a conductive upper layer of the substrate. FIG. 47 (prior art) shows the result of a next step of forming retaining ring 314. Retaining ring 314 is formed so that it encircles the circular layer 324 of HR material as illustrated. FIG. 48 (prior art) shows the result of a next step of placing the phosphor 315 over the LED dice 302-305 in the area bounded by retaining ring 314. After the phosphor 315 has cured, the panel 325 is singulated to form multiple LED assemblies of which LED assembly 300 is one.

Figure 49:
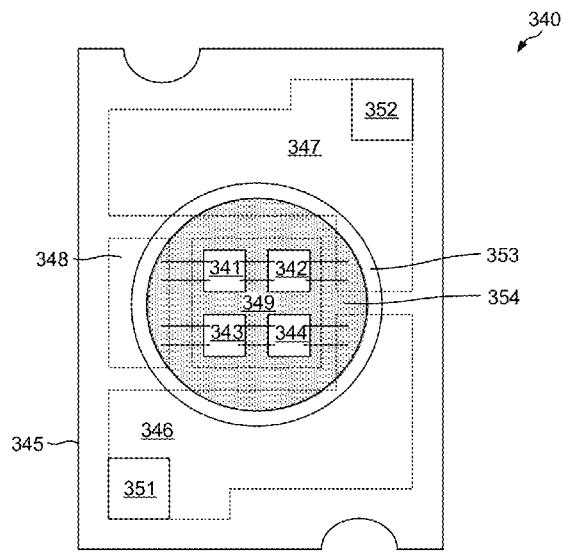
FIG. 49 is a top-down diagram of a white LED assembly in accordance with one novel aspect.

FIG. 49 is a simplified top-down diagram of a white LED assembly 340 in accordance with one novel aspect. LED assembly 340 includes four laterally-contacted LED dice 341-344 that are mounted on a substrate 345. In the present example, the substrate is a metal core printed circuit board (MCPCB). Areas 346-349 illustrated in dashed lines represent portions of a metal layer 357 that is disposed underneath a solder mask layer 350 (see FIG. 50). Reference numeral 351 identifies a portion of metal portion 346 that is exposed through a first opening in solder mask layer 350. Reference numeral 352 identifies a portion of metal portion 347 that is exposed through a second opening in solder mask layer 350. These exposed portions 351 and 352 serve as bond pads. Ring structure 353 is a retaining ring of silicone. An amount of phosphor 354 is disposed within the ring structure 353 over the LED dice. This phosphor actually comprises silicone and particles of phosphor that are embedded in the silicone.

Figure 50:
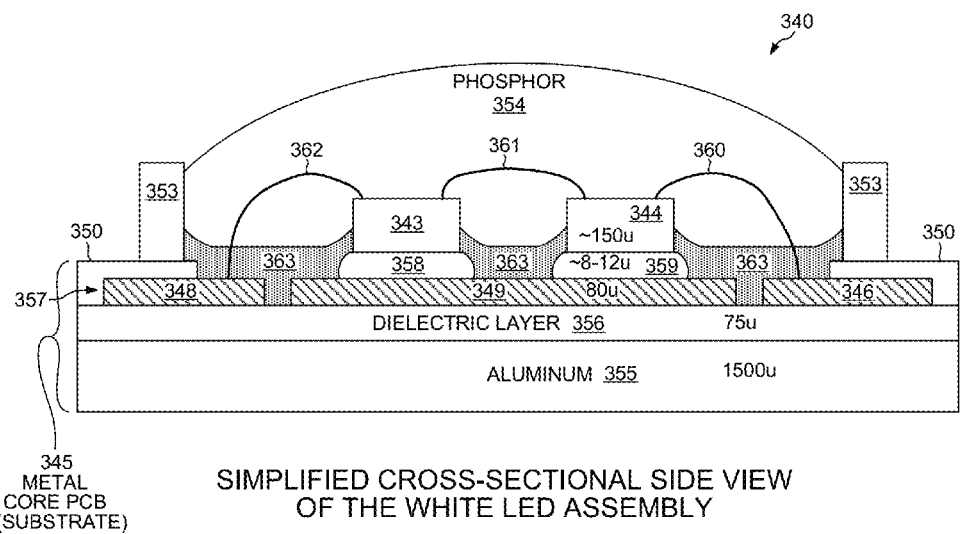
FIG. 50 is a simplified cross-sectional side view of the white LED assembly of FIG. 49.

FIG. 50 is a simplified cross-sectional side view of the LED assembly 50 of FIG. 49. MCPCB 345 includes an aluminum layer 355, a global dielectric layer 356, a layer 357 of metallization, and solder mask layer 350. Metal portions 346-349 are parts of layer 357. Layer 357 of metal involves multiple sublayers of metal including a lower layer of copper, a middle layer of nickel, and an upper layer of a very reflective metal such as silver. Metal portion 349 is a square pad of metal upon which the LED dice 341-344 are mounted. The LED dice are laterally-contacted blue LED devices whose epitaxial layers are fabricated on an insulative sapphire substrate. LED dice 341-344 are fixed to pad 349 by associated amounts of silver epoxy. Amount 358 of silver epoxy is shown fixing LED die 343 to pad 349. Amount 359 of silver epoxy is shown fixing LED die 344 of pad 349. Reference numerals 360-362 identify three of the wire bonds seen in top-down perspective in FIG. 49.

A layer 363 of a highly reflective (HR) material is disposed within ring 353 between and around the dice and the wire bonds as illustrated. In the example of FIG. 50, the layer 363 contacts the retaining ring 353 and also contacts the side edges of the LED dice 341-344.

FIGS. 51-58 illustrate a method of manufacturing the LED assembly 340 of FIG. 49.

Figure 51:
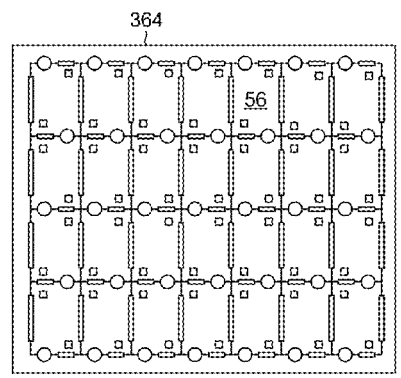
FIG. 51 is a top-down diagram of a panel of MCPCBs of which the MCPCB of FIG. 50 is one.

FIG. 51 is a top-down diagram of a panel 364 of MCPCBs. MCPCB 345 is one of the MCPCBs of the panel.

Figure 52:
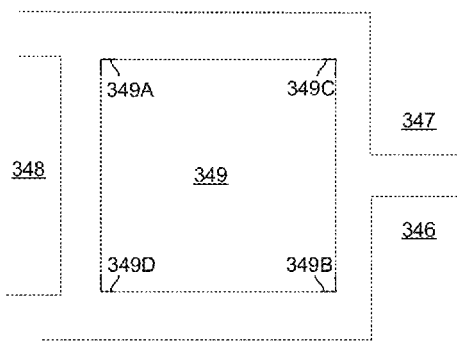
FIG. 52 is a top-down diagram of the die placement area of the MCPCB of FIG. 50.

FIG. 52 is a top-down diagram of the pad portion 349 of the MCPCB 345 of panel 364. This pad portion 349 is exposed through an opening in the solder mask layer 350. The metal surfaces of the panel are plasma cleaned. The corners 349A-349D serve as fiducial markers used in later assembly steps.

Figure 53:
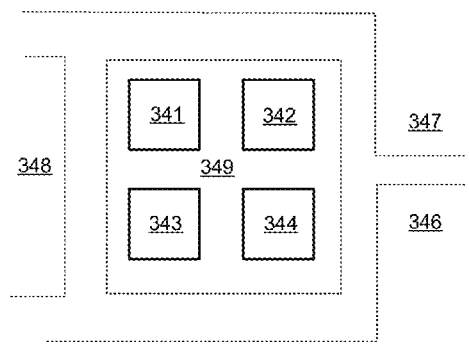
FIG. 53 is a top-down diagram of the placement area of FIG. 52 after die attach has been completed.

FIG. 53 shows the result of the next step of the method. LED dice 341-344 are placed and bonded to pad portion 349 as illustrated. Each die is bonded to pad portion 349 by an associated amount of silver epoxy. The bond line thickness (distance between the bottom of the die and the top of the substrate surface) is less than 12 microns, and it is typically about 8 microns.

Figure 54:
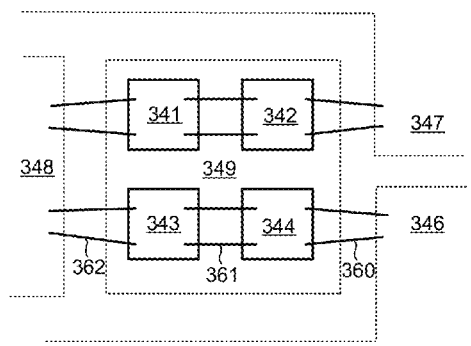
FIG. 54 is a top-down diagram of the placement area of FIG. 53 after wire bonding has been completed.

FIG. 54 shows the result of the next step of the method. Wire bonds are attached. Some of these wire bonds extend between dice. Others of the wire bonds extend from a die to a conductive upper layer of the substrate. Reference numerals 360-362 identify three of the wire bonds. The wire bonds may be sections of 1 mil diameter gold wire.

Figure 55:
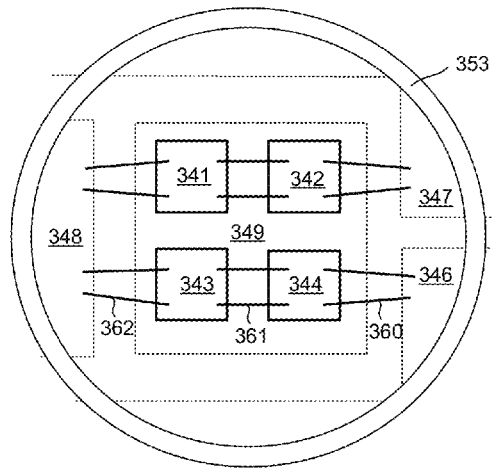
FIG. 55 is a top-down diagram of the placement area of FIG. 54 after formation of the phosphor retaining ring.

FIG. 55 shows the result of the next step of the method. Retaining ring 353 is formed on the structure as shown.

Figure 56:
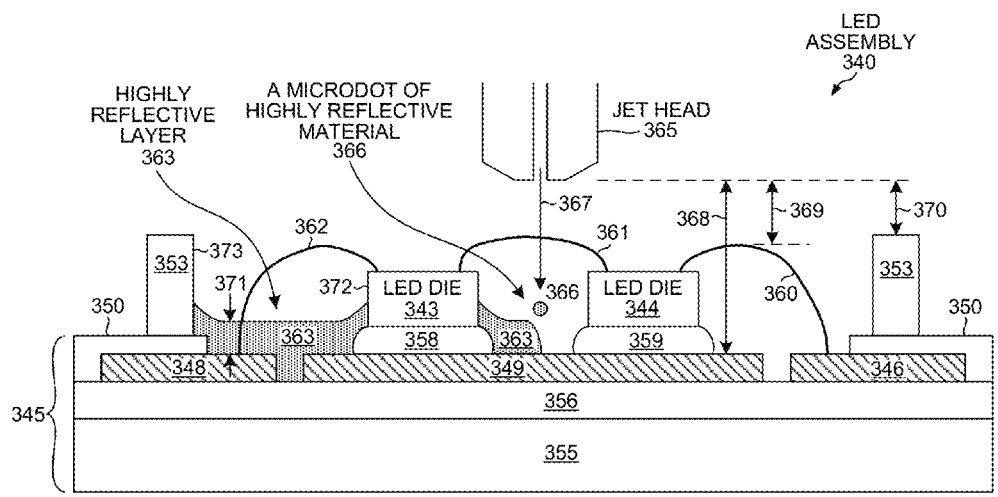
FIG. 56 is a simplified cross-sectional diagram that shows the deposition of an HR layer by jetting microdots of HR material onto the substrate around and between the LED dice of the LED assembly.

FIG. 56 illustrates a next step in the method in which layer 363 of HR material is deposited. In one example, layer 363 of HR material is deposited using a jetting process. Microdots of HR material are jetted out of a jet head 365 so that the microdots travel toward the substrate 345 (MCPCB) and impact the substrate, thereby effectively painting the surface of the substrate with HR material. The liquid HR material does not flow under the LED dice due to the silver epoxy bonding material occupying this space. The jet head 365 is moved across the surface of the assembly of FIG. 55 as microdots of HR material are shot at the substrate so that areas of the surface of the substrate around the dice, and between the dice, and within the confines of circular retaining ring 353 are painted with HR material, but such that the top surfaces of the dice and the top surfaces of the wire bonds are not painted. One of these microdots is identified with reference numeral 366 in FIG. 56. Arrow 367 indicates the path of its travel from jet head 365 toward the surface of the substrate. In one example, each microdot has a diameter of less than 100 microns and is typically 50-80 microns in diameter. The layer 363 is deposited to be at least 10 microns thick. Arrows 371 identify this thickness. In the illustrated example, layer 363 is fifty microns thick. The distance 369 between the bottom of the jet head 365 and the upper extent of the wire bonds is approximately 500 microns. In this example, the distance 368 between the bottom of the jet head 365 and the upper surface of metal layer 357 (including pad 349) is approximately 1000 microns. In this example, the distance 370 between the bottom of the jet head 365 and the upper surface of retaining ring 353 is approximately 500 microns.

The HR material being jetted is made to have a predetermined and controlled viscosity such that the liquid HR material will flow laterally somewhat across the surface being painted before the HR material cures and solidifies. Due to this flowing action, microdots of liquid HR material are fired onto the substrate surface near to a wire bond. The liquid HR material once on the substrate surface then flows laterally underneath the wire bond so that after the step of depositing the HR material is completed the HR layer 363 coats the surfaces of substrate 345 (MCPCB) that are directly underneath wire bonds. At an end of a wire bond where the wire bond contacts the substrate, the entire circular circumference of the wire is contacting HR material. Similarly, due to the predetermined viscosity of the liquid HR material, the HR material flows laterally such that it reaches and wets the side edges of the LED dice 341-344 as illustrated. Reference numeral 372 identifies a side edge of LED die 343. In this example, only the bottom sapphire portion of the side edge 372 is wetted. The upper epitaxial portion of the side edge 372 is not wetted. Similarly, the HR material is made to flow laterally and to wet the inside side edge of the retaining ring 353 as illustrated. Reference numeral 373 identifies the inside side edge of retaining ring 353. The HR material is deposited with such a thickness that once it has cured and solidified it has a reflectivity of at least eighty-five percent (for example, 94 percent).

In one example, the HR material is the material KER-2010-DAM or material KER-2020 that is commercially available from ShinEtsu Chemical Co. Ltd. of Tokyo, Japan. The HR material may comprise silicone and a titanium dioxide powder, where the titanium dioxide powder is suspended in the silicone. The HR material is made jettable by cutting it with a solvent. In one example, the solvent is an oil-based solvent such as dimethylformamide (DMF) commercially available from ShinEtsu as DMF0.65CS. The HR material after being appropriately cut with the solvent has a viscosity less than 1100 centipois (cP) at room temperature and in this example has a viscosity of 1000 cP at room temperature. In one example, the jetting equipment used to jet the HR material is an Asymtek X1020 jetting machine available from Hordson Asmtek of 2747 Loker Avenue West, Carlsbad, Calif. 92010. The jetting machine has two jet heads. The first jet head is used to apply HR material with a first viscosity, whereas the second jet head is used to apply HR material with a second viscosity.

Figure 57:
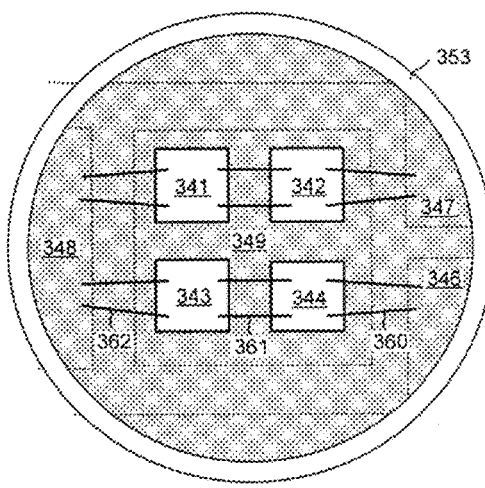
FIG. 57 is a simplified top-down diagram of the die placement area after the jetting of the HR material has been completed.

FIG. 57 shows the result of the step of depositing the HR material. Layer 363 of HR material covers substantially all the area within the confines of the retaining ring 353 other than the top surfaces of LED dice 341-344. Layer 363 coats the upper surface of the substrate underneath the bridging bond wires. Whereas in the prior art example of FIG. 47 there exists a peripheral strip of the substrate around each LED die that is not covered with HR material, in the structure illustrated in FIG. 57 there is no such uncovered peripheral strip. Whereas in the prior art example of FIG. 47 there are uncovered areas of the substrate in the areas where wire bonds attach to the substrate, in the structure illustrated in FIG. 57 there are no such uncovered areas. The HR material is made to coat the upper surface of the substrate right up location where the wire bond makes contact with the substrate. The HR material is also made to coat the upper surface of the substrate right up to the side edges of the LED dice. The HR material is made to coat the upper surface of the substrate right up to the inside side edge of the retaining ring 353.

Figure 58:
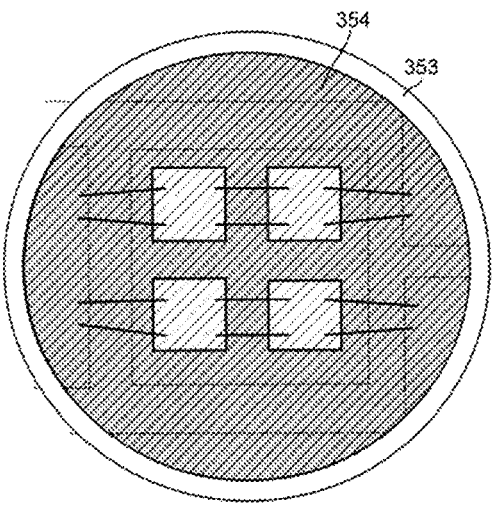
FIG. 58 is a simplified top-down diagram of the die placement area after phosphor has been placed over the LED dice within the confines of the retaining ring.

FIG. 58 shows the result of the next step in the method. Phosphor 354 is deposited into the circular area bounded by the retaining ring 353 so that the phosphor 354 covers the LED dice as illustrated in FIG. 50. The phosphor is then allowed to cure and harden. Once the phosphor 354 has been deposited, the panel of MCPCBs is singulated, thereby forming a plurality of LED assemblies. The LED assembly structure 340 illustrated in FIG. 49 is one of these LED assemblies.

The method set forth above in connection with FIGS. 49-58 has several advantageous aspects in comparison with the prior art method set forth above in connection with FIGS. 39-48. First, the amount of the upper surface of the substrate that is left uncovered by HR material is reduced in comparison with the prior art screen printing method. Parts of the substrate that are not covered by HR material may and typically do absorb light or otherwise do not reflect light well, thereby reducing the light efficiency of the LED assembly. By covering more of the surface of the substrate with HR material using the jetting process, more light is reflected from the LED assembly and the light efficiency of the LED assembly is increased. In the prior art screen printing process used to deposit HR material, variations in physical sizes and imperfections in die attach and wire bonding processes required the windows in the HR layer to be so large that after die attach and wire bonding substantial areas of exposed substrate remained uncovered by HR material. In the jetting process, the HR material is applied after die placement and wire bonding, and machine vision and control techniques are used to control the jetting process so that the substrate is coated up to the edges of structures (the LED dice and the retaining ring) even if the structures are in slightly different places, from one assembly to the next. The use of laterally flowing HR material reduces the need to account for differences in die placement and wire bond locations from assembly to assembly. The HR material naturally flows laterally up to the proper structures even if the structures are not always disposed in the same location from assembly to assembly.

Second, the HR layer is deposited after the sensitive die attach and wire bonding process steps. In the prior art screen printing method of depositing HR material, on the other hand, the HR material is screen printed onto the substrate prior to die attach and wire bonding. The HR material is an organic material. If die attach and wire bonding are performed when organic residue is present on the substrate, then errors in die attach and wire bonding can occur and such error reduce LED assembly manufacturing yield. Accordingly, plasma cleaning is often conventionally done after the HR screen printing step in an attempt to remove all such organic residue prior to die attach and wire bonding.

This plasma cleaning is, however, difficult to perform as compared to performing die attach on a plasma cleaned surface that has never been exposed to organics. Accordingly, defects due to performing die attach and wire bonding on surfaces having organic residues are reduced or eliminated using the jetting process.

Third, the jetted HR layer can be made to coat surfaces with relatively large steps and with different levels and sloped surfaces. In the prior art screen printing method, on the other hand, the surfaces to which the HR material is being applied must be more planar. In one example of the novel jetting process, a first HR material with less viscosity is applied to certain areas of the substrate that are relatively flat and planar so that the HR material will flow under wire bonds and will flow up to the edges of dice, whereas a second HR material with more viscosity is applied to other portions of the surface of the substrate that are more inclined or more stepped. The first HR material is applied with a first jet head of the jetting machine, whereas the second HR material is applied with a second jet head of the jetting machine.

Fourth, the production rate of LED assemblies is increased by not coating certain parts of the substrate with HR material in certain situations. In some examples, the area of the substrate between LED dice is small. It has been found that the benefit of coating this small inter-dice area is only slight. Accordingly, the HR material is not jetted into the inter-dice areas in order to save manufacturing time.

Fifth, it is generally desirable to be able to place fiducial markers on the substrate surface and to have the imaging systems of the die attach and wire bonding equipment use these fiducial markers during die attach and wire bonding processing. In the prior art screen printing process where the HR layer has been deposited prior to die attach and wire bonding, there is limited exposed substrate area available for placement of appropriate fiducial markers. Most of the upper surface of the substrate has been covered by HR material. In the novel jetting method of applying HR material, on the other hand, die attach and wire bonding occur prior to the depositing of the HR layer. Accordingly, fiducial markers (for example, 349A-349D) that will later be covered over by HR material are nevertheless usable at die attach and wire bonding time by die attach and wire bonding imaging systems.

Figure 59:
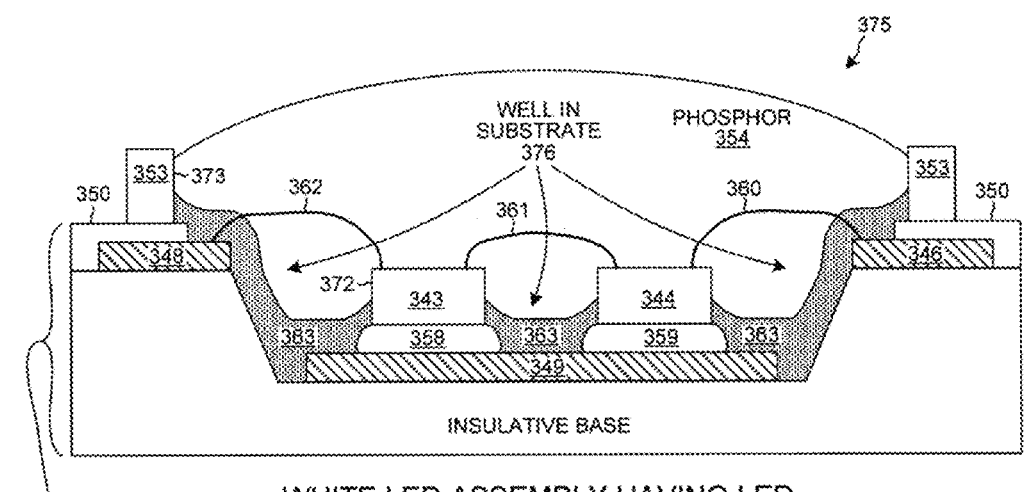
FIG. 59 is a simplified cross-sectional diagram of a white LED assembly where the LED dice are disposed in a well.

The deposition of an HR layer using jetting is not limited to the particular LED assembly set forth FIG. 50. FIG. 59 is a diagram of another type of LED assembly 375. In the diagrams of FIG. 59 and FIG. 50, the same reference numerals are used to denote the same or similar structures. In the LED assembly of FIG. 59, the substrate 345 forms a well 376. The upper surface of the substrate has a nonplanar shape. The four LED dice 341-344 are mounted to metal pad 349 at the bottom of the well 376 as illustrated. Jetting is used to coat the sidewalls of this well with HR material. In the specific example illustrated, substantially all of the upper surface of the substrate within the circular confines of retaining ring 353 but for the LED dice 341-344 is coated with HR material. The liquid HR material that is painted onto the sidewalls of the well can be a liquid HR material with a relatively higher viscosity as compared with the viscosity of the liquid HR material that is painted onto the remainder of the surface of the substrate. The resulting HR layer is conformal to the nonplanar upper surface of the substrate over the various edges and sloping surfaces of the substrate.

Figure 60:
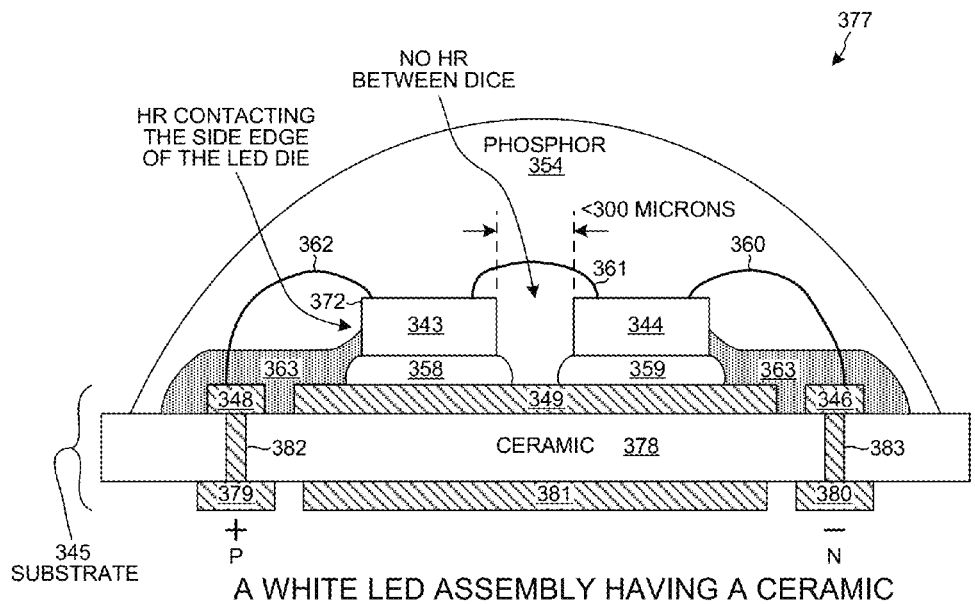
FIG. 60 is a simplified cross-sectional diagram of a white LED assembly having a ceramic substrate.

FIG. 60 is a diagram of another type of LED assembly 377. The substrate 345 in this case includes a ceramic portion 378. A first electrode 379 (P+ electrode), a second electrode 380 (N− electrode), and a thermal pad 381 of metal are disposed on the bottom surface of the ceramic portion 378. A conductive via 282 couples the P+ electrode 379 to metal portion 348 on the upper surface of the ceramic portion 378. Similarly, a conductive via 383 couples the N− electrode 380 to metal portion 346 on the upper surface of the ceramic portion 378. The thickness of the metal layers on the top and bottom of the substrate may be large, such as eighty microns, and this large thickness makes screen printing the HR material difficult. The HR layer 363 contacts substantially all of at least one side edge of each LED die as pictured. In the illustrated example, the surface area of the substrate 345 between LED dice 341-344 is not covered with HR material as described above in order to reduce production times. The inter-dice distance between the LED dice 341-344 is less than 300 microns, and the inter-dice area is not jetted with HR material. In other examples, this inter-dice area is coated with HR material. In an example where a retaining ring is provided (not shown), the HR layer 363 may or may not extend outward all the way to the retaining ring. The HR layer 363 may contact the inside side edge of such a retaining ring, or may stop short of the retaining ring such that the HR layer 363 does not touch the inside side edge of the retaining ring.

Figure 61:
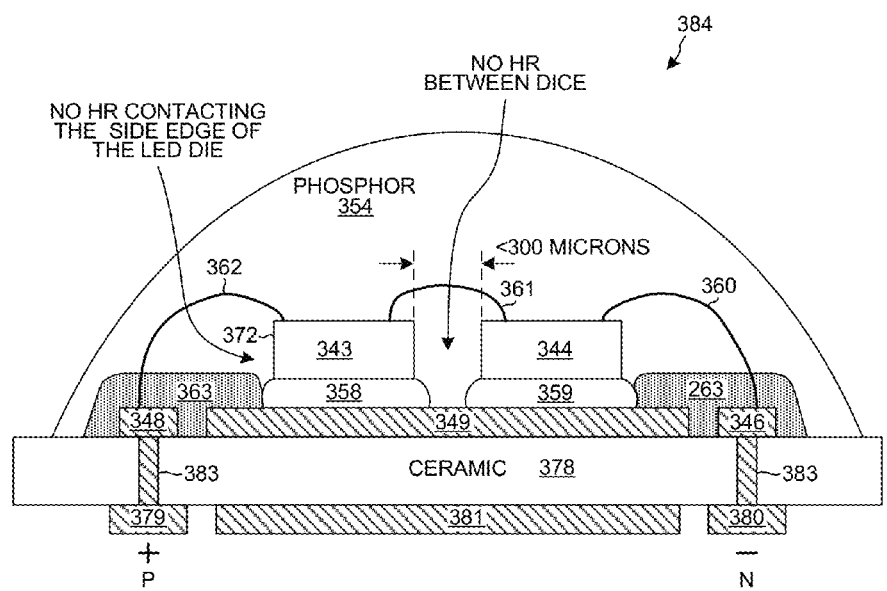
FIG. 61 is a simplified cross-sectional diagram of a white LED assembly having a ceramic substrate, where the HR material does not touch a side edge of any of the LED dice, and is not disposed between the LED dice.

FIG. 61 is a diagram of an LED assembly 384 where the substrate 345 involves a ceramic portion 378 as in FIG. 60, but the HR layer 363 does not contact a side edge of any of the LED dice 341-344. The HR layer 363 is deposited to stop short of the LED dice so that the HR layer 363 does not contact any side edge of any LED die. In the final assembly, the LED dice appear disposed in a central window in the HR layer 363. As compared the screen printing conventional method of applying HR material, however, the amount of exposed substrate (substrate under the phosphor 354 that is not covered by either an LED die or HR material) is much reduced in the structures of both FIG. 60 and FIG. 61.

Figure 62:
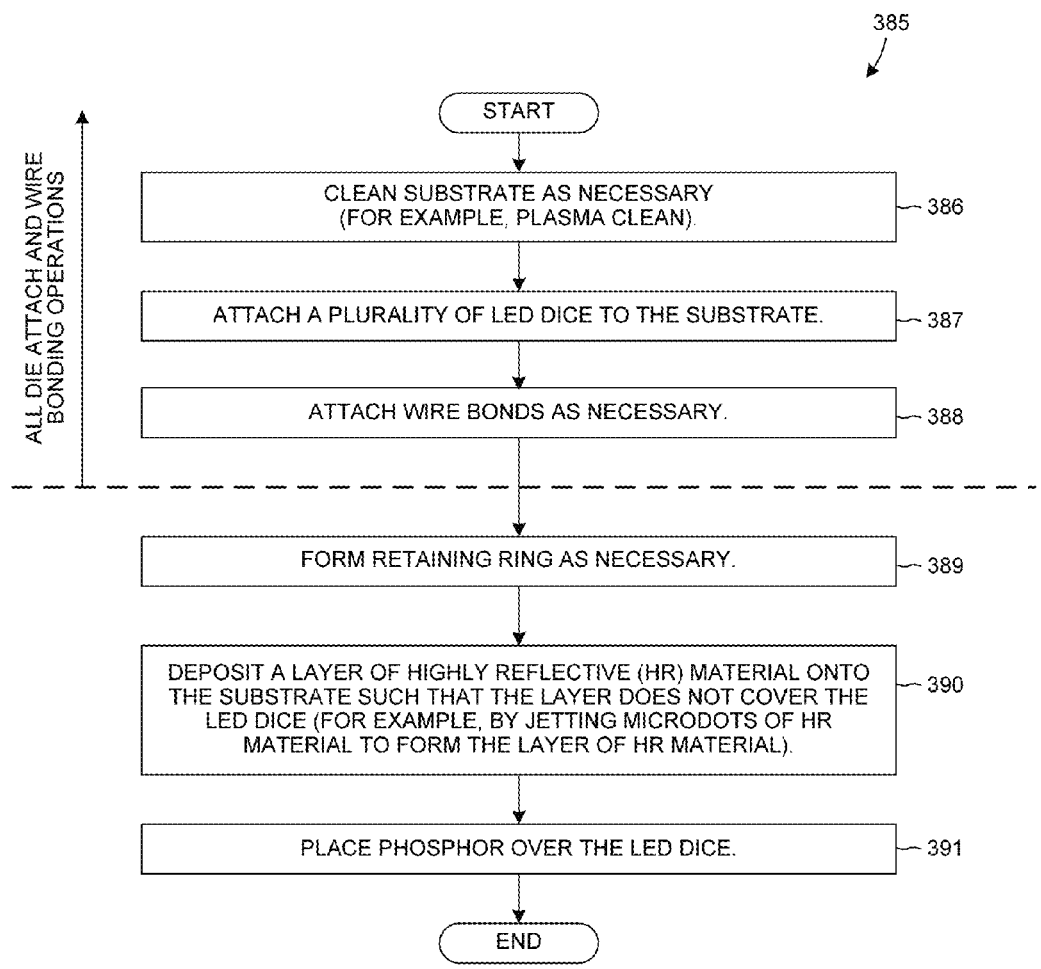
FIG. 62 is a flowchart of a method in accordance with a novel aspect. In a first novel aspect, an HR layer is deposited onto the substrate of an LED assembly after die attach and after wire bonding. In a second novel aspect, an HR layer is deposited by jetting microdots of HR material onto a substrate of the LED assembly.

FIG. 62 is a flowchart of a method 385. Initially, a substrate is cleaned (step 386) as necessary. In one example, the substrate 345 is part of the panel 364 of FIG. 51. Panel 364 is plasma cleaned to remove any organic materials from its surface. Next (step 387), a plurality of LED dice are attached to the substrate. In one example, the LED dice are the dice 341-344 that are attached using silver epoxy to the substrate 345. FIG. 53 shows the result of this die attach step. Next (step 388), wire bonding is performed as necessary. In some cases, wire bonding is not used and the die is electrically connected to the substrate without wire bonding. In an example where wire bonding is performed, the result of the wire bonding step is as shown in FIG. 54. Next (step 389), a retaining ring is formed around the LED dice as necessary. In one example where a retaining ring 353 is used, the result of the step of forming the retaining ring is as illustrated in FIG. 55. Next (step 390), a layer of an HR material is deposited onto the substrate 345 such that the HR material does not cover the LED dice. FIG. 56 shows one example of how this HR material might be deposited in a jetting process. The HR material is jetted onto exposed portions of the upper surface of the substrate around the dice 341-344, and the liquid HR material is allowed to cure and harden. Next (step 391), an amount of liquid phosphor (actually silicone bearing phosphor particles) is placed over the LED dice and allowed to cure. In one example, the result of this step is illustrated in FIG. 58. The resulting panel of LED assemblies is then singulated (segmented) to form a plurality of separate LED assemblies. In one example, FIG. 49 is a top-down diagram of one of these separate LED assemblies. In a first novel aspect, the HR layer of the LED assembly is deposited after the die attach step and after the wire bonding step in the LED assembly process. In a second novel aspect, the HR layer of an LED assembly is deposited by jetting microdots of liquid HR material onto a substrate of the LED assembly.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   mounting a first light emitting diode (LED) die on a first substrate, wherein the first substrate has a top surface, a bottom surface and a lateral boundary, wherein a plurality of landing pads are disposed on the top surface of the first substrate, and wherein no electrical conductor passes from the top surface of the first substrate to the bottom surface of the first substrate;
   placing a first lip of an interconnect structure over the top surface of the first substrate and within the lateral boundary, wherein a plurality of contact pads are disposed on an underside of the first lip of the interconnect structure, wherein the interconnect structure has a bottom surface, and wherein the bottom surface of the interconnect structure and the bottom surface of the first substrate are substantially coplanar after the first lip is placed over the top surface; and
   electrically and mechanically connecting the first substrate to the interconnect structure only by connecting the landing pads to the contact pads.

2. The method of claim 1, further comprising:
   placing a second lip of the interconnect structure over a top surface of a second substrate, wherein the bottom surface of the interconnect structure and a bottom surface of the second substrate are substantially coplanar after the second lip is placed over the top surface of the second substrate; and
   electrically connecting a conductor of the interconnect structure to a second LED die disposed on the second substrate, wherein the second substrate has dimensions that are substantially identical to those of the first substrate, and wherein the second LED die has dimensions that are substantially identical to those of the first LED die.

3. The method of claim 1, wherein the interconnect structure is taken from the group consisting of: a molded interconnect device (MID), an FR-4 epoxy circuit board, and a lead frame structure.

4. The method of claim 1, further comprising:
   placing a thermal interface material over an upper surface of a heat sink; and
   placing the first substrate and the interconnect structure over the thermal interface material such that the thermal interface material contacts both the bottom surface of the first substrate and the bottom surface of the interconnect structure.

5. The method of claim 1, wherein the first substrate is connected to the interconnect structure by heating the landing pads such that each of the landing pads aligns with one of the contact pads.

6. The method of claim 1, wherein the interconnect structure includes a conductor, and wherein after heating the landing pads the conductor of the interconnect structure is electrically coupled to the first LED die.

7. The method of claim 1, wherein the interconnect structure includes a conductor, wherein the landing pads are connected to the contact pads using an anisotropic conductive adhesive, and wherein the conductor of the interconnect structure is electrically coupled to the first LED die through the anisotropic conductive adhesive.

8. The method of claim 7, wherein the anisotropic conductive adhesive mechanically connects the first substrate to the interconnect structure.

9. The method of claim 1, wherein the landing pads are connected to the contact pads using solder.

10. A method comprising:
    mounting a light emitting diode (LED) die on a substrate, wherein the substrate has a top surface, a bottom surface and a lateral boundary, wherein a plurality of landing pads are disposed on the top surface of the substrate, and wherein no electrical conductor passes from the top surface of the substrate to the bottom surface of the substrate;
    placing a lip of an interconnect structure over the top surface of the substrate and within the lateral boundary, wherein a plurality of contact pads are disposed on an underside of the lip of the interconnect structure, and wherein the interconnect structure has a bottom surface; and
    electrically and mechanically connecting the substrate to the interconnect structure solely by connecting the landing pads to the contact pads, wherein the bottom surface of the interconnect structure and the bottom surface of the substrate are substantially coplanar after the substrate is connected to the interconnect structure.

11. The method of claim 10, wherein the landing pads are connected to the contact pads using solder.

12. The method of claim 11, further comprising:
    aligning the substrate with the interconnect structure using a solder reflow process.

13. The method of claim 10, wherein the interconnect structure is taken from the group consisting of: a molded interconnect device (MID), an FR-4 epoxy circuit board, and a lead frame structure.

14. The method of claim 10, further comprising:
    placing a thermal interface material over an upper surface of a heat sink; and
    placing the substrate and the interconnect structure over the thermal interface material such that the thermal interface material contacts both the bottom surface of the substrate and the bottom surface of the interconnect structure.

15. The method of claim 10, wherein the substrate is connected to the interconnect structure by heating the landing pads such that each of the landing pads aligns with one of the contact pads.

16. The method of claim 15, wherein the interconnect structure includes a conductor, and wherein after heating the landing pads the conductor of the interconnect structure is electrically coupled to the LED die.

17. The method of claim 10, wherein the interconnect structure includes a conductor, wherein the landing pads are connected to the contact pads using an anisotropic conductive adhesive, and wherein the conductor of the interconnect structure is electrically coupled to the LED die through the anisotropic conductive adhesive.

18. The method of claim 10, wherein the anisotropic conductive adhesive mechanically connects the substrate to the interconnect structure.

19. The method of claim 10, wherein the lip of the interconnect structure surrounds an opening in the interconnect structure.

* * * * *